US012751145B2

(12) United States Patent
Lee et al.

(10) Patent No.: US 12,751,145 B2
(45) Date of Patent: Sep. 29, 2026

(54) DISPLAY DEVICE INCLUDING AUXILIARY ELECTRODE INCLUDING BONDING PORTION HAVING PLURAL WIDTHS

(71) Applicant: Samsung Display Co., LTD., Yongin-si (KR)

(72) Inventors: Yeon Hwa Lee, Yongin-si (KR); Duck Jung Lee, Yongin-si (KR); Joon Gu Lee, Yongin-si (KR); Tae Wook Kang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 481 days.

(21) Appl. No.: 18/216,776

(22) Filed: Jun. 30, 2023

(65) Prior Publication Data

US 2024/0121987 A1 Apr. 11, 2024

(30) Foreign Application Priority Data

Oct. 6, 2022 (KR) ........................ 10-2022-0128182
Dec. 27, 2022 (KR) ........................ 10-2022-0185482

(51) Int. Cl.
*H10K 59/122* (2023.01)
*H10K 59/121* (2023.01)
(Continued)

(52) U.S. Cl.
CPC ....... *H10K 59/122* (2023.02); *H10K 59/1213* (2023.02); *H10K 59/1315* (2023.02); *H10K 59/8721* (2023.02)

(58) Field of Classification Search
None
See application file for complete search history.

(56) References Cited

U.S. PATENT DOCUMENTS

2017/0278910 A1* 9/2017 Choi .................... H10K 59/124
2018/0130827 A1* 5/2018 Lee .................... H10D 30/6723
(Continued)

FOREIGN PATENT DOCUMENTS

CN 113871430 A 12/2021
EP 3920233 A1 12/2021
(Continued)

OTHER PUBLICATIONS

Extended European Search Report—European Application No. 23198819.7 dated Feb. 16, 2024, citing references listed within.

*Primary Examiner* — Sue A Purvis
*Assistant Examiner* — Seyon Ali-Simah Punchbeddell
(74) *Attorney, Agent, or Firm* — CANTOR COLBURN LLP

(57) ABSTRACT

A display device includes a substrate; an auxiliary electrode including metal layers stacked in an undercut structure; and a light-emitting element layer. The light-emitting element layer includes a second common layer; and a common electrode which extend to the non-emission area. A side surface of the auxiliary electrode includes a first bonding portion in contact with the second common layer, and a second bonding portion in contact with the common electrode. The auxiliary electrode includes a first side and a second side facing each other in one direction, and a third side and a fourth side facing each other in other direction crossing the one direction. The first bonding portion has a first width at a first point of the first side and has a second width smaller than the first width at a second point of the third side.

20 Claims, 39 Drawing Sheets

(51) Int. Cl.
*H10K 59/131* (2023.01)
*H10K 59/80* (2023.01)

(56) References Cited

U.S. PATENT DOCUMENTS

| | | | | |
|---|---|---|---|---|
| 2019/0131375 | A1* | 5/2019 | Kim | H10K 59/40 |
| 2021/0202655 | A1* | 7/2021 | Cho | H10K 59/131 |
| 2022/0157229 | A1* | 5/2022 | Ogawa | H01L 25/0753 |

FOREIGN PATENT DOCUMENTS

| | | | |
|---|---|---|---|
| KR | 20010024571 | A | 3/2001 |
| KR | 20140010303 | A | 1/2014 |
| KR | 20160062646 | A | 6/2016 |
| KR | 20170072726 | A | 6/2017 |
| KR | 20210086869 | A | 7/2021 |

* cited by examiner

PXD : PXD1, PXD2, PXD3
PE : PE1, PE2, PE3
ASE : SI1, SI2, SI3, SI4

CDL1 : GDT1, G111, G121, G21, G311, G321,
G411, G421, G51, G61

SEL : CHDT, SDT, DDT, CH11, S11, D11, CH12, S12, D12
CH2, S2, D2, CH31, S31, D31, CH32, S32, D32
CH41, S41, D41, CH42, S42, D42,
CH5, S5, D5, CH6, S6, D6

CDL2 : GIL, GWL, ECL, GCL, VGIL, VAIL, GDT2, CAE1

CDL3 : VDAL, CAE2

CDL4 : DL, VDL, CCE1, CCE2, CCE3, CCE4

CDL5 : ML1, ML2, ML3
ML1 : ML11, ML21
ML2 : ML13, ML23
ML3 : ML13, ML23
ASE, 131 : CDL5

ASE : ML11, ML12, ML13

CDL5 : ML1, ML2, ML3
ML1 : ML11, ML21
ML2 : ML13, ML23
ML3 : ML13, ML23
ASE, 131 : CDL5

CDL5 : ML1, ML2, ML3
ML1 : ML11, ML21
ML2 : ML13, ML23
ML3 : ML13, ML23
ASE, 131 : CDL5

DISPLAY DEVICE INCLUDING AUXILIARY ELECTRODE INCLUDING BONDING PORTION HAVING PLURAL WIDTHS

This application claims priority to Korean Patent Application No. 10-2022-0128182, filed on Oct. 6, 2022, and Korean Patent Application No. 10-2022-0185482, filed on Dec. 27, 2022, and all the benefits accruing therefrom under 35 U.S.C. § 119, the content of which in their entirety is herein incorporated by reference.

BACKGROUND

1. Field

The disclosure relates to a display device and a semiconductor device.

2. Description of the Related Art

With an advance of information-oriented society, more demands are placed on display devices for displaying images in various ways. The display device may be a flat panel display device such as a liquid crystal display, a field emission display and a light-emitting display.

A light-emitting display device may include an organic light-emitting display device including an organic light-emitting diode element as a light-emitting element or a light-emitting diode display device including an inorganic light-emitting diode element such as a light-emitting diode ("LED") as a light-emitting element.

The organic light-emitting display device may include organic light-emitting diode elements disposed in emission areas arranged in a display area in which an image is displayed, and pixel drivers electrically connected to the organic light-emitting diode elements, respectively. The pixel drivers supply a driving current with a magnitude corresponding to an image signal, to the organic light-emitting diode elements, respectively. As a result, the organic light-emitting display device may display an image by adjusting the luminance or gray scale of light of each of the organic light-emitting diode elements.

SUMMARY

The display device may include a pixel electrode corresponding to each of the emission areas and a common electrode corresponding to an entirety of the emission areas. That is, each of the light-emitting elements of the display device may include the pixel electrode and the common electrode facing each other, and a light-emitting layer disposed therebetween. Here, the common electrode corresponds to an entirety of the emission areas. That is, since the common electrode has a larger width than a width of the pixel electrode of each of the emission areas, the common electrode has a relatively large resistance, so that a delay time until a second power is transmitted to the common electrode of the entirety of the display area may be increased. To prevent this, the display device may include an auxiliary electrode including a conductive material electrically connected to the common electrode and having a relatively low resistance.

However, since an organic material layer including the light-emitting layer is disposed between the pixel electrode and the common electrode, the organic material layer may be disposed under the common electrode. Due to the organic material layer, electrical connection between the common electrode and the auxiliary electrode is partially weakened, so that resistance uniformity of the common electrode may be lowered.

In view of the foregoing, features of the disclosure provide a display device in which electrical connection between a common electrode and an auxiliary electrode may be relatively uniformly strengthened over an entirety of the display area.

However, features of the disclosure are not restricted to the one set forth herein. The above and other features of the disclosure will become more apparent to one of ordinary skill in the art to which the disclosure pertains by referencing the detailed description of the disclosure given below.

In an embodiment, a display device includes a substrate including a display area in which emission areas are arranged; an auxiliary electrode disposed on the substrate, corresponding to at least a part of a non-emission area around each of the emission areas, and including metal layers stacked in an undercut structure; and a light-emitting element layer disposed on the substrate. The light-emitting element layer includes a pixel electrode corresponding to each of the emission areas; a pixel defining layer corresponding to the non-emission area and covering an edge of the pixel electrode; a first common layer disposed on the pixel electrode; a light-emitting layer disposed on the first common layer; a second common layer disposed on the light-emitting layer; and a common electrode disposed on the second common layer. The second common layer and the common electrode extend to the non-emission area. A side surface of the auxiliary electrode includes a first bonding portion in contact with the second common layer, and a second bonding portion in contact with the common electrode. The common electrode is electrically connected to the auxiliary electrode by the second bonding portion. The auxiliary electrode includes a first side and a second side facing each other in one direction, and a third side and a fourth side facing each other in other direction crossing the one direction. The first bonding portion has a first width at a first point of the first side and has a second width smaller than the first width at a second point of the third side.

In an embodiment, the first bonding portion may have the first width at a third point of the second side and has the second width at a fourth point of the fourth side.

In an embodiment, a difference between the first width and the second width may be 0.1 nanometer (nm) or more.

In an embodiment, the light-emitting layer and the common electrode may be separated by the undercut structure of the auxiliary electrode.

In an embodiment, the metal layers of the auxiliary electrode may include a first metal layer; and a second metal layer disposed on the first metal layer and having an edge protruding beyond the first metal layer. The first metal layer may have a lower resistance than a resistance of the second metal layer. A side surface of the first metal layer may include the first bonding portion and the second bonding portion.

In an embodiment, the first metal layer may include aluminum (Al) or copper (Cu), and the second metal layer includes one of titanium (Ti), molybdenum (Mo) and indium tin oxide ("ITO").

In an embodiment, the metal layers of the auxiliary electrode may further include a third metal layer disposed under the first metal layer. The third metal layer may include one of titanium (Ti), molybdenum (Mo) and ITO.

In an embodiment, the display device may further include a sealing layer covering the light-emitting element layer. The side surface of the first metal layer may further include a third bonding portion in contact with the sealing layer.

In an embodiment, a width of the third bonding portion may correspond to the undercut structure of the auxiliary electrode. A width of the second bonding portion may be a value obtained by subtracting a width of the first bonding portion and the width of the third bonding portion from a width of the side surface of the first metal layer.

In an embodiment, the second bonding portion may have a third width at the first point of the first side, and have a fourth width smaller than the third width at the second point of the third side. A width of the third bonding portion may be a value obtained by subtracting a width of the first bonding portion and a width of the second bonding portion from the width of the side surface of the first metal layer.

In an embodiment, the second bonding portion may have a fifth width at the first point of the first side, and have a sixth width greater than the fifth width at the second point of the third side. A width of the third bonding portion may be a value obtained by subtracting a width of the first bonding portion and a width of the second bonding portion from the width of the side surface of the first metal layer.

In an embodiment, the display device may further include a circuit layer disposed between the substrate and the light-emitting element layer. The circuit layer may have a structure including a first conductive layer disposed on the substrate; a semiconductor layer disposed on a buffer layer covering the first conductive layer; a second conductive layer disposed on a gate insulating layer covering the semiconductor layer; a third conductive layer disposed on an inter-insulating layer covering the second conductive layer; a fourth conductive layer disposed on a first planarization layer covering the third conductive layer; and a second planarization layer covering the fourth conductive layer. The circuit layer may include a pixel driver corresponding to each of the emission areas and electrically connected to the pixel electrode, and a first power line and a second power line respectively transmitting a first power and a second power having different voltage levels.

In an embodiment, the fourth conductive layer may include the second power line. The auxiliary electrode may be disposed on a part of the second power line exposed through an auxiliary hole, contact a part of the second power line, and include the same layer as the pixel electrode.

In an embodiment, the pixel driver may include at least one transistor. One of the at least one transistor may include a channel portion, a source portion connected to one side of the channel portion, a drain portion connected to the other side of the channel portion, and a first gate electrode and a second gate electrode overlapping the channel portion. The first conductive layer may include the first gate electrode. The semiconductor layer may include the channel portion, the source portion and the drain portion. The second conductive layer may include the second gate electrode.

In an embodiment, the fourth conductive layer may include the second power line. The auxiliary electrode may be disposed on the second planarization layer, include the same layer as the pixel electrode, and be electrically connected to the second power line through a power connection hole penetrating the second planarization layer.

In an embodiment, the substrate further may include a non-display area around the display area. The second power line may be disposed in the non-display area and be electrically connected to the common electrode. The fourth conductive layer may include the auxiliary electrode.

In an embodiment, the pixel defining layer may be spaced apart from the pixel electrode. An edge of the pixel defining layer may protrude relative to a sacrificial layer between the pixel defining layer and the pixel electrode. The auxiliary electrode may be disposed on the pixel defining layer. The common electrode of each of the emission areas may contact the side surface of the auxiliary electrode.

In an embodiment of the disclosure, a display device includes a substrate including a display area in which emission areas are arranged; a circuit layer disposed on the substrate; a light-emitting element layer disposed on the circuit layer; and a sealing layer disposed on the light-emitting element layer. One of the circuit layer and the light-emitting element layer includes an auxiliary electrode corresponding to at least a part of a non-emission area around each of the emission areas. The auxiliary electrode includes a first metal layer and a second metal layer disposed on the first metal layer and having an edge protruding beyond the first metal layer. The light-emitting element layer includes a pixel electrode of each of the emission areas; a pixel defining layer corresponding to the non-emission area and covering an edge of the pixel electrode; a first common layer disposed on the pixel electrode; a light-emitting layer disposed on the first common layer; a second common layer disposed on the light-emitting layer and extending to the non-emission area; and a common electrode disposed on the second common layer and extending to the non-emission area. The auxiliary electrode includes a first side and a second side facing each other in one direction, and a third side and a fourth side facing each other in another direction crossing the one direction. A side surface of the first metal layer of the auxiliary electrode includes a first bonding portion in contact with the second common layer, a second bonding portion in contact with the common electrode, and a third bonding portion in contact with the sealing layer. The first bonding portion has a first width at a first point that is part of the first side and the second side and has a second width smaller than the first width at a second point that is part of the third side and the fourth side.

In an embodiment, a width of the third bonding portion may correspond to an undercut structure of the auxiliary electrode. A width of the second bonding portion may be a value obtained by subtracting a width of the first bonding portion and the width of the third bonding portion from a width of the side surface of the first metal layer.

In an embodiment, the second bonding portion may have a third width at the first point of the first side, and have a fourth width smaller than the third width at the second point of the third side. A width of the third bonding portion may be a value obtained by subtracting a width of the first bonding portion and a width of the second bonding portion from the width of the side surface of the first metal layer.

In an embodiment, the second bonding portion may have a fifth width at the first point of the first side, and have a sixth width greater than the fifth width at the second point of the third side. A width of the third bonding portion may be a value obtained by subtracting a width of the first bonding portion and a width of the second bonding portion from the width of the side surface of the first metal layer.

The display device in embodiments includes an auxiliary electrode disposed in at least a part of a non-emission area around each of emission areas and a light-emitting element layer disposed on a substrate, and the light-emitting element layer includes a pixel electrode, a first common layer, a light-emitting layer, a second common layer, and a common electrode sequentially disposed.

In an embodiment, the auxiliary electrode includes a first side and a second side facing in one direction, and a third side and a fourth side facing in another direction, and a side surface of the auxiliary electrode includes a first bonding portion in contact with the second common layer and a second bonding portion in contact with the common electrode.

In addition, the first bonding portion of the auxiliary electrode in contact with the second common layer has a first width at a first point of the first side, while it has a second width smaller than the first width at a second point of the third side.

As described above, in embodiments, a resistance of the common electrode may be reduced due to the auxiliary electrode in contact with the common electrode and electrically connected to the common electrode, so that a delay time until the second power is transmitted to the common electrode of the entirety of the display area may be reduced.

Further, in embodiments, the first bonding portion in contact with the second common layer of the auxiliary electrode does not have the same width in the first side and the third side of the auxiliary electrode but has the first width at the first point of the first side, and, has the second width smaller than the first width at the second point of the third side. Accordingly, the width of the second bonding portion in contact with the common electrode may be increased as much as the width of the first bonding portion becomes relatively small at the second point of the third side of the auxiliary electrode. That is, since the side surface of the third side of the auxiliary electrode contacts the common electrode with a relatively large width, the electrical connection between the auxiliary electrode and the common electrode may be relatively assured by the second bonding portion in the third side of the auxiliary electrode.

In other words, the influence of the second common layer on the electrical connection between the auxiliary electrode and the common electrode may be reduced by disposing a relatively small amount of the second common layer on some of the side surfaces of the auxiliary electrode. As a result, reliability of the electrical connection between the auxiliary electrode and the common electrode may be improved.

Accordingly, the electrical connection between the common electrode and the auxiliary electrode may be firmly strengthened in the entirety of the display area.

However, the effects of the disclosure are not limited to the aforementioned effects, and various other effects are included in the specification.

BRIEF DESCRIPTION OF THE DRAWINGS

The above and other features and features of the disclosure will become more apparent by describing in detail embodiments thereof with reference to the attached drawings, in which.

DETAILED DESCRIPTION

Figure 1:
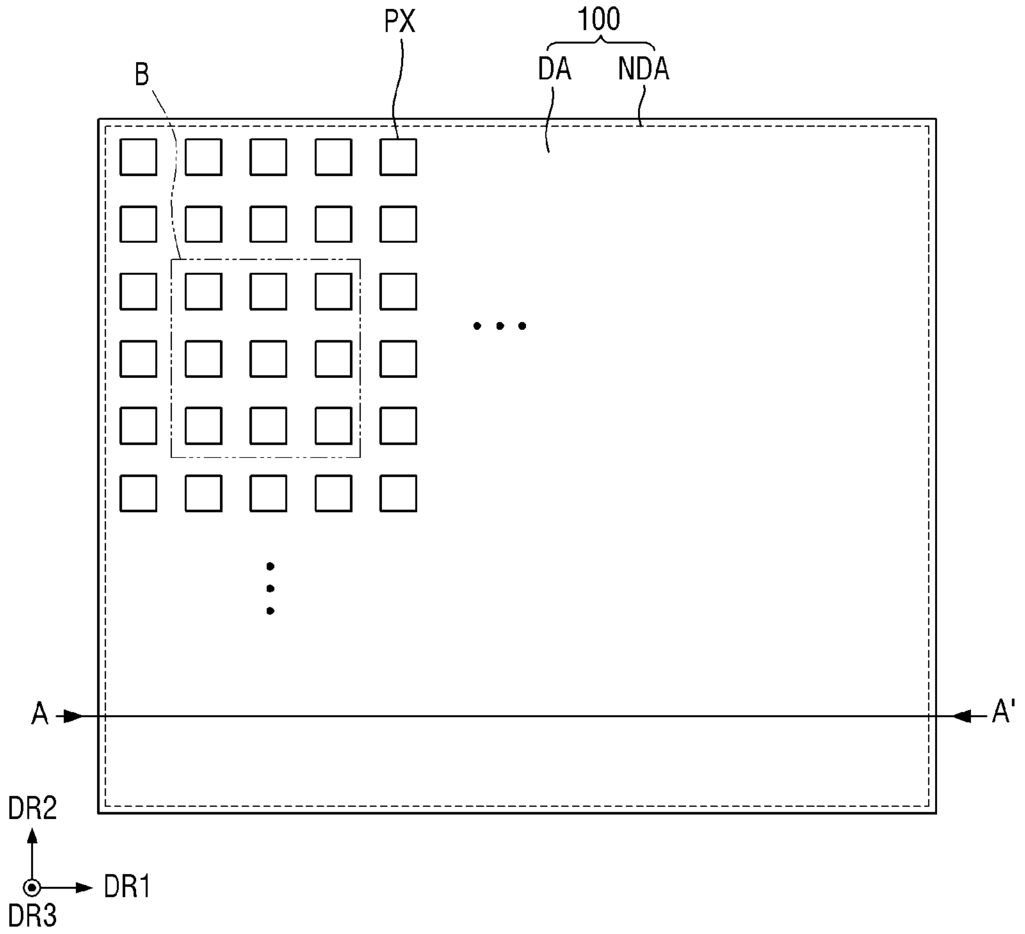
FIG. 1 is a plan view illustrating an embodiment of a display device.

The embodiments will now be described more fully hereinafter with reference to the accompanying drawings. The embodiments may, however, be provided in different forms and should not be construed as limiting. The same reference numbers indicate the same components throughout the disclosure. In the accompanying drawing figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device disposed "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a plan view illustrating an embodiment of a display device.

Referring to FIG. 1, a display device 100 in an embodiment may be formed in a flat panel shape. The display device 100 in an embodiment is a device for displaying a moving image or a still image. The display device 100 may be used as a display screen of various products such as televisions, laptop computers, monitors, billboards and the Internet of Things ("IOT") as well as portable electronic devices such as mobile phones, smart phones, tablet personal computers ("tablet PCs"), smart watches, watch phones, mobile communication terminals, electronic notebooks, electronic books, portable multimedia players ("PMPs"), navigation systems and ultra mobile PCs ("UMPCs").

The display device 100 may be a light-emitting display device including a light-emitting element. In an embodiment, the display device 100 may be at least one of an organic light-emitting display device using an organic light-emitting diode as alight-emitting element, a micro light-emitting diode display device using a micro LED as a light-emitting element, a quantum dot organic light-emitting display device using a quantum dot and an organic light-emitting diode as a light-emitting element, or an inorganic light-emitting display device using an inorganic semiconductor as a light-emitting element, for example. In the following description, it is assumed that the display device 100 is an organic light-emitting display device.

In an embodiment, the display device 100 may, in a plan view, be formed in a quadrangular (e.g., rectangular) shape having long sides in a first direction DR1 and short sides in a second direction DR2 crossing the first direction DR1, for example. The corners formed by meeting of the long sides in the first direction DR1 and the short sides in the second direction DR2 may be rounded to have a predetermined curvature or may be right-angled. The planar shape of the display device 100 is not limited to a quadrilateral shape, and may be formed in another polygonal shape, a circular shape, or an elliptical shape. The display device 100 may be formed to be flat, but is not limited thereto. In an embodiment, the display device 100 may include a curved portion formed at left and right ends and having a predetermined curvature or a varying curvature, for example.

In addition, the display device 100 may be formed flexibly so that it may be curved, bent, folded, or rolled.

The display device 100 may include a display area DA where an image is displayed and a non-display area NDA around the display area DA. Further, the display device 100 may include a plurality of pixels PXs arranged in the display area DA.

The display area DA is an area from which light for image display is emitted. The display area DA may have a circular shape, an oval shape, or a polygonal shape. The display area DA may be selected as a part of the center of the substrate 110.

The non-display area NDA, which is a peripheral area surrounding the display area DA, is an area in which an image is not displayed. The non-display area NDA may be selected as an area between the edge of the display area DA and the edge of the substrate 110.

The plurality of pixels PX may be arranged in a matrix in the first and second directions DR1 and DR2. Each of the plurality of pixels PX may be a unit for individually displaying various colors including white. To this end, each of the plurality of pixels PX may include emission areas EA (refer to FIG. 3) respectively emitting two or more different colors.

Figure 2:
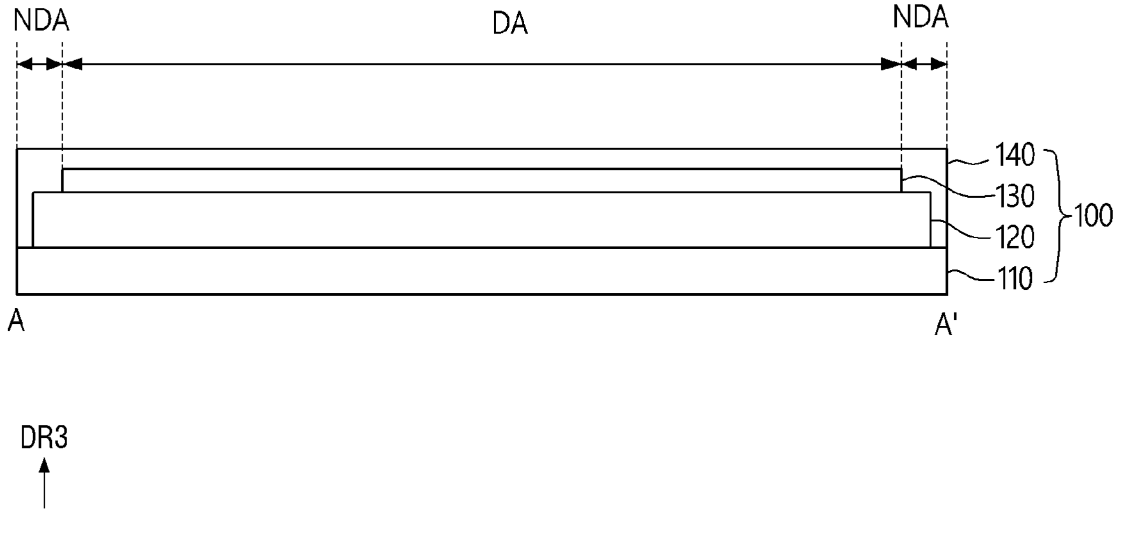
FIG. 2 is a cross-sectional view illustrating an example taken along line A-A' of FIG. 1.

FIG. 2 is a cross-sectional view illustrating an example taken along line A-A' of FIG. 1.

Referring to FIG. 2, the display device 100 may include the substrate 110 including the display area DA, a circuit layer 120 disposed on the substrate 110, a light-emitting element layer 130 disposed on the circuit layer 120, and a sealing layer 140 disposed on the light-emitting element layer 130.

The substrate 110 supports the circuit layer 120 and the light-emitting element layer 130 and protects the circuit layer 120 and the light-emitting element layer 130 from physical impact and electric shock.

The substrate 110 may further include the non-display area NDA around the display area DA.

The substrate 110 may include or consist of an insulating material. In an embodiment, the first substrate 110 may include or consist of an insulating material such as glass, quartz, or polymer resin, for example. In an embodiment, the polymer resin may include polyethersulphone ("PES"), polyacrylate ("PA"), polyarylate ("PAR"), polyetherimide ("PEI"), polyethylene naphthalate (PEN), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or any combinations thereof.

The substrate 110 may include or consist of a rigid material to properly support components disposed on one surface thereof.

In an alternative embodiment, in order to facilitate shape deformation of the display device 100, the substrate 110 may include or consist of a flexible material that may be easily bent, folded, or rolled.

In an alternative embodiment, the substrate 110 may include or consist of a metal material.

The circuit layer 120 may include pixel drivers PXD (refer to FIG. 4) respectively corresponding to the emission areas EA (refer to FIG. 3) arranged in the display area DA.

The light-emitting element layer 130 may include light-emitting elements LE (refer to FIG. 4) respectively corresponding to the emission areas EA. The light-emitting elements LE of the light-emitting element layer 130 may be electrically connected to the pixel drivers PXD of the circuit layer 120, respectively.

The sealing layer 140 is to block oxygen or moisture from penetrating into the light-emitting element layer 130. As the light-emitting element layer 130 is sealed by the sealing layer 140, deterioration of the light-emitting element layer 130 may be delayed.

Figure 3:
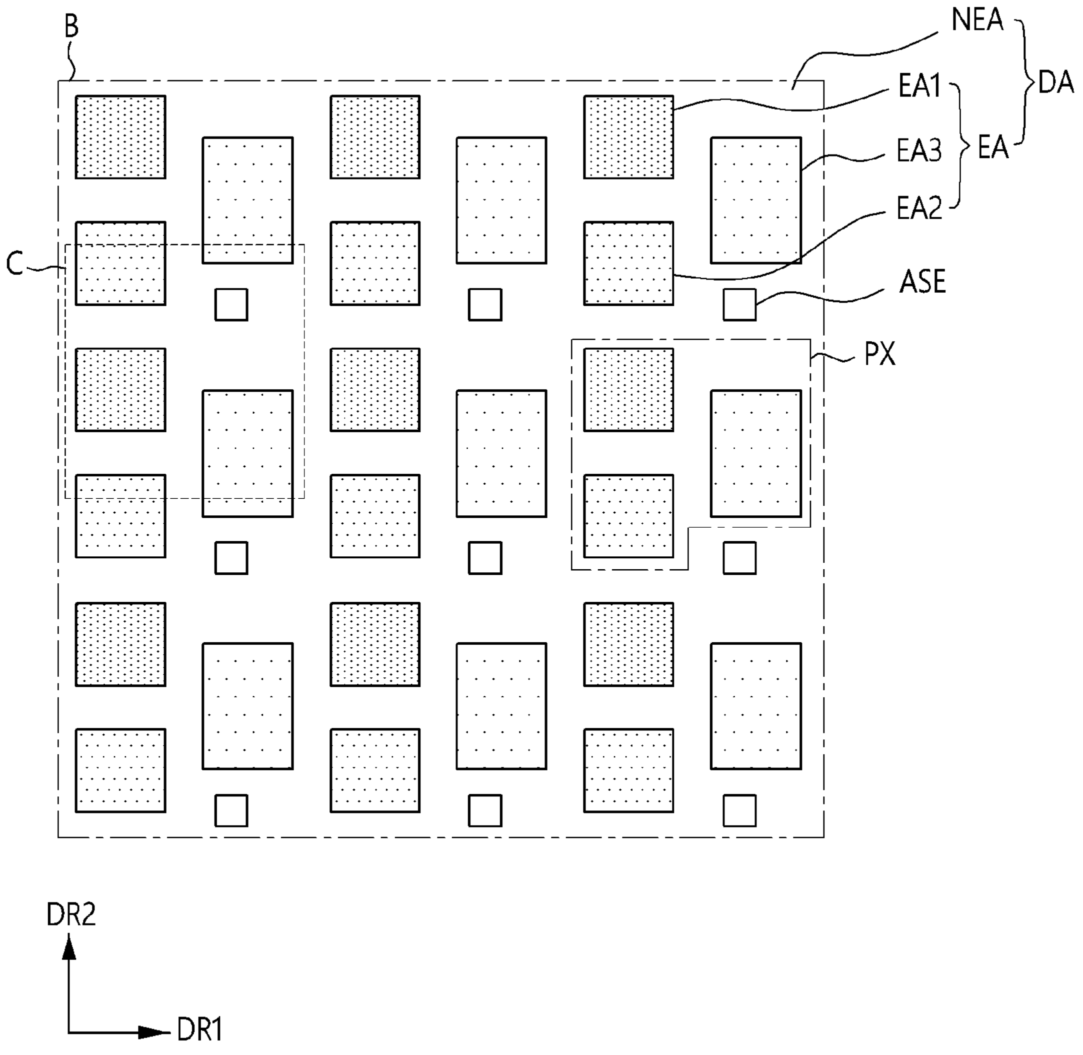
FIG. 3 is a plan view showing part B of the embodiment of FIG. 1.

FIG. 3 is a plan view showing part B of FIG. 1.

Referring to FIG. 3, the display device 100 in the illustrated embodiment includes the emission areas EA arranged in the display area DA, and an auxiliary electrode ASE corresponding to a part of non-emission areas NEA around each of the emission areas EA.

Each of the emission areas EA may be a unit that emits light of one of two or more different colors with respective luminances.

In an embodiment, the emission areas EA may include first emission areas EA1 emitting light of a first color having a predetermined wavelength band, second emission areas EA2 emitting light of a second color having a wavelength band lower than that of the first color, and third emission areas EA3 emitting light of a third color having a wavelength band lower than that of the second color, for example.

In an embodiment, the first color may be red having a wavelength band of approximately 600 nanometers (nm) to approximately 750 nanometers (nm), the second color may be green having a wavelength band of approximately 480 nm to approximately 560 nm, and the third color may be blue having a wavelength band of approximately 370 nm to approximately 460 nm, for example. However, this is only an example, and the wavelength band of the light emitted from each of the first, second, and third emission areas EA1, EA2, and EA3 in an embodiment of this specification is not limited thereto.

Each of the plurality of pixels PX may be constituted with two or more emission areas EA that emit different colors and are disposed adjacent to each other. That is, lights of various colors displayed by the plurality of pixels PX may be implemented as a combination of lights emitted from two or more emission areas EA.

In an embodiment, as illustrated in FIG. 3, the arrangement shape of the emission areas EA may include a column in which the first emission areas EA1 are arranged side by side in the first direction DR1, a column in which the second emission areas EA2 are arranged side by side in the first direction DR1, a column in which third emission areas EA3 are arranged side by side in the first direction DR1, a row in which the first emission areas EA1 and the second emission areas EA2 are alternately arranged in the second direction DR2, and a row in which the third emission areas EA3 are arranged side by side in the second direction DR2, for example.

In this case, each of the plurality of pixels PX may include one first emission area EA1 and one second emission area EA2 adjacent to each other in the second direction DR2, and one third emission area EA3 adjacent to one first emission area EA1 and one second emission area EA2 in the first direction DR1.

In addition, the third emission area EA3 may have a larger area than that of the first emission area EA1 and the second emission area EA2. In this way, high luminance expression of the third color by the third emission area EA3 may be facilitated.

However, this is only an example, and the size and arrangement shape of the emission areas EA and the configuration of the pixels PX are not limited to those illustrated in FIG. 3.

The non-emission area NEA is a separation area between the emission areas EA. The auxiliary electrode ASE is disposed in at least a part of the non-emission area NEA and is electrically connected to the common electrode 136 (refer to FIG. 9) disposed in an entirety of the display area DA of the light-emitting element layer 130. The auxiliary electrode ASE may include a metal layer having relatively low resistance.

Since the resistance of the common electrode 136 (refer to FIG. 9) is lowered by the auxiliary electrode ASE, the delay time until a second power ELVSS (refer to FIG. 4) applied to the common electrode 136 is transmitted to the common electrode 136 of the entirety of the display area DA, may be reduced.

As mentioned above, the circuit layer 120 may include the pixel drivers PXD respectively corresponding to the emission areas EA. In addition, the light-emitting element layer 130 may include the light-emitting elements LE respectively corresponding to the emission areas EA and respectively electrically connected to the pixel drivers PXD.

That is, each of the emission areas EA may include one pixel driver PXD and one light-emitting element LE.

Figure 4:
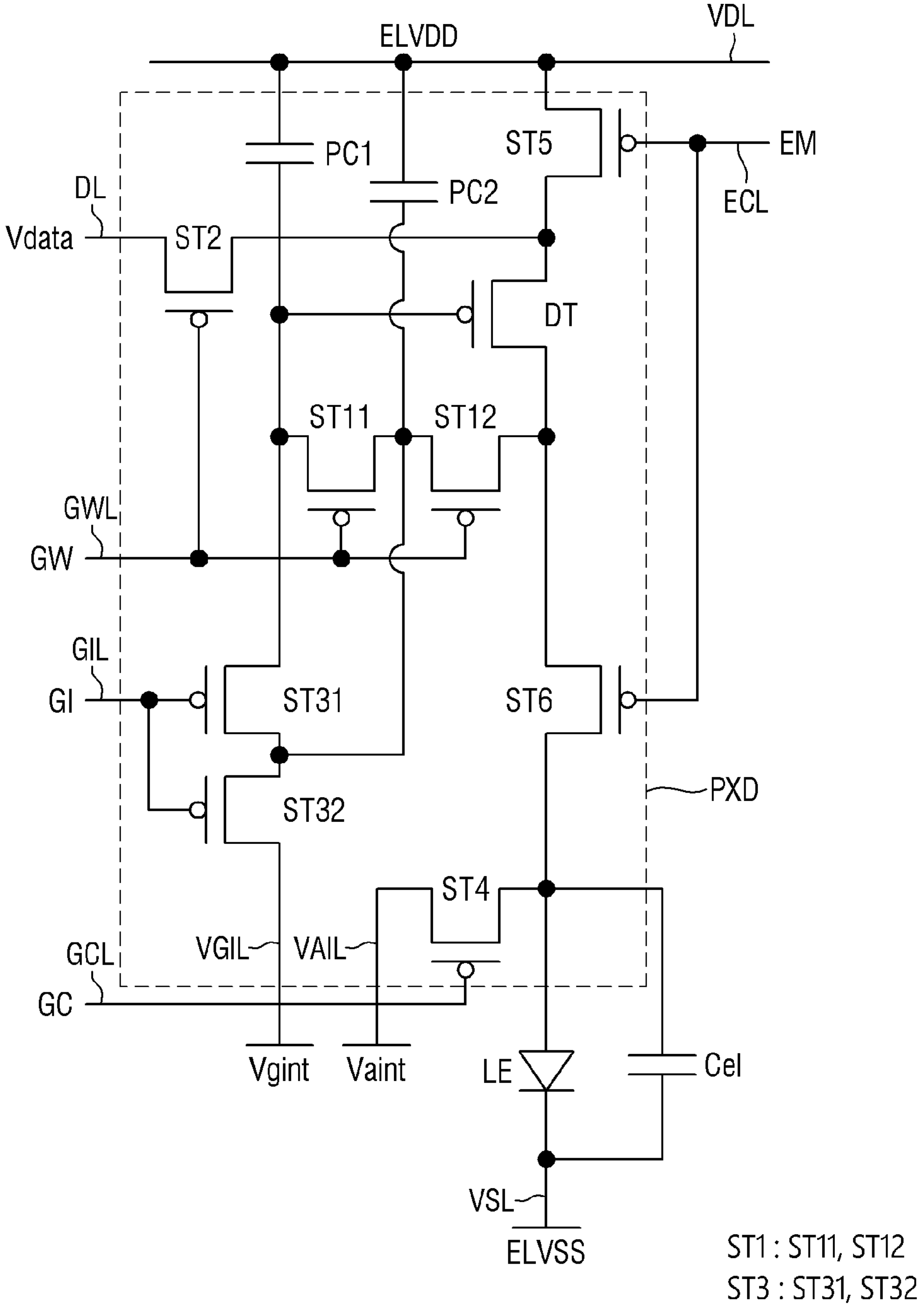
FIG. 4 is an equivalent circuit diagram illustrating an embodiment of a pixel driver and a light-emitting element corresponding to one of the emission areas of FIG. 3.

FIG. 4 is an equivalent circuit diagram illustrating an embodiment of a pixel driver and a light-emitting element corresponding to one of the emission areas of FIG. 3.

Referring to FIG. 4, one pixel driver PXD of the pixel drivers PXD of the circuit layer 120 may include a driving transistor DT generating a driving current to drive the light-emitting element LE electrically connected to the one pixel driver PXD, two or more transistors ST1 to ST6 electrically connected to the driving transistor DT, and at least one capacitor PC1 and PC2.

The anode electrode of the light-emitting element LE may be electrically connected to the pixel driver PXD, and the cathode electrode of the light-emitting element LE may be electrically connected to a second power line VSL supplying the second power ELVSS having a lower voltage level than a first power ELVDD.

For individual driving of the light-emitting elements LE of the light-emitting element layer 130, the anode electrode of each of the light-emitting elements LE may be also referred to as a pixel electrode as the anode electrode is disposed in each of the emission areas EA.

In addition, since the cathode electrode of the light-emitting elements LE is supplied with the second power ELVSS in the same manner, the cathode electrode may be also referred to as a common electrode as the cathode electrode is disposed in an entirety of the emission areas EA.

The light-emitting element LE may be an organic light-emitting diode having a light-emitting layer including an organic light-emitting material. In an alternative embodiment, the light-emitting element LE may be an inorganic light-emitting element including a light-emitting layer including an inorganic semiconductor. In an alternative embodiment, the light-emitting element LE may be a quantum dot light-emitting element having a quantum dot light-emitting layer. In an alternative embodiment, the light-emitting element LE may be a micro light-emitting diode.

A capacitor Cel connected in parallel with the light-emitting element LE refers to a parasitic capacitance between the anode electrode and the cathode electrode.

The driving transistor DT is connected in series to the light-emitting element LE between the first power line VDL and the second power line VSL. That is, the first electrode (e.g., source electrode) of the driving transistor DT may be connected to the first power line VDL through the fifth transistor ST5, and the second electrode (e.g., the drain electrode) of the driving transistor DT may be connected to the anode electrode of the light-emitting element LE through the sixth transistor ST6.

Further, the first electrode of the driving transistor DT may be connected to the data line DL through the second transistor T2.

The gate electrode of the driving transistor DT may be connected to the first power line VDL through the first capacitor PC1. That is, the first capacitor PC1 may be connected between the gate electrode of the driving transistor DT and the first power line VDL.

Accordingly, the potential of the gate electrode of the driving transistor DT may be maintained by the first power ELVDD of the first power line VDL.

Accordingly, when the data signal Vdata of the data line DL is transmitted to the first electrode of the driving transistor DT through the turned-on second transistor T2, the voltage difference corresponding to the data signal Vdata and the first power ELVDD may be generated between the gate electrode of the driving transistor DT and the first electrodes of the driving transistor DT.

In this case, when the voltage difference between the gate electrode of the driving transistor DT and the first electrode of the driving transistor DT, that is, the gate-source voltage difference is greater than or equal to a threshold voltage, the driving transistor DT may be turned on.

Then, when the fifth transistor ST5 and the sixth transistor T6 are turned on, the driving transistor DT may generate the drain-source current corresponding to the data signal Vdata. The drain-source current of the driving transistor DT may be supplied as the driving current of the light-emitting element LE.

Accordingly, the light-emitting element LE may emit light having a luminance corresponding to the data signal Vdata.

The second transistor ST2 may be connected between the first electrode of the driving transistor DT and the data line DL.

The first transistor ST1 may be connected between the gate electrode of the driving transistor DT and the second electrode of the driving transistor DT.

The first transistor ST1 may include a plurality of sub-transistors connected in series. In an embodiment, the first transistor ST1 may include a first sub-transistor ST11 and a second sub-transistor ST12, for example.

The first electrode of the first sub-transistor ST11 may be connected to the gate electrode of the driving transistor DT, the second electrode of the first sub-transistor ST11 may be connected to the first electrode of the second sub-transistor ST12, and the second electrode of the second sub-transistor ST12 may be connected to the second electrode of the driving transistor DT.

In this way, it is possible to prevent the potential of the gate electrode of the driving transistor DT from changing due to the leakage current caused by the first transistor ST1 that is not turned on.

The gate electrode of each of the second transistor ST2, the first sub-transistor ST11, and the second sub-transistor ST12 may be connected to the scan write line GWL.

Accordingly, when the scan write signal GW is transmitted through the scan write line GWL, the second transistor ST2, the first sub-transistor ST11, and the second sub-transistor ST12 may be turned on.

In this case, the data signal Vdata may be transmitted to the first electrode of the driving transistor DT through the turned-on second transistor ST2.

Further, the gate electrode of the driving transistor DT and the second electrode of the driving transistor DT may have the same potential through the turned-on first sub-transistor ST11 and the turned-on second sub-transistor ST12.

Accordingly, the driving transistor DT may be turned on.

The third transistor ST3 may be connected between the gate electrode of the driving transistor DT and a gate initialization voltage line VGIL.

The third transistor ST3 may include a plurality of sub-transistors connected in series. In an embodiment, the third transistor ST3 may include a third sub-transistor ST31 and a fourth sub-transistor ST32, for example.

The first electrode of the third sub-transistor ST31 may be connected to the gate electrode of the driving transistor DT, the second electrode of the third sub-transistor ST31 may be connected to the first electrode of the fourth sub-transistor ST32, and the second electrode of the fourth sub-transistor ST32 may be connected to the gate initialization voltage line VGIL.

In this way, it is possible to prevent the potential of the gate electrode of the driving transistor DT from changing due to the leakage current caused by the third transistor ST3 that is turned off.

The gate electrode of each of the third sub-transistor ST31 and the fourth sub-transistor ST32 may be connected to the scan initialization line GIL.

Accordingly, when the scan initialization signal GI is transmitted through the scan initialization line GIL, the third sub-transistor ST31 and the fourth sub-transistor ST32 are turned on and, thus, the potential of the gate electrode of the driving transistor DT may be initialized to a gate initialization voltage Vgint of the gate initialization voltage line VGIL.

A node between the third sub-transistor ST31 and the fourth sub-transistor ST32 and a node between the first sub-transistor ST11 and the second sub-transistor ST12 may be electrically connected to one end of the second capacitor PC2. In addition, the other end of the second capacitor PC2 may be electrically connected to the first power line VDL.

Accordingly, the node between the third sub-transistor ST31 and the fourth sub-transistor ST32 and the node between the first sub-transistor ST11 and the second sub-transistor ST12 may be maintained at the potential of the first power ELVDD.

A fourth transistor ST4 may be connected between the anode electrode of the light-emitting element LE and the anode initialization voltage line VAIL.

The gate electrode of the fourth transistor ST4 may be connected to the gate control line GCL.

Accordingly, when the gate control signal GC is transmitted through the gate control line GCL, the fourth transistor ST4 may be turned on.

At this time, the potential of the anode electrode of the light-emitting element LE may be initialized to an anode initialization voltage Vaint of the anode initialization voltage line VAIL through the turned-on fourth transistor ST4.

Accordingly, it is possible to prevent the light-emitting element LE from being driven by the current remaining in the anode electrode.

In an alternative embodiment, the fourth transistor ST4 may include a plurality of sub-transistors connected in series. In an embodiment, the fourth transistor ST4 may include a fifth sub-transistor ST41 (refer to FIG. 6) and a sixth sub-transistor ST42 (refer to FIG. 6), for example.

In this way, it is possible to prevent the potential of the anode electrode of the light-emitting element LE from being fluctuated due to leakage current caused by the fourth transistor ST4 in a turned-off state.

The fifth transistor ST5 may be connected between the first electrode of the driving transistor DT and the first power line VDL.

The sixth transistor ST6 may be connected between the second electrode of the driving transistor DT and the anode electrode of the light-emitting element LE.

The gate electrode of each of the fifth transistor ST5 and the sixth transistor ST6 may be connected to the emission control line ECL.

Accordingly, when the emission control signal EM is transmitted through the emission control line ECL, the fifth transistor ST5 and the sixth transistor ST6 are turned on and, thus, the drain-source current of the driving transistor DT may be supplied as the driving current of the light-emitting element LE.

Although FIG. 4 illustrates a case in which the driving transistor DT and the first to sixth transistors ST1 to ST6 included in the pixel driver PXD are all N-type metal oxide semiconductor field effect transistors ("MOSFET"), it should be noted that the pixel driver PXD of an embodiment is not limited to that illustrated in FIG. 4. That is, at least one of the driving transistor DT and the first to sixth transistors ST1 to ST6 included in the pixel driver PXD in an embodiment may be a P-type MOSFET.

Figure 5:
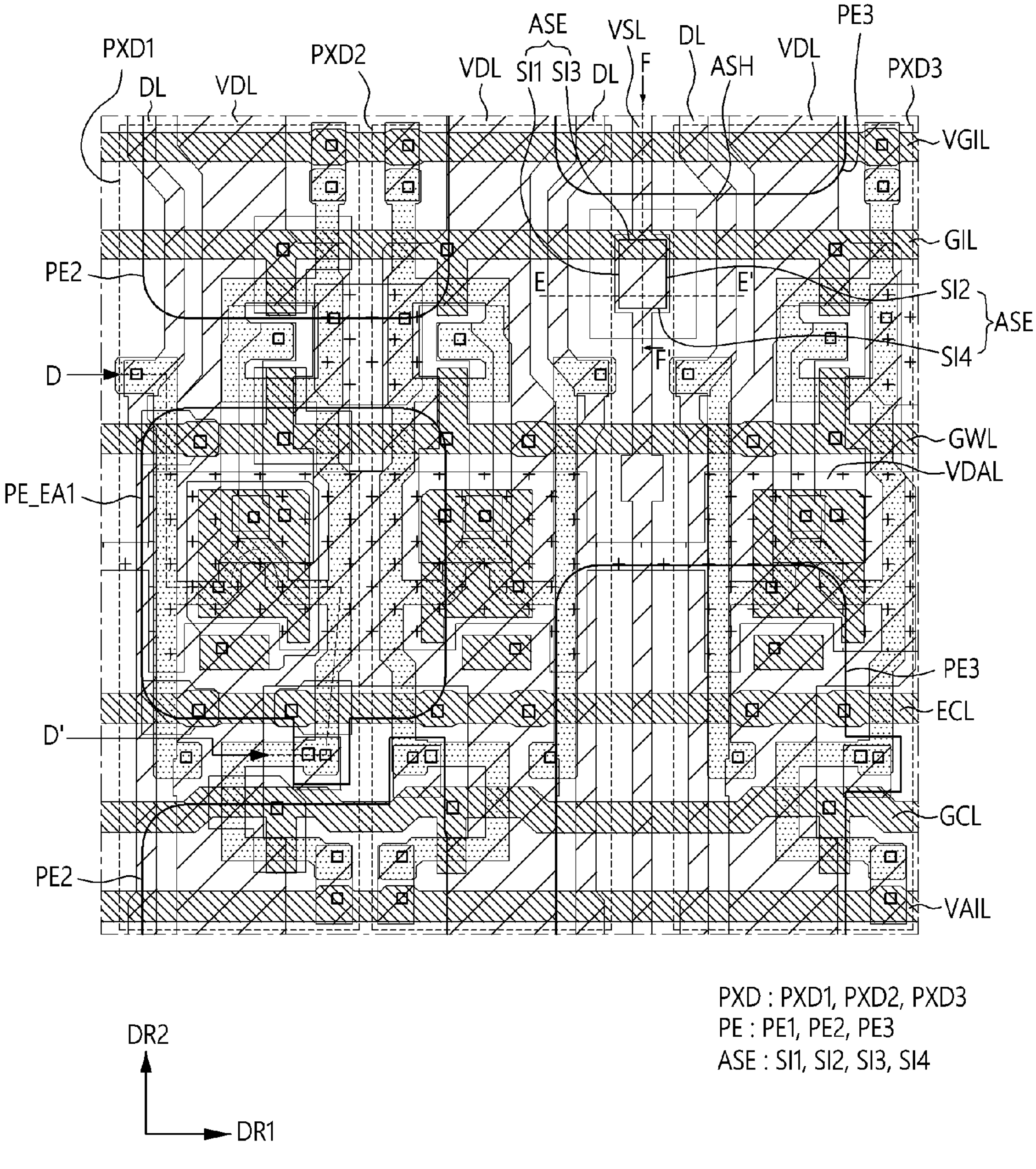
FIG. 5 is a plan view illustrating an embodiment of a circuit layer and pixel electrodes of portion C of FIG. 3.

FIG. 5 is a plan view illustrating an embodiment of a circuit layer and pixel electrodes of portion C of FIG. 3.

Referring to FIG. 5, the circuit layer 120 of the display device 100 in the illustrated embodiment may include the pixel drivers PXD (PXD1, PXD2, and PXD3) respectively corresponding to the emission areas EA (EA1, EA2, and EA3) (refer to FIG. 3).

In addition, the light-emitting element layer 130 of the display device 100 in the illustrated embodiment may include the pixel electrodes PE (PE1, PE2, and PE3, and see 131 of FIG. 9) respectively corresponding to the emission areas EA (EA1, EA2, and EA3) and respectively electrically connected to the pixel drivers PXD (PXD1, PXD2, and PXD3).

The pixel electrodes PE may be disposed in the emission areas EA, respectively. That is, the pixel electrodes PE may be disposed in the same arrangement shape as the emission areas EA.

Accordingly, as illustrated in FIGS. 3 and 5, the pixel electrode PE1 (also referred to as PE EA1) of the first emission area EA1 and the pixel electrode PE2 of the second emission area EA2 may be adjacent to each other in the second direction DR2. In addition, the pixel electrode PE3 of the third emission area EA3 may be adjacent to a part of the pixel electrode PE1 of the first emission area EA1 and a part of the pixel electrode PE2 of the second emission area EA2 in the first direction DR1.

In contrast, the pixel drivers PXD may be disposed parallel to each other in the first direction DR1. That is, the pixel driver PXD1 of the first emission area EA1, the pixel driver PXD2 of the second emission area EA2, and the pixel driver PXD3 of the third emission area EA3 may be arranged side by side in the first direction DR1.

The circuit layer 120 of the display device 100 in the illustrated embodiment may further include a scan write line GWL, a scan initialization line GIL, an emission control line ECL, a gate control line GCL, a gate initialization voltage line VGIL, an anode initialization voltage line VAIL, a data line DL, and a first power line VDL electrically connected to each of the pixel drivers PXD.

The scan write line GWL, the scan initialization line GIL, the emission control line ECL, the gate control line GCL, the gate initialization voltage line VGIL, and the anode initialization voltage line VAIL may extend in the first direction DR1, and may be spaced apart from each other in the second direction DR2.

The data line DL and the first power line VDL may extend in the second direction DR2 and may be spaced apart from each other in the first direction DR1.

In addition, the circuit layer 120 of the display device 100 in the illustrated embodiment may further include a first power auxiliary line VDAL electrically connected between the pixel drivers PXD and the first power line VDL. The first power auxiliary line VDAL may extend in the first direction DR1. Accordingly, as the first power ELVDD is transmitted by the first power line VDL in the second direction DR2 and the first power auxiliary line VDAL in the first direction DR1, a delay time until the first power ELVDD is transmitted to the entirety of the display area DA may be reduced.

As mentioned above, the display device 100 in the illustrated embodiment includes the auxiliary electrode ASE disposed on at least a part of the non-emission area NEA. In the illustrated embodiment, the auxiliary electrode ASE may be disposed between third emission areas EA3 adjacent to each other in the second direction DR2.

The auxiliary electrode ASE includes a first side SI1 and a second side SI2 that face each other in the first direction DR1, and a third side SI3 and a fourth side SI4 that face each other in the second direction DR2. In an embodiment, in a plane including the first direction DR1 and the second direction DR2, the auxiliary electrode ASE may be a quadrilateral shape including the first side SI1, the second side SI2, the third side SI3, and the fourth side SI4, for example. However, this is merely one of embodiments, and the planar shape of the auxiliary electrode ASE may be a polygon that satisfies a condition including the first side SI1, the second side SI2, the third side SI3, and the fourth side SI4, such as a hexagon or an octagon.

An auxiliary hole ASCH which exposes the auxiliary electrode ASE may be defined in the display device 100.

As illustrated in FIG. 5, the circuit layer 120 of the display device 100 in the illustrated embodiment may further include a second power line VSL electrically connected to the common electrode 136 (refer to FIG. 9) of the light-emitting element layer 130.

The second power line VSL may extend in the second direction DR2 and may be spaced apart from the data line DL and the first power line VDL in the first direction DR1.

In an embodiment, the second power line VSL may be disposed between the pixel driver PXD2 of the second emission area EA2 and the pixel driver PXD3 of the third emission area EA3.

In the illustrated embodiment, the auxiliary electrode ASE may be disposed on a part of the second power line VSL, for example.

Figure 6:
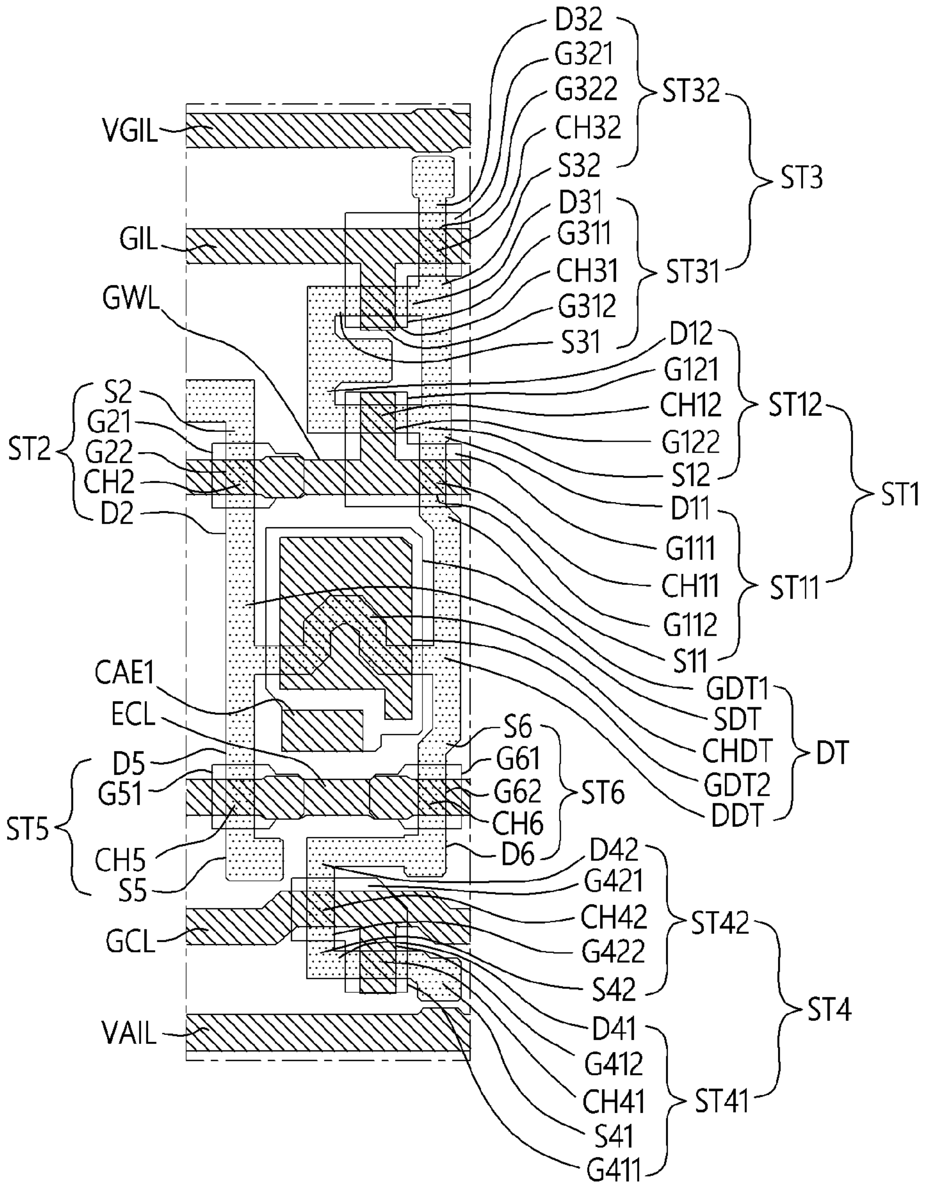
FIG. 6 is a plan view illustrating a first conductive layer, a semiconductor layer, and a second conductive layer of the pixel driver of the first emission area of FIG. 5.
Figure 7:
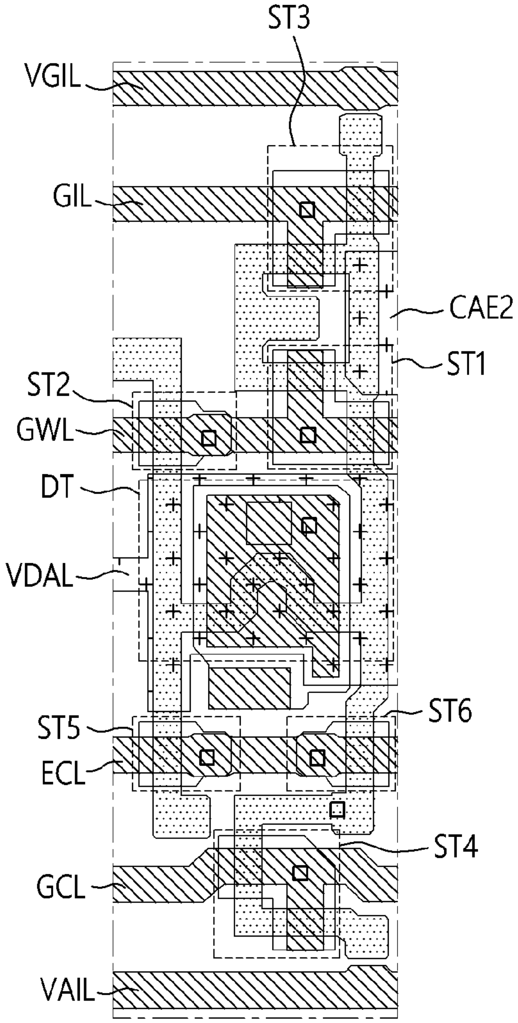
FIG. 7 is a plan view further illustrating a third conductive layer of the pixel driver of the first emission area of FIG. 5 together with the plan view of FIG. 6.
Figure 8:
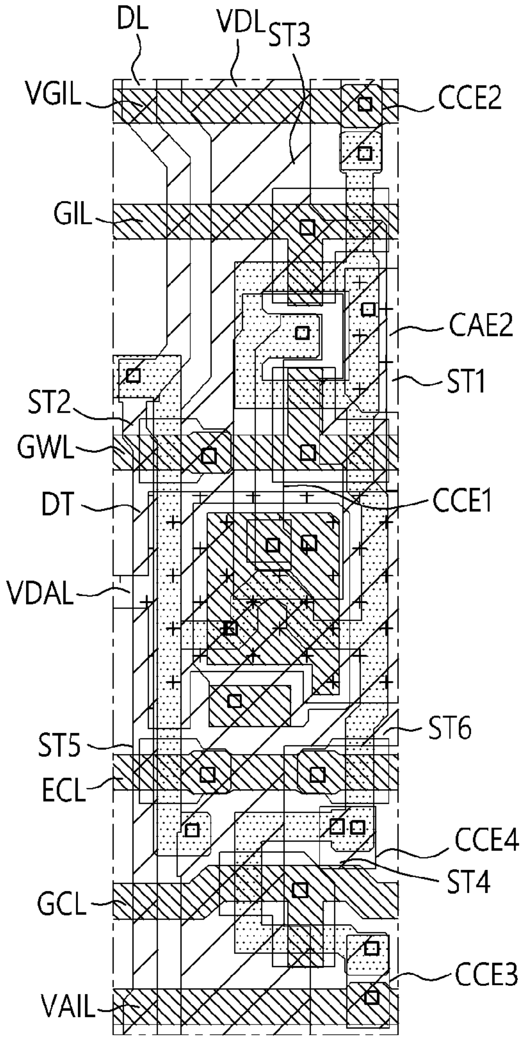
FIG. 8 is a plan view further illustrating a fourth conductive layer of the pixel driver of the first emission area of FIG. 5 together with the plan view of FIG. 7.
Figure 9:
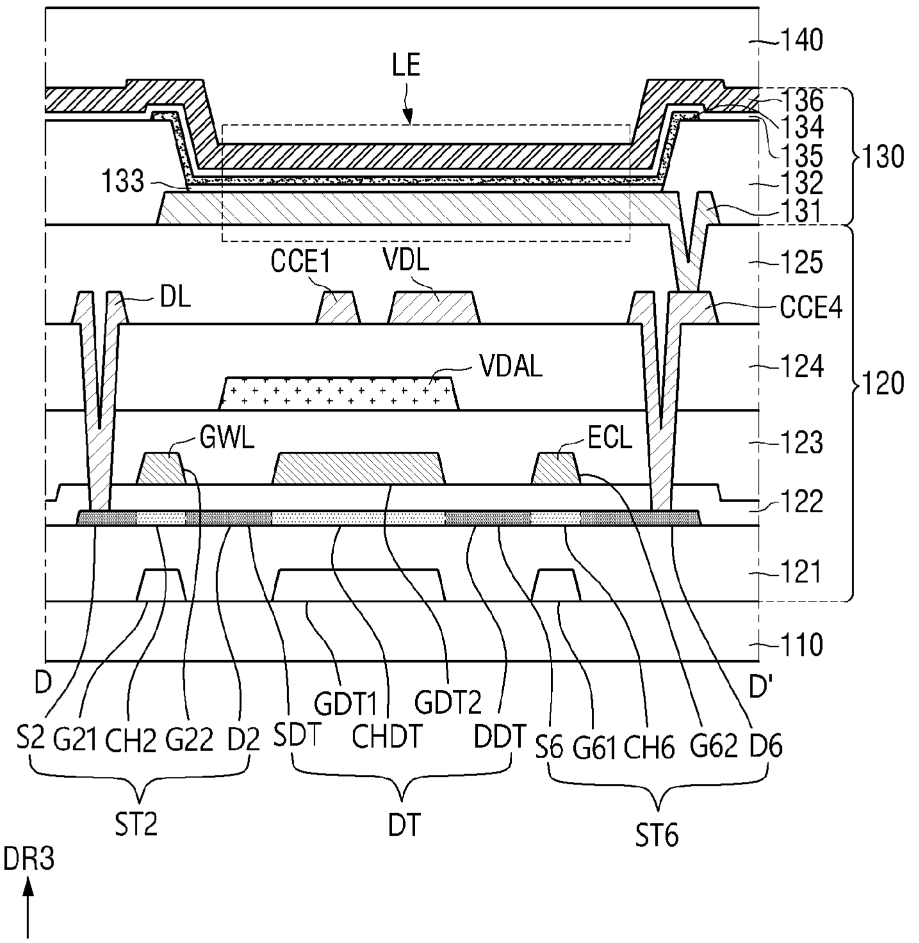
FIG. 9 is a cross-sectional view taken along line D-D' of FIG. 5.

FIG. 6 is a plan view illustrating a first conductive layer, a semiconductor layer, and a second conductive layer of the pixel driver of the first emission area of FIG. 5. FIG. 7 is a plan view further illustrating a third conductive layer of the pixel driver of the first emission area of FIG. 5 together with the plan view of FIG. 6. FIG. 8 is a plan view further illustrating a fourth conductive layer of the pixel driver of the first emission area of FIG. 5 together with the plan view of FIG. 7. FIG. 9 is a cross-sectional view taken along line D-D' of FIG. 5.

First, as illustrated in FIGS. 6, 7, 8, and 9, the circuit layer 120 may include a first conductive layer CDL1 disposed on the substrate 110, a semiconductor layer SEL disposed on a buffer layer 121 covering the first conductive layer CDL1, a second conductive layer CDL2 disposed on a gate insulating layer 122 covering the semiconductor layer SEL, a third conductive layer CDL3 disposed on an inter-insulating layer 123 covering the second conductive layer CDL2, a fourth conductive layer CDL4 disposed on a first planarization layer 124 covering the third conductive layer CDL3, and a second planarization layer 125 covering the fourth conductive layer CDL4.

As illustrated in FIG. 4, the pixel driver PXD includes one or more transistors DT and ST1 to ST6.

Referring to FIG. 6, the one or more transistors DT, ST11, ST12, ST2, ST31, ST32, ST41, ST42, ST5, and ST6 provided in the pixel driver PXD may include channel portions CHDT, CH11, CH12, CH2, CH31, CH32, CH41, CH42, CH5, and CH6, source portions SDT, S11, S12, S2, S31, S32, S41, S42, S5, and S6, drain portions DDT, D11, D12, D2, D31, D32, D41, D42, D5, and D6, first gate electrodes GDT1, G111, G121, G21, G311, G321, G411, G421, G51, G61, and second gate electrodes GDT2, G112, G122, G22, G312, G322, G412, G422, G52, and G62, respectively.

The channel portions CHDT, CH11, CH12, CH2, CH31, CH32, CH41, CH42, CH5, and CH6 have semiconductor characteristics in which a channel for carrier movement is selectively generated.

The source portions SDT, S11, S12, S2, S31, S32, S41, S42, S5, and S6 are connected to one sides of the channel portions CHDT, CH11, CH12, CH2, CH31, CH32, CH41, CH42, CH5, and CH6.

The drain portions DDT, D11, D12, D2, D31, D32, D41, D42, D5, and D6 are connected to the other sides of the channel portions CHDT, CH11, CH12, CH2, CH31, CH32, CH41, CH42, CH5, and CH6.

The first gate electrodes GDT1, G111, G121, G21, G311, G321, G411, G421, G51, and G61 and the second gate electrodes GDT2, G112, G122, G22, G312, G322, G412, G422, G52, and G62 overlap the channel portions CHDT, CH11, CH12, CH2, CH31, CH32, CH41, CH42, CH5, and CH6. In addition, the first gate electrodes GDT1, G111, G121, G21, G311, G321, G411, G421, G51, and G61 and the second gate electrodes GDT2, G112, G122, G22, G312, G322, G412, G422, G52, and G62 are electrically connected to each other.

The semiconductor layer SEL between the buffer layer 121 and the gate insulating layer 122 includes the channel portions CHDT, CH11, CH12, CH2, CH31, CH32, CH41, CH42, CH5, and CH6, the source portions SDT, S11, S12, S2, S31, S32, S41, S42, S5, and S6, and the drain portions DDT, D11, D12, D2, D31, D32, D41, D42, D5, and D6.

The semiconductor layer SEL may include or consist of any one of polysilicon, amorphous silicon, and an oxide semiconductor.

When the semiconductor layer SEL includes or consists of an oxide semiconductor, the rest of the semiconductor layer SEL excluding the channel portions CHDT, CH11, CH12, CH2, CH31, CH32, CH41, CH42, CH5, and CH6, that is, the source portions SDT, S11, S12, S2, S31, S32, S41, S42, S5, and S6 and the drain portions DDT, D11, D12, D2, D31, D32, D41, D42, D5, and D6 may be in a conductive state.

The first conductive layer CDL1 between the substrate 110 and the buffer layer 121 includes the first gate electrodes GDT1, G111, G121, G21, G311, G321, G411, G421, G51, and G61.

The second conductive layer CDL2 between the gate insulating layer 122 and the inter-insulating layer 123 includes the second gate electrodes GDT2, G112, G122, G22, G312, G322, G412, G422, G52, and G62.

The second gate electrode G112 of the first sub-transistor ST11, the second gate electrode G122 of the second sub-transistor ST12, and the second gate electrode G22 of the second transistor ST2 may be different parts of the scan write line GWL.

The second gate electrode G312 of the third sub-transistor ST31 and the second gate electrode G322 of the fourth sub-transistor ST32 may be different parts of the scan initialization line GIL.

The second gate electrode G412 of the fifth sub-transistor ST41 and the second gate electrode G422 of the sixth sub-transistor ST42 may be different parts of the gate control line GCL.

The gate electrode G5 of the fifth transistor ST5 and the gate electrode G6 of the sixth transistor ST6 may be different parts of the emission control line ECL.

That is, the second conductive layer CDL2 may include the second gate electrode GDT2 of the driving transistor DT, the scan write line GWL, the scan initialization line GIL, the emission control line ECL, and the gate control line GCL.

The second conductive layer CDL2 may further include a first capacitor electrode CAE1 overlapping a part of the first gate electrode GDT1 of the driving transistor DT, the gate initialization voltage line VGIL, and the anode initialization voltage line VAIL.

Each of the first conductive layer CDL1 and the second conductive layer CDL2 may be formed as a single layer or multiple layers including any one of molybdenum (Mo), aluminum (Al), chromium (Cr), gold (Au), titanium (Ti), nickel (Ni), neodymium (Nd) and copper (Cu) or any alloys thereof.

The channel portion CHDT of the driving transistor DT overlaps the first gate electrode GDT1 and the second gate electrode GDT2 of the driving transistor DT. One side of the channel portion CHDT of the driving transistor DT is connected to the source portion SDT of the driving transistor DT, and the other side of the channel portion CHDT of the driving transistor DT is connected to the drain portion DDT of the driving transistor DT.

The first gate electrode GDT1 and the second gate electrode GDT2 of the driving transistor DT may be electrically connected to each other through a hole penetrating the buffer layer 121 and the gate insulating layer 122.

The source portion SDT of the driving transistor DT may be connected to the drain portion D2 of the second transistor ST2 and the drain portion D5 of the fifth transistor ST5.

The drain portion DDT of the driving transistor DT may be connected to the source portion S11 of the first sub-transistor ST11 and the drain portion D6 of the sixth transistor ST6.

The first transistor ST1 may include the first sub-transistor ST11 and the second sub-transistor ST12 connected in series.

The channel portion CH11 of the first sub-transistor ST11 overlaps the first gate electrode G111 and the second gate electrode G112 of the first sub-transistor ST11.

One side of the channel portion CH11 of the first sub-transistor ST11 is connected to the source portion S11 of the first sub-transistor ST11, and the other side of the channel portion CH11 of the first sub-transistor ST11 is connected to the drain portion D11 of the first sub-transistor ST11.

The second gate electrode G112 of the first sub-transistor ST11 is a part of the scan write line GWL.

The first gate electrode G111 and the second gate electrode G112 of the first sub-transistor ST11 may be electrically connected to each other through a hole penetrating the buffer layer 121 and the gate insulating layer 122.

The drain portion D11 of the first sub-transistor ST11 is connected to the source portion S12 of the second sub-transistor ST12.

The channel portion CH12 of the second sub-transistor ST12 overlaps the first gate electrode G121 and the second gate electrode G122 of the second sub-transistor ST12.

One side of the channel portion CH12 of the second sub-transistor ST12 is connected to the source portion S12 of the second sub-transistor ST12, and the other side of the channel portion CH12 of the second sub-transistor ST12 is connected to the drain portion D12 of the second sub-transistor ST12.

The second gate electrode G122 of the second sub-transistor ST12 is another part of the scan write line GWL.

The first gate electrode G121 and the second gate electrode G122 of the second sub-transistor ST12 may be electrically connected to each other through a hole penetrating the buffer layer 121 and the gate insulating layer 122.

The drain portion D12 of the second sub-transistor ST12 may be connected to the source portion S31 of the third sub-transistor ST31.

The channel portion CH2 of the second transistor ST2 overlaps the first gate electrode G21 and the second gate electrode G22 of the second transistor ST2.

One side of the channel portion CH2 of the second transistor ST2 is connected to the source portion S2 of the second transistor ST2, and the other side of the channel portion CH2 of the second transistor ST2 is connected to the drain portion D2 of the second transistor ST2.

The second gate electrode G22 of the second transistor ST2 is still another part of the scan write line GWL.

The first gate electrode G21 and the second gate electrode G22 of the second transistor ST2 may be electrically connected to each other through a hole penetrating the buffer layer 121 and the gate insulating layer 122.

The third transistor ST3 may include the third sub-transistor ST31 and the fourth sub-transistor ST32 connected in series.

The channel portion CH31 of the third sub-transistor ST31 overlaps the first gate electrode G311 and the second gate electrode G312 of the third sub-transistor ST31.

One side of the channel portion CH31 of the third sub-transistor ST31 is connected to the source portion S31 of the third sub-transistor ST31, and the other side of the channel portion CH31 of the third sub-transistor ST31 is connected to the drain portion D31 of the third sub-transistor ST31.

The second gate electrode G312 of the third sub-transistor ST31 is part of the scan initialization line GIL.

The first gate electrode G311 and the second gate electrode G312 of the third sub-transistor ST31 may be electrically connected to each other through a hole penetrating the buffer layer 121 and the gate insulating layer 122.

The drain portion D31 of the third sub-transistor ST31 is connected to the source portion S32 of the fourth sub-transistor ST32.

The channel portion CH32 of the fourth sub-transistor ST32 overlaps the first gate electrode G321 and the second gate electrode G322 of the fourth sub-transistor ST32.

One side of the channel portion CH32 of the fourth sub-transistor ST32 is connected to the source portion S32 of the fourth sub-transistor ST32, and the other side of the channel portion CH32 of the fourth sub-transistor ST32 is connected to the drain portion D32 of the fourth sub-transistor ST32.

The second gate electrode G322 of the fourth sub-transistor ST32 is another part of the scan initialization line GIL.

The first gate electrode G321 and the second gate electrode G322 of the fourth sub-transistor ST32 may be electrically connected to each other through a hole penetrating the buffer layer 121 and the gate insulating layer 122.

The fourth transistor ST4 may include the fifth sub-transistor ST41 and the sixth sub-transistor ST42 connected in series.

The channel portion CH41 of the fifth sub-transistor ST41 overlaps the first gate electrode G411 and the second gate electrode G412 of the fifth sub-transistor ST41.

One side of the channel portion CH41 of the fifth sub-transistor ST41 is connected to the source portion S41 of the fifth sub-transistor ST41, and the other side of the channel portion CH41 of the fifth sub-transistor ST41 is connected to the drain portion D41 of the fifth sub-transistor ST41.

The second gate electrode G412 of the fifth sub-transistor ST41 is part of the gate control line GCL.

The first gate electrode G411 and the second gate electrode G412 of the fifth sub-transistor ST41 may be electrically connected to each other through a hole penetrating the buffer layer 121 and the gate insulating layer 122.

The drain portion D41 of the fifth sub-transistor ST41 is connected to the source portion S42 of the sixth sub-transistor ST42.

The channel portion CH42 of the sixth sub-transistor ST42 overlaps the first gate electrode G421 and the second gate electrode G422 of the sixth sub-transistor ST42.

One side of the channel portion CH42 of the sixth sub-transistor ST42 is connected to the source portion S42 of the sixth sub-transistor ST42, and the other side of the channel portion CH42 of the sixth sub-transistor ST42 is connected to the drain portion D42 of the sixth sub-transistor ST42.

The second gate electrode G422 of the sixth sub-transistor ST42 is another part of the gate control line GCL.

The first gate electrode G421 and the second gate electrode G422 of the sixth sub-transistor ST42 may be electrically connected to each other through a hole penetrating the buffer layer 121 and the gate insulating layer 122.

The drain portion D42 of the sixth sub-transistor ST42 is connected to the drain portion D6 of the sixth transistor ST6.

The channel portion CH5 of the fifth transistor ST5 overlaps the first gate electrode GM and the second gate electrode G52 of the fifth transistor ST5.

One side of the channel portion CH5 of the fifth transistor ST5 is connected to the source portion S5 of the fifth transistor ST5, and the other side of the channel portion CH5 of the fifth transistor ST5 is connected to the drain portion D5 of the fifth transistor ST5. The second gate electrode G52 of the fifth transistor ST5 is a part of the emission control line ECL.

The first gate electrode G51 and the second gate electrode G52 of the fifth transistor ST5 may be electrically connected to each other through a hole penetrating the buffer layer 121 and the gate insulating layer 122.

The channel portion CH6 of the sixth transistor ST6 overlaps the first gate electrode G61 and the second gate electrode G62 of the sixth transistor ST6.

One side of the channel portion CH6 of the sixth transistor ST6 is connected to the source portion S6 of the sixth transistor ST6, and the other side of the channel portion CH6 of the sixth transistor ST6 is connected to the drain portion D6 of the sixth transistor ST6.

The second gate electrode G62 of the sixth transistor ST6 is a part of the emission control line ECL.

The first gate electrode G61 and the second gate electrode G62 of the sixth transistor ST6 may be electrically connected to each other through a hole penetrating the buffer layer 121 and the gate insulating layer 122.

Referring to FIG. 7, the third conductive layer CDL3 may include the first power auxiliary line VDAL and a second capacitor electrode CAE2.

The first power auxiliary line VDAL extends in the first direction DR1.

The first power auxiliary line VDAL may overlap the second gate electrode GDT2 of the driving transistor DT.

The first power auxiliary line VDAL may be electrically connected to the first capacitor electrode CAE1 through a contact hole penetrating the inter-insulating layer 123. Accordingly, the first capacitor PC1 may be provided due to an overlapping area between the first capacitor electrode CAE1 and the first gate electrode GDT1 of the driving transistor DT.

The second capacitor electrode CAE may overlap a contact point among the drain portion D11 of the first sub-transistor ST11, the source portion S12 of the second sub-transistor ST12, the drain portion D31 of the third sub-transistor ST31, and the source portion S32 of the fourth sub-transistor ST32 in the semiconductor layer SEL.

The third conductive layer CDL3 may be formed as a single layer or multiple layers including any one of molybdenum (Mo), aluminum (Al), chromium (Cr), gold (Au), titanium (Ti), nickel (Ni), neodymium (Nd) and copper (Cu) or any alloys thereof.

Referring to FIG. 8, the fourth conductive layer CDL4 includes the data line DL and the first power line VDL.

The data line DL may be electrically connected to the source portion S2 of the second transistor ST2 through a contact hole penetrating the first planarization layer 124, the inter-insulating layer 123, and the gate insulating layer 122.

The first power line VDL may be electrically connected to the first power auxiliary line VDAL through a contact hole penetrating the first planarization layer 124.

The first power line VDL may be electrically connected to the source portion S5 of the fifth transistor ST5 through a contact hole penetrating the first planarization layer 124, the inter-insulating layer 123, and the gate insulating layer 122.

The first power line VDL may be electrically connected to the second capacitor electrode CAE2 through a contact hole penetrating the first planarization layer 124. Accordingly, the second capacitor PC2 may be provided by an area in which the second capacitor electrode CAE2 overlaps a contact point among the drain portion D11 of the first sub-transistor ST11, the source portion S12 of the second sub-transistor ST12, the drain portion D31 of the third sub-transistor ST31, and the source portion S32 of the fourth sub-transistor ST32 in the semiconductor layer SEL.

In addition, as illustrated in FIG. 5, the fourth conductive layer CDL4 may further include the second power line VSL.

In addition, as illustrated in FIG. 8, the fourth conductive layer CDL4 may further include a first connection electrode CCE1, a second connection electrode CCE2, a third connection electrode CCE3, and a fourth connection electrode CCE4.

The second gate electrode GDT2 of the driving transistor DT may be electrically connected to the drain portion D12 of the second sub-transistor ST12 and the source portion S31 of the third sub-transistor ST31 through the first connection electrode CCE1.

The drain portion D32 of the fourth sub-transistor ST32 may be electrically connected to the gate initialization voltage line VGIL through the second connection electrode CCE2.

The source portion S41 of the fifth sub-transistor ST41 may be electrically connected to the anode initialization voltage line VAIL through the third connection electrode CCE3.

The fourth connection electrode CCE4 may be electrically connected to a contact point between the drain portion D6 of the sixth transistor ST6 and the drain portion D42 of the sixth sub-transistor ST42 through a contact hole penetrating the first planarization layer 124, the inter-insulating layer 123, and the gate insulating layer 122.

Referring to FIG. 9, the display device 100 in the illustrated embodiment includes the substrate 110, the circuit layer 120 disposed on the substrate 110, the light-emitting element layer 130 disposed on the circuit layer 120, and the sealing layer 140 disposed on the light-emitting element layer 130.

The circuit layer 120 may include the buffer layer 121 covering the first conductive layer CDL1 (refer to FIG. 6, GDT1, G111, G121, G21, G311, G321, G411, G421, G51, and G61) on the substrate 110, the gate insulating layer 122 covering the semiconductor layer SEL (refer to FIG. 6, CHDT, CH11, CH12, CH2, CH31, CH32, CH41, CH42, CH5, CH6, SDT, S11, S12, S2, S31, S32, S41, S42, S5, S6, DDT, D11, D12, D2, D31, D32, D41, D42, D5, and D6) on the buffer layer 121, the inter-insulating layer 123 covering the second conductive layer CDL2 (refer to FIG. 6, GIL, GWL, ECL, GCL, VGIL, VAIL, GDT2, and CAE1) on the gate insulating layer 122, the first planarization layer 124 covering the third conductive layer CDL3 (refer to FIG. 7, VDAL and CAE2) on the inter-insulating layer 123, and the second planarization layer 125 covering the fourth conductive layer CDL4 (refer to FIG. 8, DL, VDL, VSL, CCE1, CCE2, CCE3, and CCE4) on the first planarization layer 124.

Each of the buffer layer 121, the gate insulating layer 122, and the inter-insulating layer 123 may include or consist of at least one inorganic layer. In an embodiment, each of the buffer layer 121, the gate insulating layer 122, and the inter-insulating layer 123 may include or consist of multiple layers in which one or more inorganic layers of a silicon nitride layer, a silicon oxynitride layer, a silicon oxide layer, a titanium oxide layer, and an aluminum oxide layer are alternately stacked, for example.

In an alternative embodiment, the inter-insulating layer 123 may include or consist of an organic layer such as acryl resin, epoxy resin, phenolic resin, polyamide resin, polyimide resin or the like.

Each of the first planarization layer 124 and the second planarization layer 125 may include or consist of an organic layer such as acryl resin, epoxy resin, phenolic resin, polyamide resin, polyimide resin or the like.

The light-emitting element layer 130 may be disposed on the second planarization layer 125 of the circuit layer 120.

The light-emitting element layer 130 includes the light-emitting elements LE respectively corresponding to the emission areas EA. Each of the light-emitting elements LE may include the pixel electrode 131 and the common electrode 136 facing each other, a first common layer 133 interposed between the pixel electrode 131 and the common electrode 136, a light-emitting layer 134, and a second common layer 135.

That is, the light-emitting element layer 130 includes the pixel electrode 131 corresponding to each of the emission areas EA, the pixel defining layer 132 corresponding to the non-emission area NEA around each of the emission areas EA and covering the edge of the pixel electrode 131, the first common layer 133 disposed on the pixel electrode 131, the light-emitting layer 134 disposed on the first common layer 133, the second common layer 135 disposed on the light-emitting layer 134, and the common electrode 136 disposed on the second common layer 135.

The second common layer 135 and the common electrode 136 extend to the non-emission area NEA. That is, the second common layer 135 and the common electrode 136 may be further disposed on at least a part of the pixel defining layer 132.

The pixel electrode 131 may be electrically connected to the fourth connection electrode CCE4 through a contact hole penetrating the second planarization layer 125.

As illustrated in FIG. 8, the fourth connection electrode CCE4 may be electrically connected to a contact point between the drain portion D6 of the sixth transistor ST6 and the drain portion D42 of the sixth sub-transistor ST42.

Accordingly, the pixel electrode 131 may be electrically connected to the drain portion D6 of the sixth transistor ST6 and the drain portion D42 of the sixth sub-transistor ST42 through the fourth connection electrode CCE4.

In the illustrated embodiment, the pixel electrode 131 may include two or more metal layers sequentially stacked.

That is, the pixel electrode 131 may include a first metal layer ML21 (refer to FIG. 11) and a second metal layer ML22 (refer to FIG. 11) on the first metal layer ML21. In an alternative embodiment, the pixel electrode 131 may further include a third metal layer ML3 (refer to FIG. 10) disposed under the first metal layer ML21, that is, between the first metal layer ML21 and the second planarization layer 125.

The first metal layer ML21 may include or consist of a relatively low resistance material. In addition, the first metal layer ML21 may have relatively high reflectivity. In an embodiment, the first metal layer ML21 may include or consist of one of low resistance metals such as aluminum (Al), copper (Cu), and an APC alloy, for example. The APC alloy is an alloy of silver (Ag), palladium (Pd) and copper (Cu).

Each of the second metal layer ML22 and the third metal layer ML23 serves to block diffusion of the material of the first metal layer ML21 to the surroundings. Each of the second metal layer ML22 and the third metal layer ML23 may include or consist of a metal having a relatively low etching rate compared to the first metal layer ML21. In addition, the second metal layer ML22 may have relatively high light transmittance. In an embodiment, each of the second metal layer ML22 and the third metal layer ML23 may include one of titanium (Ti), molybdenum (Mo), and indium tin oxide ("ITO"), for example.

In an embodiment, the pixel electrode 131 may have one of a stacked structure (Ti/Al/Ti) of aluminum and titanium, a stacked structure (ITO/Al/ITO) of aluminum and ITO, a stacked structure (Ti/Al/ITO) of aluminum, titanium and ITO, and a stacked structure (ITO/APC/ITO) of APC alloy and ITO, for example.

The pixel electrode 131 and the pixel defining layer 132 may be disposed on the second planarization layer 125.

The pixel defining layer 132 may cover the edges of the pixel electrode 131.

The pixel defining layer 132 may include or consist of an organic layer such as acryl resin, epoxy resin, phenolic resin, polyamide resin, polyimide resin or the like.

The first common layer 133 may be disposed on the pixel electrode 131 of each of the emission areas EA.

The first common layer 133 may include a hole transport layer including an organic material having a hole transport property. In an alternative embodiment, the first common layer 133 may further include a hole injection layer disposed between the pixel electrode 131 and the hole transport layer and including an organic material having a hole injecting property.

The light-emitting layer 134 may include or consist of an organic light-emitting material that converts electron-hole pairs into light.

The organic light-emitting material may include a host material and a dopant. The dopant may include a phosphorescent material or a fluorescent material.

In an embodiment, the light-emitting layer 134 of the first emission area EA1 emitting the first color may include a host material including carbazole biphenyl ("CBP") or 1,3-bis (carbazol-9-yl) ("mCP"), for example.

Further, the dopant of the light-emitting layer 134 of the first emission area EA1 may be selected as any one or more phosphorescent materials selected among bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), or a florescent material including PBD: Eu(DBM)3(Phen) or perylene.

The light-emitting layer 134 of the second emission area EA2 emitting the second color having a wavelength band lower than that of the first color may include a host material including CBP or mCP.

Further, a phosphorescent material including fac tris(2-phenylpyridine)iridium (Ir(ppy)3), or a fluorescent material including tris(8-hydroxyquinolino)aluminum (Alq3) may be selected as the dopant of the light-emitting layer 134 of the second emission area EA2.

The light-emitting layer 134 of the third emission area EA3 emitting the third color having a wavelength band lower than that of the second color may include a host material including CBP or mCP.

A phosphorescent material including (4,6-F2ppy)2Irpic or L2BD111 may be selected as the dopant of the light-emitting layer 134 of the third emission area EA3. The description of the organic light-emitting material of the light-emitting layer 134 is only an example, and the material of the light-emitting layer 134 in an embodiment is not limited to the above description.

In the illustrated embodiment, the second common layer 135 may correspond to an entirety of the emission areas EA. That is, the second common layer 135 may correspond to the display area DA and may be disposed on the light-emitting layers 134 and the pixel defining layer 132 of the emission areas EA.

The second common layer 135 may include an electron transport layer including an organic material having an electron transport property. In an alternative embodiment, the second common layer 135 may further include an electron injection layer disposed between the electron transport layer and the common electrode 136 and including an organic material having an electron injecting property.

In the illustrated embodiment, the common electrode 136 may be disposed on the second common layer 135 and may correspond to an entirety of the emission areas EA. That is, the common electrode 136 may correspond to the display area DA.

The common electrode 136 may include a transparent conductive material ("TCO") such as ITO or IZO that may transmit light or a semi-transmissive conductive material such as magnesium (Mg), silver (Ag), or an alloy of Mg and Ag. When the common electrode 136 includes or consists of a semi-transmissive conductive material, an improvement in light output efficiency due to a micro cavity effect may be expected.

The sealing layer 140 is disposed on the light-emitting element layer 130 to seal the light-emitting element layer 130.

The sealing layer 140 may include a first inorganic layer 141, an organic layer 142, and a second inorganic layer 143 sequentially stacked on the light-emitting element layer 130.

The first inorganic layer 141 and the second inorganic layer 143 may each include or consist of an inorganic insulating material. In an embodiment, each of the first inorganic layer 141 and the second inorganic layer 143 may have a structure in which one or more inorganic layers of a silicon nitride layer, a silicon oxynitride layer, a silicon oxide layer, a titanium oxide layer, and an aluminum oxide layer are stacked, for example.

The first inorganic layer 141 and the second inorganic layer 143 may contact each other in the non-display area NDA. Accordingly, a sealing structure for preventing the penetration of oxygen or moisture may be provided by bonding the first inorganic layer 141 and the second inorganic layer 143.

The organic layer 142 is disposed between the first inorganic layer 141 and the second inorganic layer 143. The organic layer 142 may include or consist of an organic layer such as acryl resin, epoxy resin, phenolic resin, polyamide resin, polyimide resin or the like.

In this way, the damage to the light-emitting element layer 130 by foreign substances such as dust or the like may be prevented by the organic layer 142 disposed relatively thickly and including an organic insulating material.

The display device 100 in the illustrated embodiment includes the auxiliary electrode ASE to lower the resistance of the common electrode 136. The auxiliary electrode ASE may be disposed in at least a part of the non-emission area NEA.

Figure 10:
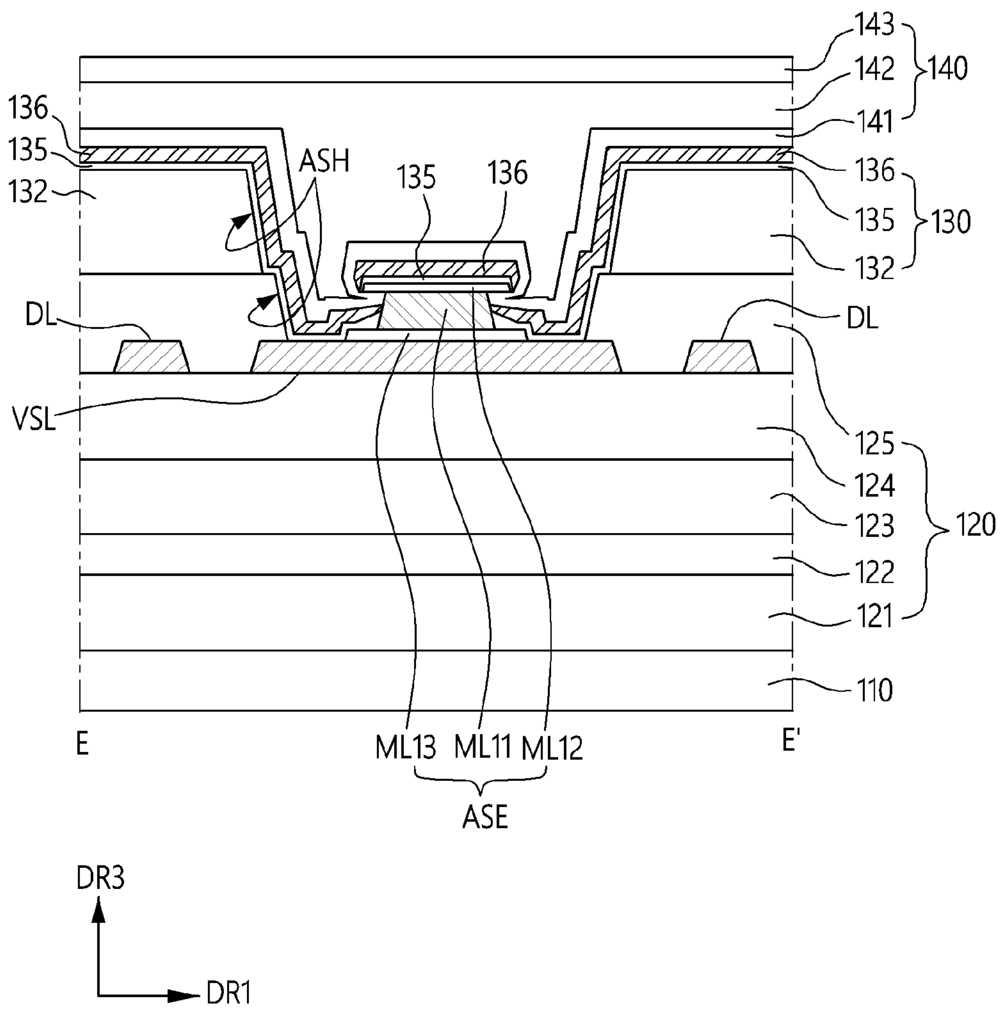
FIG. 10 is a cross-sectional view taken along line E-E' of the embodiment of FIG. 5.
Figure 11:
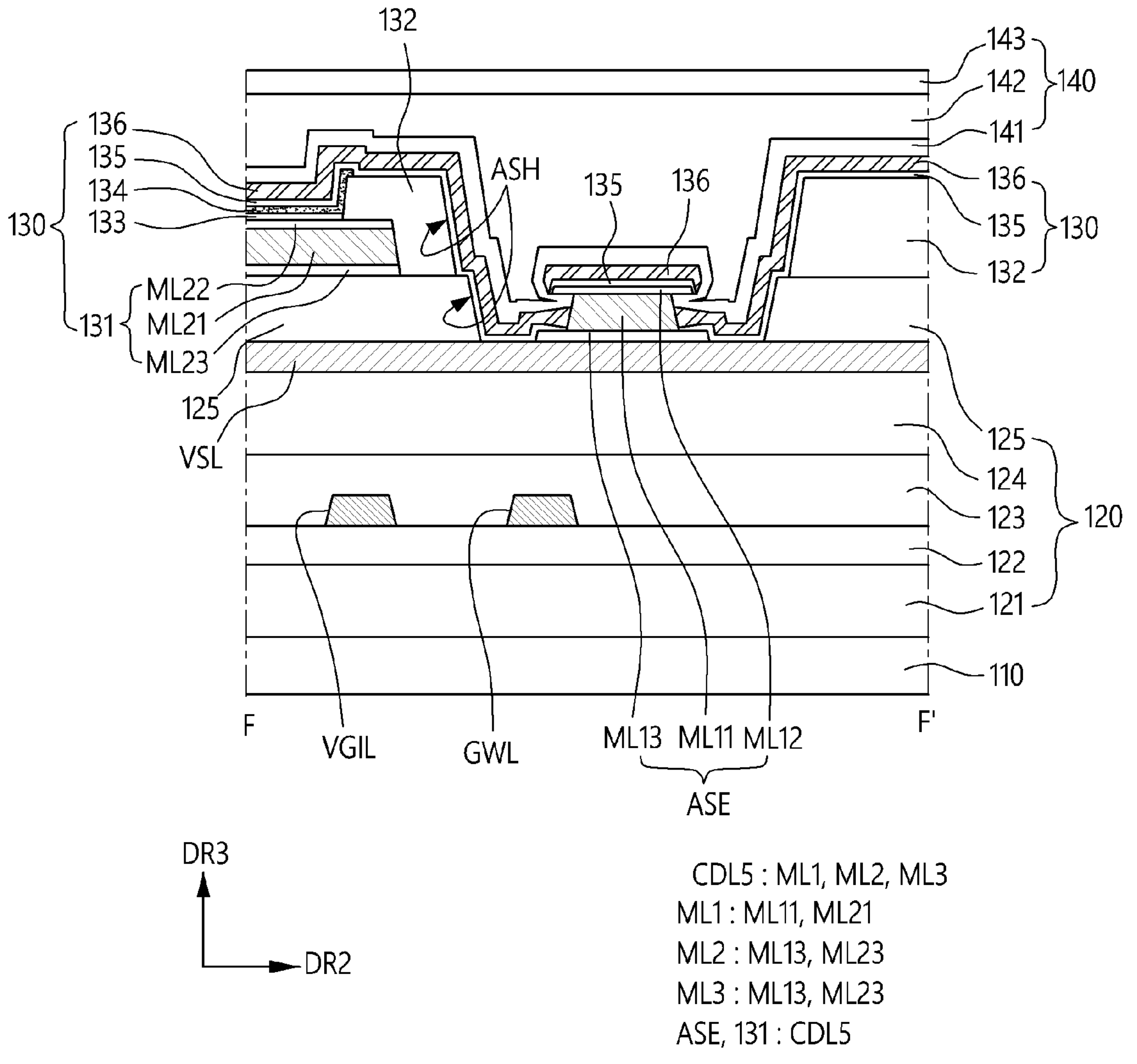
FIG. 11 is a cross-sectional view taken along line F-F' of the embodiment of FIG. 5.

FIG. 10 is a cross-sectional view taken along line E-E' of FIG. 5 in the illustrated embodiment. FIG. 11 is a cross-sectional view taken along line F-F' of FIG. 5 in the illustrated embodiment.

Referring to FIGS. 10 and 11, the auxiliary electrode ASE of the display device 100 in the illustrated embodiment may include or consist of the same layer as the pixel electrode 131.

That is, the fifth conductive layer CDL5 disposed on the second planarization layer 125 and including the metal layers ML1, ML2, and ML3 may include the auxiliary electrode ASE and the pixel electrode 131.

The fifth conductive layer CDL5 may include a first metal layer ML1 and a second metal layer ML2 sequentially stacked.

In the fifth conductive layer CDL5, the first metal layer ML1 has a lower resistance than that of the second metal layer ML2. In an embodiment, the first metal layer ML1 may include one of low-resistance metals such as aluminum (Al), copper (Cu), and an APC alloy. The second metal layer ML2 may include one of titanium (Ti), molybdenum (Mo), and ITO.

In an alternative embodiment, the fifth conductive layer CDL5 may further include the third metal layer ML3 disposed under the first metal layer ML1, for example. The third metal layer ML3 may include one of titanium (Ti), molybdenum (Mo), and ITO.

As the auxiliary electrode ASE includes or consists of the fifth conductive layer CDL5, the auxiliary electrode ASE may include a first metal layer ML11 and a second metal layer ML12 disposed on the first metal layer ML11. In the auxiliary electrodes ASE, the second metal layer ML12 has an edge protruding beyond the first metal layer ML11, so that the auxiliary electrode ASE has an undercut structure.

That is, by etching the first metal layer ML11 of the auxiliary electrode ASE in a state in which the side surface of the auxiliary electrode ASE is exposed through the auxiliary hole ASH, the edge of the second metal layer ML12 may protrude beyond the first metal layer ML11. Accordingly, the auxiliary electrode ASE may have an undercut structure.

As the second common layer 135 and the common electrode 136 extend to the non-emission area NEA, the second common layer 135 and the common electrode 136 may be further disposed on the pixel defining layer 132, and may contact the side surface of the auxiliary electrode ASE exposed through the auxiliary hole ASH.

That is, the side surface of the auxiliary electrode ASE includes a first side surface portion BDP1 (refer to FIGS. 20, 22, 25, 27, 30, and 32) in contact with the second common layer 135 and a second side surface portion BDP2 (refer to FIGS. 20, 22, 25, 27, 30, and 32) in contact with the common electrode 136.

The common electrode 136 may be electrically connected to the auxiliary electrode ASE by the second side surface portion BDP2.

In the illustrated embodiment, the auxiliary electrode ASE includes the first side SI1 and the second side SI2 that face each other in the first direction DR1, and the third side SI3 and the fourth side SI4 that face each other in the second direction DR2.

Further, the width of the first side surface portion BDP1 in the first side SI1 and the second side SI2 in the first direction DR1 is different from the width of the first side surface portion BDP1 in the third side SI3 and the fourth side SI4 in the second direction DR2.

That is, while the first side surface portion BDP1 has relatively large widths in the first side SI1 and the second side SI2 in the first direction DR1, the first side surface portion BDP1 may have relatively small widths in the third side SI3 and the fourth side SI4 in the second direction DR2.

That is, as illustrated in FIG. 10, at first points of the first side SI1 and the second side SI2 facing in the first direction DR1, the first bonding portion BDP1 in contact with the second common layer 135 among side surfaces of the second auxiliary electrode ASE may have a relatively large width.

As illustrated in FIG. 11, at the second points of the third side S13 and the fourth side SI4 facing in the second direction DR2, the first bonding portion BDP1 in contact with the second common layer 135 among side surfaces of the second auxiliary electrode ASE may have a relatively large width.

In an alternative embodiment, although not separately illustrated, while the first side surface portion BDP1 has relatively small widths in the first side SI1 and the second side SI2 in the first direction DR1, the first side surface portion BDP1 may have relatively large widths in the third side SI3 and the fourth side SI4 in the second direction DR2.

As described above, in the illustrated embodiment, the first side surface portion BDP1 is disposed with a relatively small width on some of the four sides SI1, SI2, SI3, and SI4 of the auxiliary electrode ASE, so that a width of the second side surface portion BDP2 may relatively increase. As a result, reliability of the electrical connection between the auxiliary electrode ASE and the common electrode 136 may increase.

In the illustrated embodiment, in order to provide the first side surface portion BDP1 that is disposed with a relatively small width on some of the four sides SI1, SI2, SI3, and SI4 of the auxiliary electrode ASE and is disposed with a relatively large width on the other remaining portion, the disposition process of the second common layer 135 may be performed using an angle limiting plate and a linear deposition apparatus.

Figure 12:
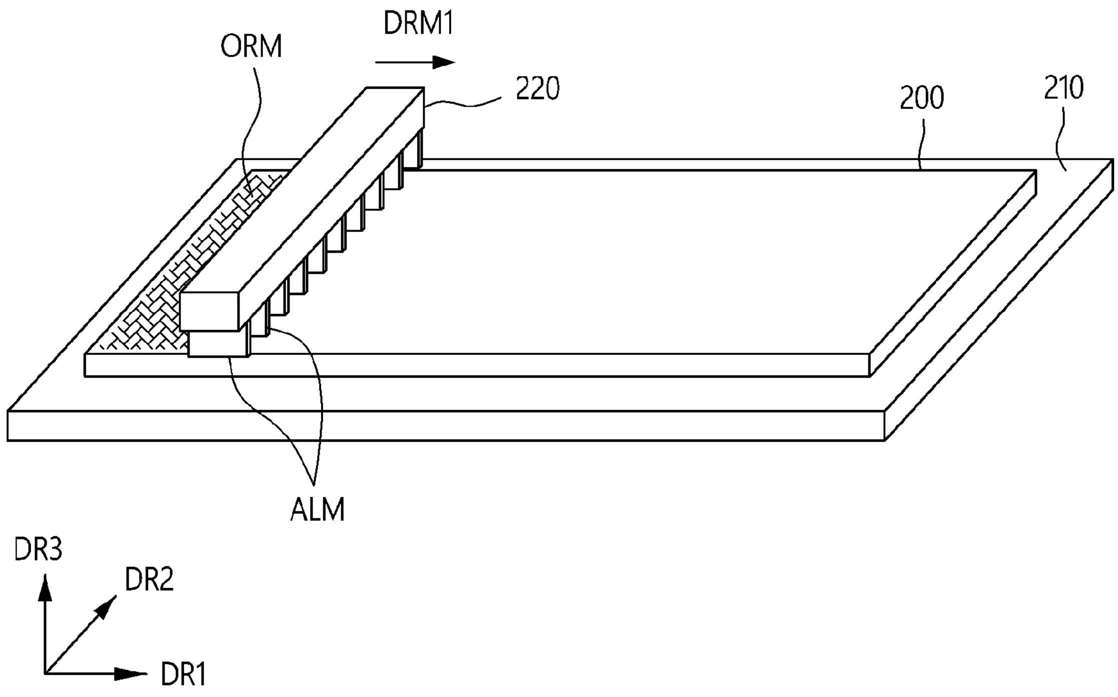
FIG. 12 is a process diagram illustrating a disposition process of the second common layer.
Figure 13:
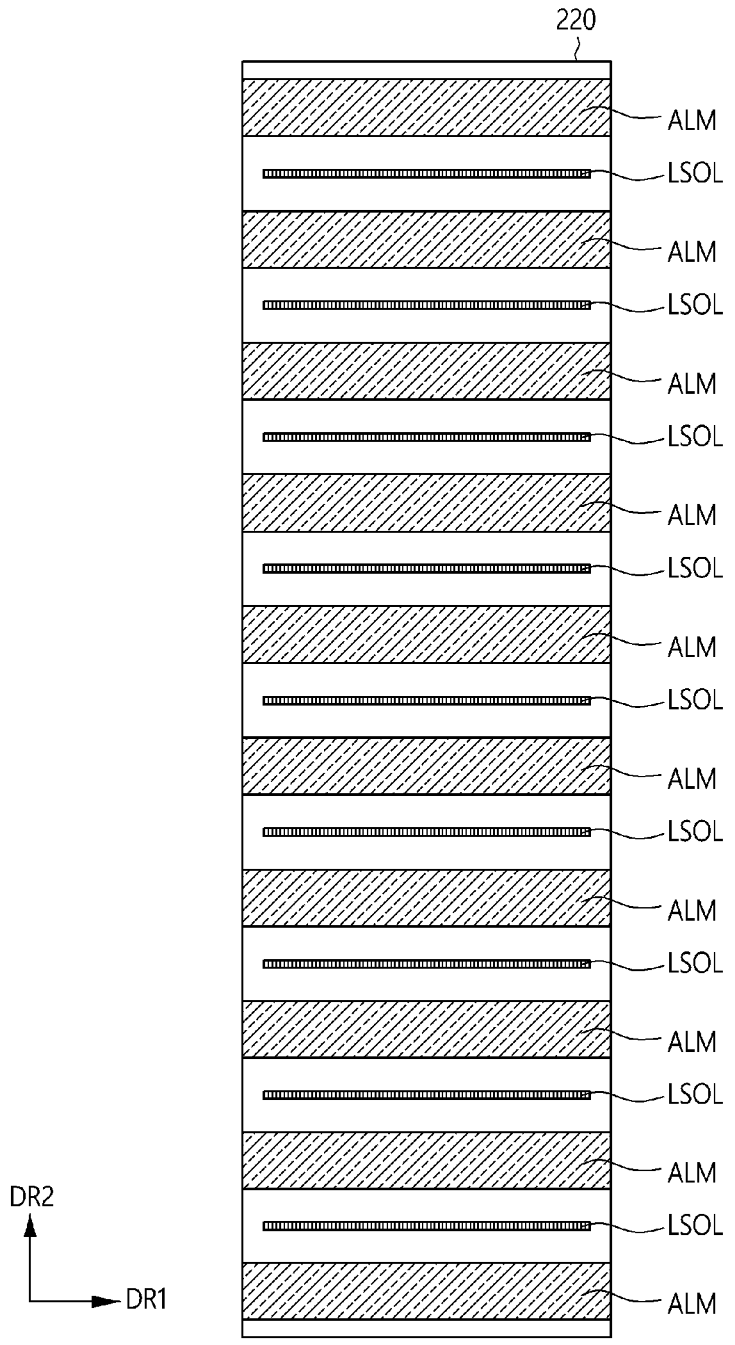
FIG. 13 is a plan view illustrating an ejection surface of the deposition apparatus of FIG. 12.
Figure 14:
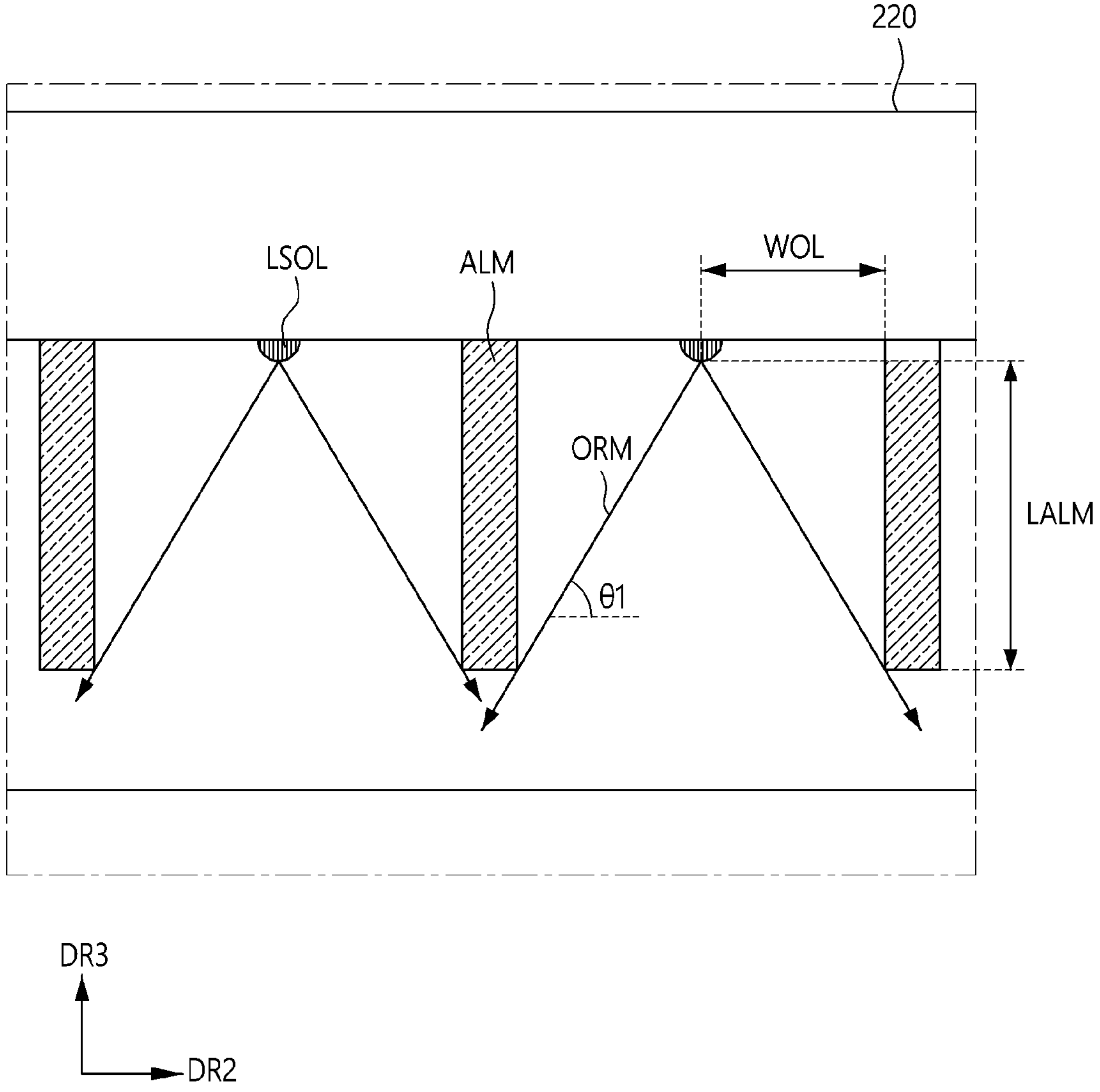
FIG. 14 is a cross-sectional view illustrating an incident angle of a second common layer material during the process of FIG. 12.
Figure 16:
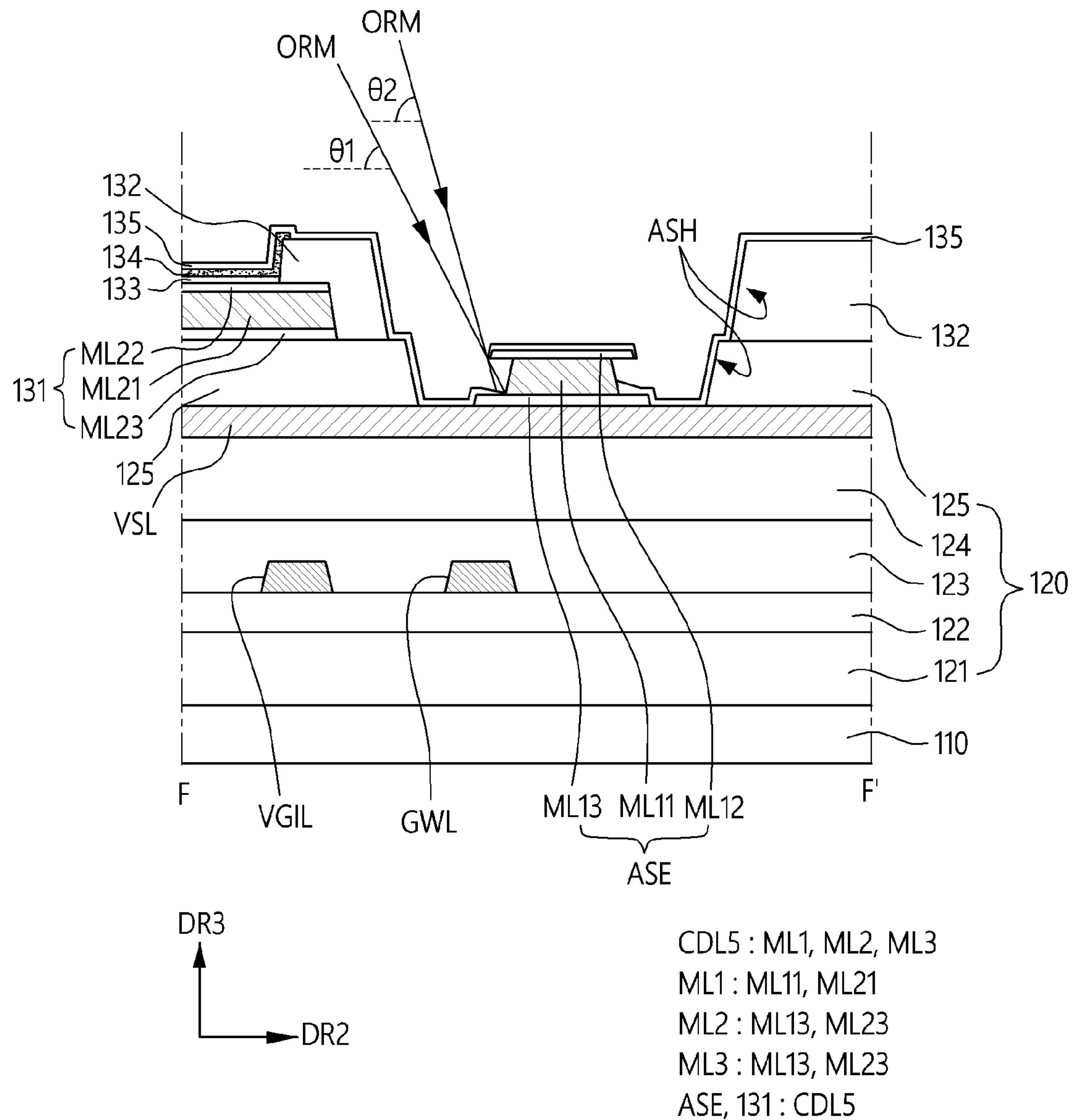
FIG. 16 is a cross-sectional view illustrating a side surface of an auxiliary electrode and a second common layer in an arrangement direction of the angle limiting plates of FIG. 12.

FIG. 12 is a process diagram illustrating a disposition process of the second common layer in the illustrated embodiment. FIG. 13 is a plan view illustrating an ejection surface of the deposition apparatus of FIG. 12. FIG. 14 is a cross-sectional view illustrating an incident angle of a second common layer material during the process of FIG. 12. FIG. is a cross-sectional view illustrating a side surface of an auxiliary electrode and a second common layer in a moving direction of the deposition apparatus of FIG. 12. FIG. 16 is a cross-sectional view illustrating a side surface of an auxiliary electrode and a second common layer in an arrangement direction of the angle limiting plates of FIG. 12.

Referring to FIG. 12, the process of disposing the second common layer 135 during the manufacturing process of the display device 100 in the illustrated embodiment may include a process of moving the linear deposition apparatus 220 that ejects an organic material ORM of the second common layer 135 on a mother substrate 200 in a first moving direction DRM1 in a state in which the mother substrate 200 on which the disposition of the light-emitting layer 134 is completed is disposed on the support module 210.

Referring to FIG. 13, the linear deposition apparatus 220 may include linear ejection ports LSOL arranged in one direction and the angle limiting plates ALM disposed on opposite sides of each of the linear ejection ports LSOL. The angle limiting plate ALM is for limiting the incident range of the material ejected from the linear ejection port LSOL within a predetermined angle.

As illustrated in FIG. 12, when the first moving direction DRM1 (the first direction DR1 in FIG. 12) of the linear deposition apparatus 220 is different from the arrangement direction (the second direction DR2 in FIG. 12) of the linear ejection ports LSOL and the angle limiting plates ALM of the linear deposition apparatus 220, the incident range of the organic material ORM is influenced by the angle limiting plate ALM in the first moving direction DRM1 of the linear deposition apparatus 220.

That is, referring to FIG. 14, in the second direction DR2 in which the angle limiting plates ALM are arranged, the incident range of the organic material ORM ejected from the linear ejection ports LSOL is limited to a first angle θ1 by the angle limiting plate ALM disposed on opposite sides of the linear ejection port LSOL.

Here, the first angle θ may correspond to a separation distance WOL between the linear ejection port LSOL and the angle limiting plate ALM and a length LALM of the angle limiting plate ALM.

Figure 15:
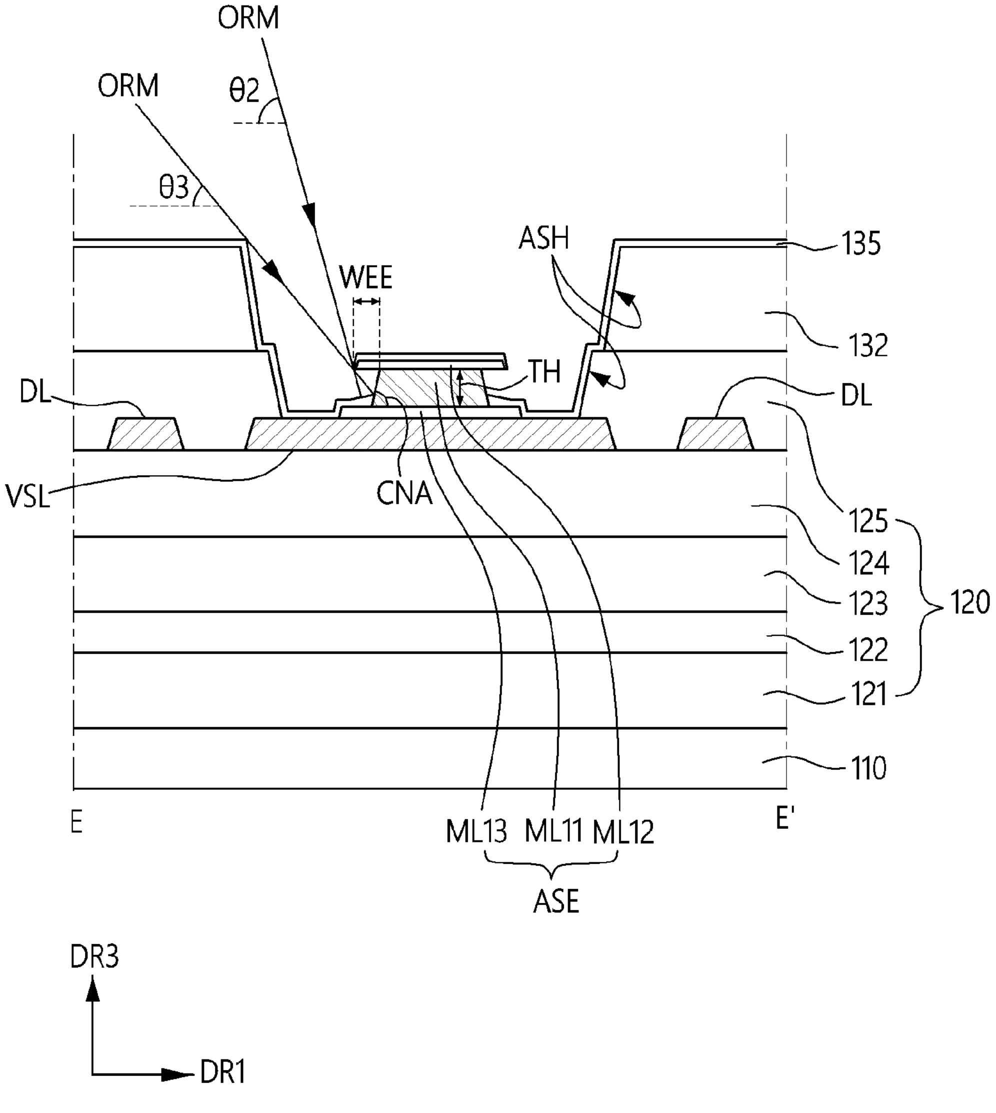
FIG. 15 is a cross-sectional view illustrating a side surface of an auxiliary electrode and a second common layer in a moving direction of the deposition apparatus of FIG. 12.

Referring to FIG. 15, in the first direction DR1, the incident range of the organic material ORM ejected from the linear ejection port LSOL may be limited to a second angle θ2 or less by the undercut structure of the auxiliary electrode ASE.

The second angle θ2 may correspond to a width WEE at which the edge of the second metal layer ML12 of the auxiliary electrode ASE protrudes beyond the first metal layer ML11, a slope CNA of the side surface of the first metal layer ML11, a thickness TH of the first metal layer ML11, or the like.

Further, in the first direction DR1 parallel to the first moving direction DRM1 of the linear deposition apparatus 220, the incident range of the organic material ORM ejected from the linear ejection port LSOL may be limited to a third angle θ3 or higher by the linear ejection port LSOL.

The third angle θ3 may correspond to an ejection range of the linear ejection port LSOL, a distance between the linear ejection port LSOL and the mother substrate 200, or the like.

That is, in the first direction DR1 parallel to the first moving direction DRM1 of the linear deposition apparatus 220, the incident range of the organic material ORM ejected from the linear ejection port LSOL is not influenced by the angle limiting plate ALM, so that the organic material ORM incident at the third angle θ3 smaller than the first angle θ1 may also reach the side surface of the auxiliary electrode ASE. Accordingly, the first bonding portion BDP1 in contact with the second common layer 135 among the side surfaces of the auxiliary electrode ASE may have a relatively large width at the first points of the first side SI1 and the second side SI2 of the auxiliary electrode ASE that face in the first direction DR1.

Referring to FIG. 16, even in the second direction DR2 in which the angle limiting plates ALM of the linear deposition apparatus 220 are arranged, the incident range of the organic material ORM ejected from the linear ejection port LSOL may be limited to the second angle θ2 or less by the undercut structure of the auxiliary electrode ASE.

In the second direction DR2 in which the angle limiting plates ALM of the linear deposition apparatus 220 are arranged, the incident range of the organic material ORM ejected from the linear ejection port LSOL is influenced by the angle limiting plates ALM, and thus may be limited to the first angle θ1 or higher that is greater than the third angle θ3. That is, in the second direction DR2 in which the angle limiting plates ALM of the linear deposition apparatus 220 are arranged, the incident range of the organic material ORM ejected from the linear ejection port LSOL is reduced due to the influence of the angle limiting plate ALM.

That is, in the second direction DR2 in which the angle limiting plates ALM of the linear deposition apparatus 220 are arranged, the incident range of the organic material ORM ejected from the linear ejection port LSOL is limited by the angle limiting plates ALM, so that only the organic material ORM incident at an angle greater than or equal to the first angle θ1 may reach the side surface of the auxiliary electrode ASE. Accordingly, the first bonding portion BDP1 in contact with the second common layer 135 among the side surfaces of the auxiliary electrode ASE may have a relatively small width at the second points of the third side SI3 and the fourth side SI4 of the auxiliary electrode ASE that face in the second direction DR2.

Accordingly, at the second points of the third side SI3 and the fourth side SI4 of the auxiliary electrode ASE, the width of the second bonding portion BDP2 in contact with the common electrode 136 among the side surfaces of the auxiliary electrode ASE may be increased.

Figure 17:
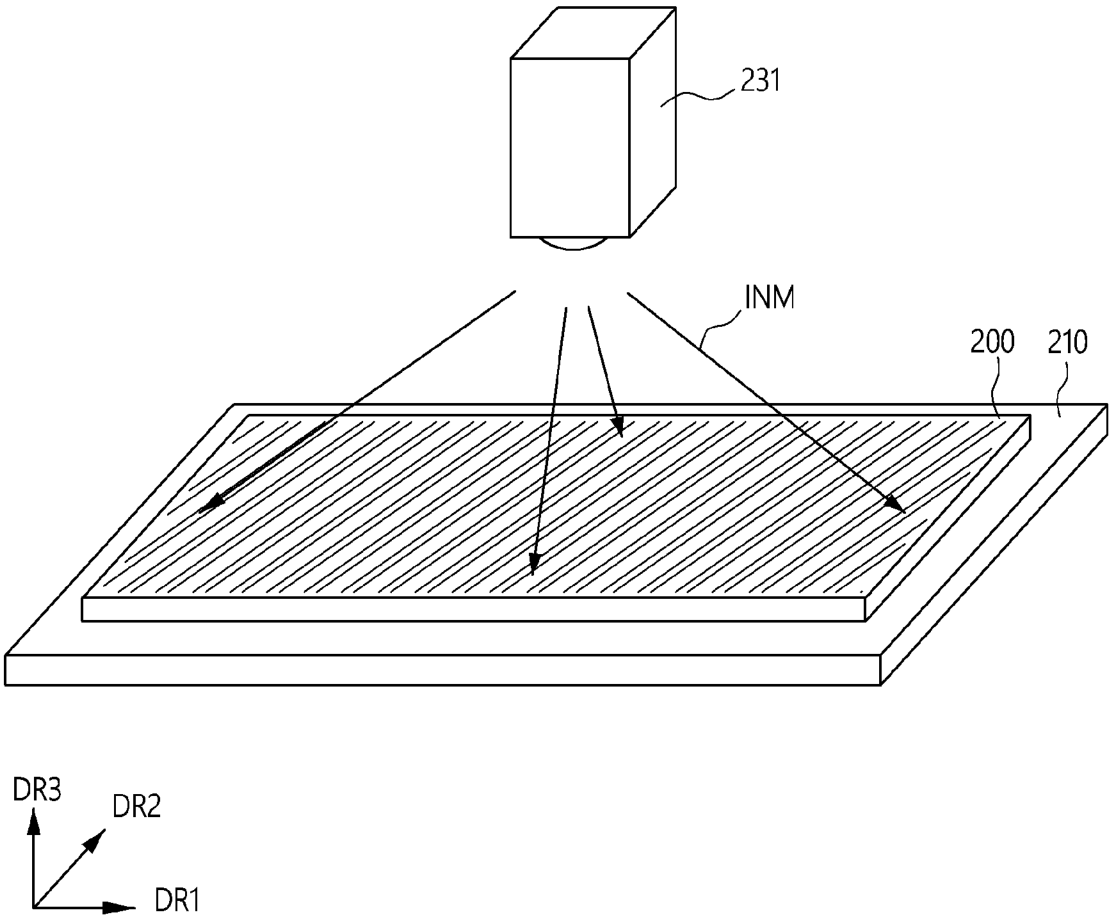
FIG. 17 is a process diagram illustrating an embodiment of a process of disposing a common electrode.
Figure 18:
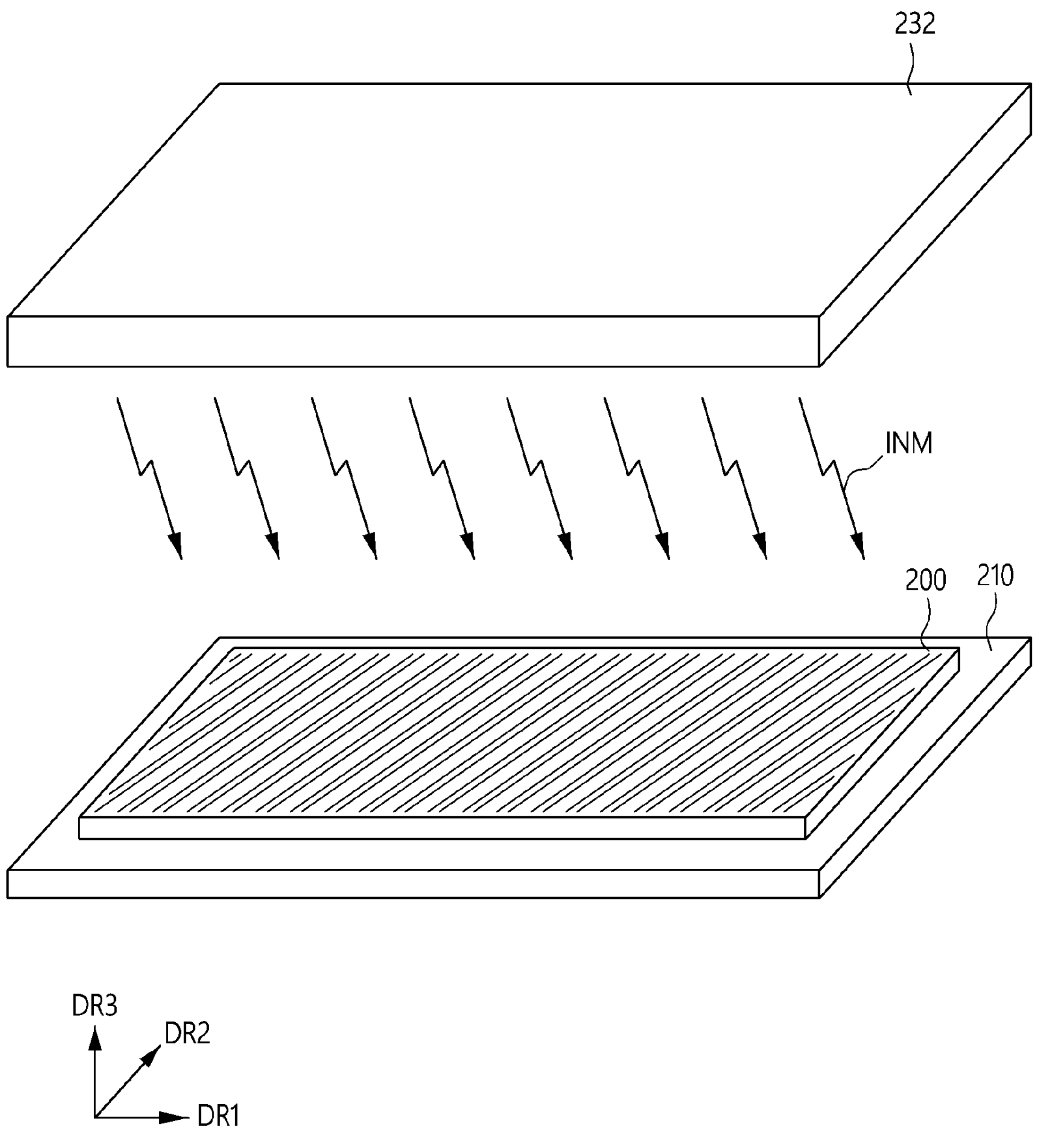
FIG. 18 is a process diagram illustrating another embodiment of a process of disposing the common electrode.
Figure 19:
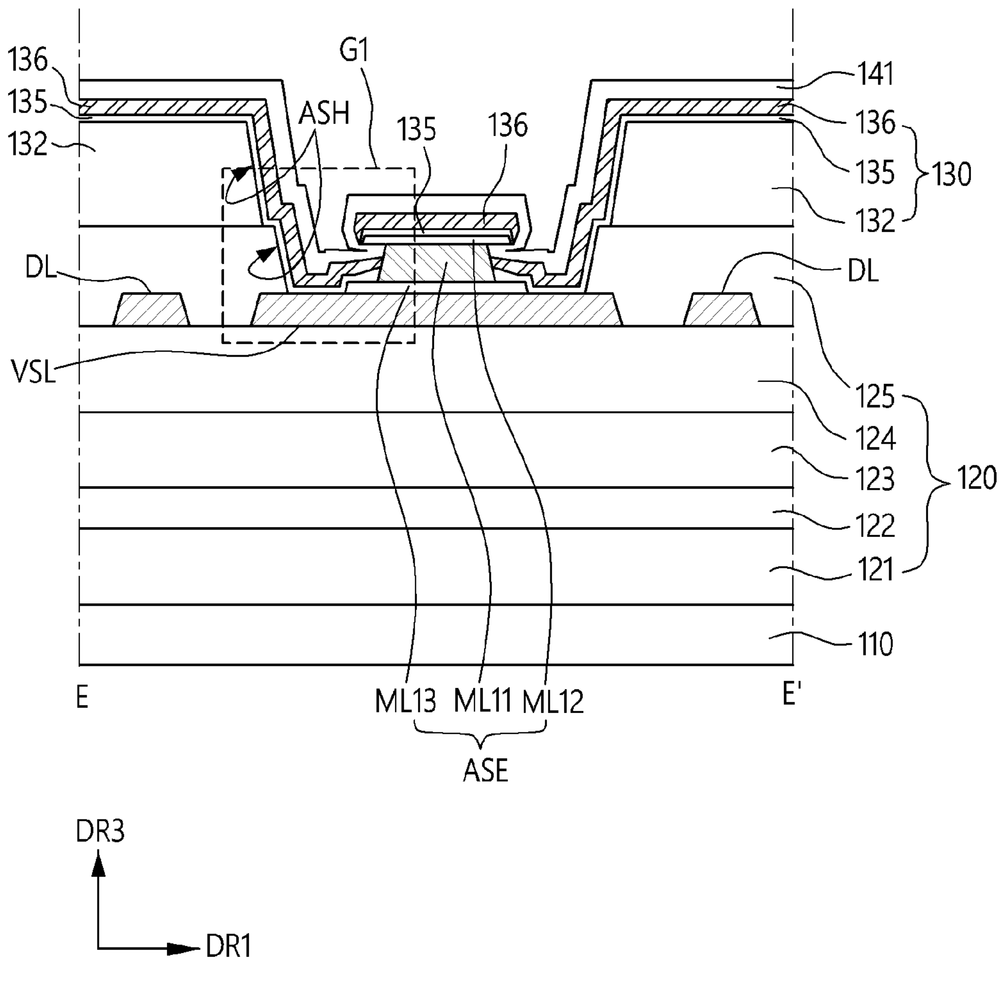
FIG. 19 is a cross-sectional view illustrating a side surface of an auxiliary electrode, a second common layer, and a common electrode in a display device manufactured by a process including the process of FIG. 16 or the process of FIG. 17 in the moving direction of the deposition apparatus of FIG. 12.
Figure 20:
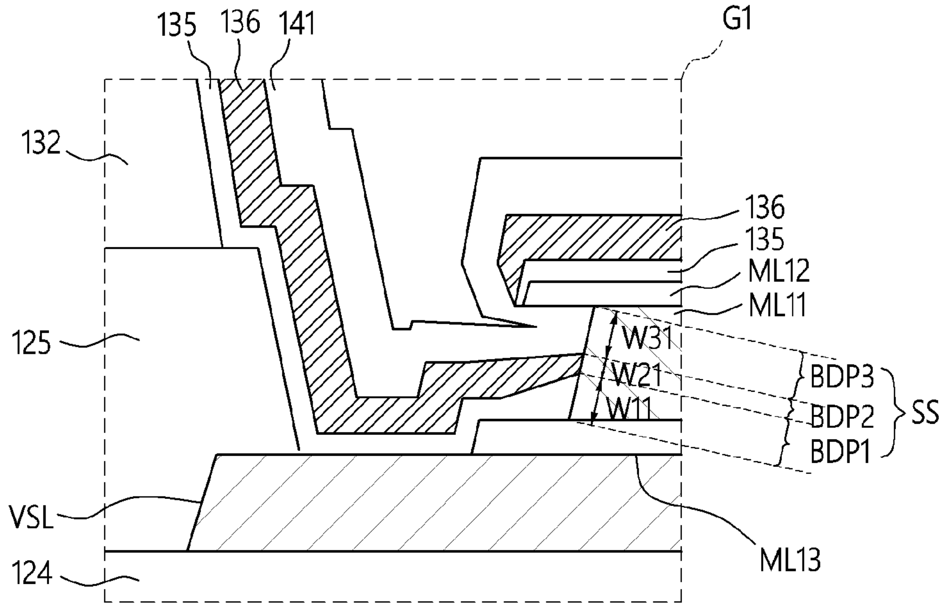
FIG. 20 is an enlarged view illustrating a portion G1 of FIG. 19.
Figure 21:
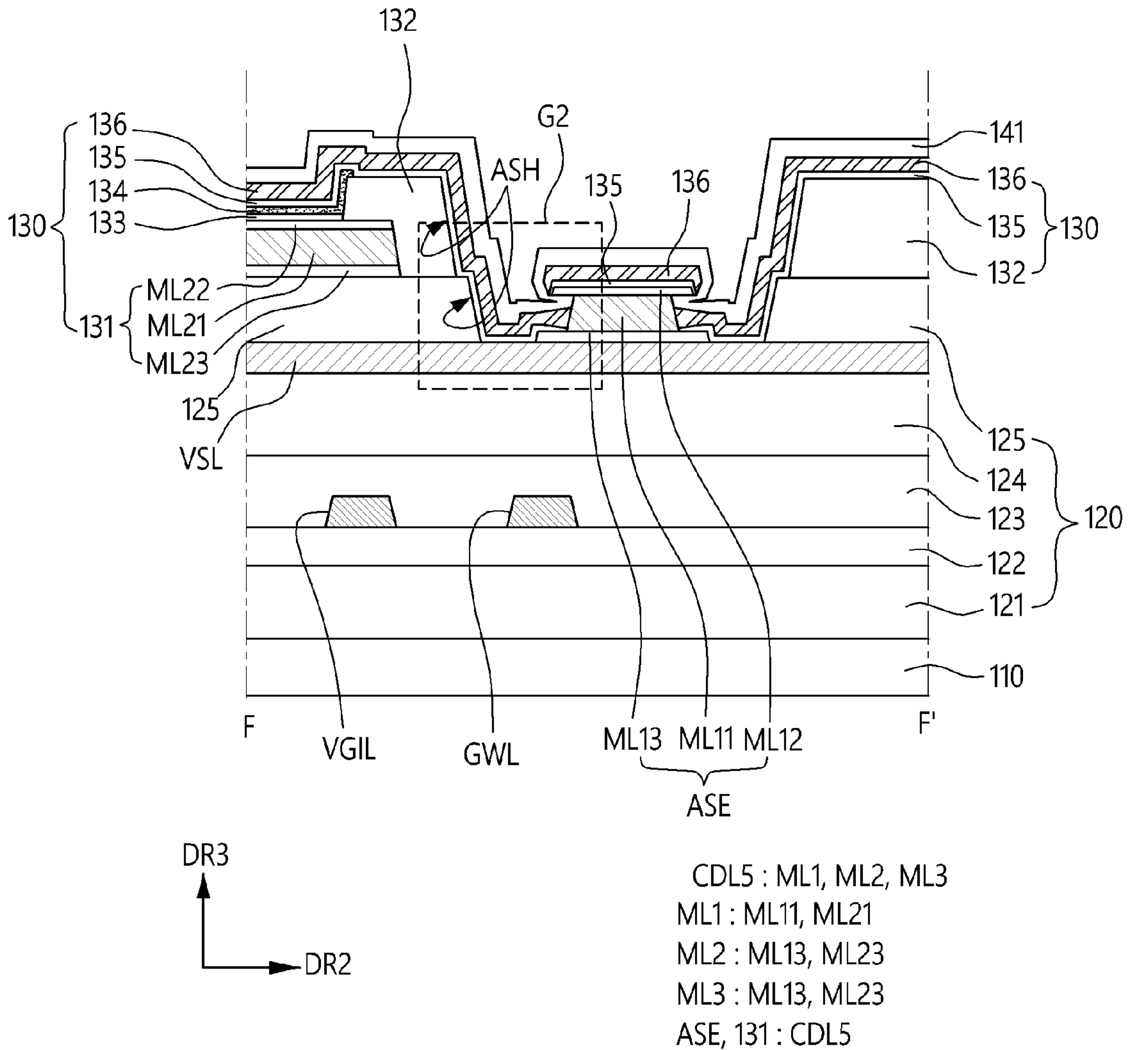
FIG. 21 is a cross-sectional view illustrating the side surface of the auxiliary electrode, the second common layer, and the common electrode in the display device manufactured by the process including the process of FIG. 16 or the process of FIG. 17 in the arrangement direction of the angle limiting plates of FIG. 12.
Figure 22:
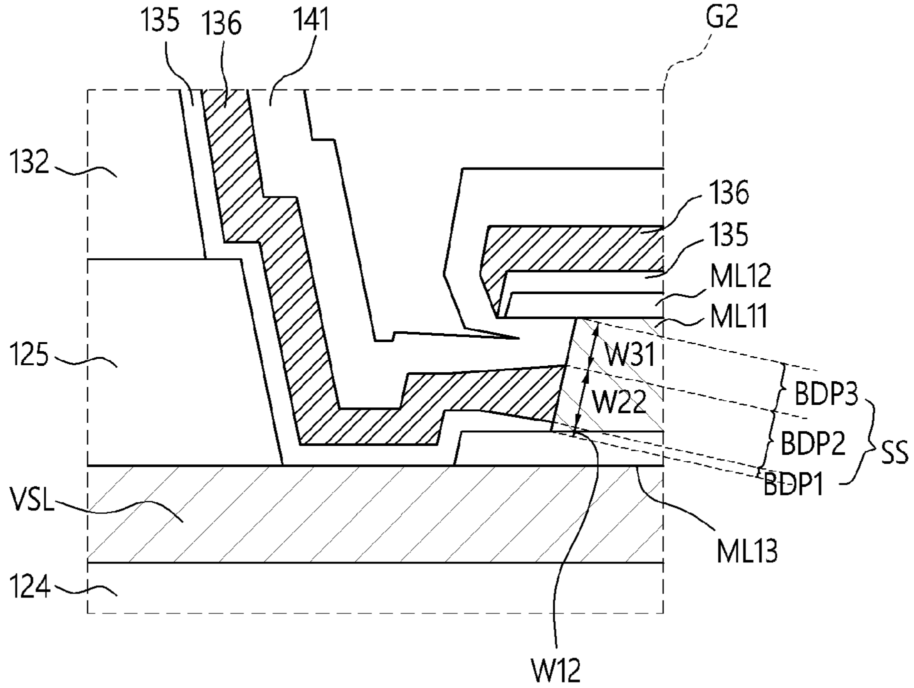
FIG. 22 is an enlarged view illustrating portion G2 of FIG. 21.

FIG. 17 is a process diagram illustrating an embodiment of a process of disposing a common electrode in the illustrated embodiment. FIG. 18 is a process diagram illustrating another embodiment of a process of disposing the common electrode in the illustrated embodiment. FIG. 19 is a cross-sectional view illustrating a side surface of an auxiliary electrode, a second common layer, and a common electrode in a display device manufactured by a process including the process of FIG. 16 or the process of FIG. 17 in the moving direction of the deposition apparatus of FIG. 12. FIG. 20 is an enlarged view illustrating a portion G1 of FIG. 19. FIG. 21 is a cross-sectional view illustrating the side surface of the auxiliary electrode, the second common layer, and the common electrode in the display device manufactured by the process including the process of FIG. 16 or the process of FIG. 17 in the arrangement direction of the angle limiting plates of FIG. 12. FIG. 22 is an enlarged view illustrating portion G2 of FIG. 21.

Referring to FIG. 17, the process of disposing the common electrode 136 during the manufacturing process of the display device 100 in the illustrated embodiment may include a process of ejecting an inorganic material INM of a common material to the mother substrate 200 by a circular deposition apparatus 231 including a point-shaped ejection port.

In an alternative embodiment, referring to FIG. 18, the process of disposing the common electrode 136 during the manufacturing process of the display device 100 in the illustrated embodiment may include a process of depositing the inorganic material INM of a common material on the mother substrate 200 by a sputtering apparatus 232.

Referring to FIGS. 19, 20, 21, and 22, after the process of disposing the common electrode 136, a side surface SS of the first metal layer ML11 of the auxiliary electrode ASE includes the first bonding portion BDP1 in contact with the second common layer 135 and the second bonding portion BDP2 in contact with the common electrode 136.

In addition, after the process of disposing the first inorganic layer 141 of the sealing layer 140, the side surface SS of the first metal layer ML11 of the auxiliary electrode ASE may further include a third bonding portion BDP3 in contact with the first inorganic layer 141. In this way, as the third bonding portion BDP3 in which the side surface of the auxiliary electrode ASE and the first inorganic layer 141 are bonded is provided, the sealing force of the sealing layer 140 may be improved.

As mentioned above, in the illustrated embodiment, during the process of disposing the second common layer 135, when the first moving direction DRM1 of the linear deposition apparatus 220 is different from the second direction DR2 in which the angle limiting plates ALM of the linear deposition apparatus 220 are arranged, the incident range of the organic material ORM ejected from the linear ejection port LSOL is not influenced by the angle limiting plate ALM in the first direction DR1 parallel to the first moving direction DRM1 of the linear deposition apparatus 220.

Accordingly, as illustrated in FIGS. 19 and 20, the first bonding portion BDP1 in contact with the second common layer 135 in the side surface SS of the first metal layer ML11 of the auxiliary electrode ASE has a relatively large first width W11 at the first point of the first side SI1 and the second side SI2 of the auxiliary electrode ASE corresponding to the first direction DR1.

In the second direction DR2 in which the angle limiting plates ALM of the linear deposition apparatus 220 are arranged, the incident range of the organic material ORM ejected from the linear ejection port LSOL is limited to the first angle θ1 or higher by the angle limiting plate ALM.

Accordingly, as illustrated in FIGS. 21 and 22, the first bonding portion BDP1 in contact with the second common layer 135 in the side surface SS of the first metal layer ML11 of the auxiliary electrode ASE has a second width W12 smaller than the first width W11 in the third side S13 and the fourth side S14 of the auxiliary electrode ASE corresponding to the second direction DR2.

In an embodiment, a difference between the first width W11 and the second width W12 may be greater than or equal to 0.1 nm, for example.

Further, in the illustrated embodiment, as the circular deposition apparatus 231 or the sputtering apparatus 232 is used for the disposition process of the common electrode 136, the incident range of the inorganic material INM of the common electrode 136 may be limited by the undercut structure of the auxiliary electrode ASE. Accordingly, a part of the side surface SS of the first metal layer ML11 of the auxiliary electrode ASE, which is covered by the undercut structure of the auxiliary electrode ASE, may be provided with the third bonding portion BDP3 in contact with the first inorganic layer 141.

In other words, the width of the side surface SS of the first metal layer ML11 of the auxiliary electrode ASE may be greater than the sum of the widths W11 and W12 of the first bonding portion BDP1 and the widths W21 and W22 of the second bonding portion BDP2.

Here, the width W31 of the third bonding portion BDP3 may correspond to the width WEE in which the edge of the second metal layer ML12 of the auxiliary electrode ASE protrudes beyond the first metal layer ML11, the thickness TH of the first metal layer ML11, or the like.

Accordingly, the widths W21 and W22 of the second bonding portion BDP2 in contact with the common electrode 136 in the side surface SS of the first metal layer ML11 of the auxiliary electrode ASE may be values obtained by subtracting the widths W11 and W12 of the first bonding portion BDP1 and the width W31 of the third bonding portion BDP3 from the width of the side surface SS of the first metal layer ML11.

In the illustrated embodiment, at the first point between the first side SI1 and the second side SI2 of the auxiliary electrode ASE corresponding to the first direction DR1, the first bonding portion BDP1 has the first width W11, so that the width W21 of the second bonding portion BDP2 may be a relatively small size due to the first width W11.

At the second point of the third side SI3 and the fourth side S14 of the auxiliary electrode ASE corresponding to the second direction DR2 in which the angle limiting plates ALM of the linear deposition apparatus 220 are arranged, the first bonding portion BDP1 has the second width W12 smaller than the first width W11. Accordingly, at the second point of the third side SI3 and the fourth side SI4 of the auxiliary electrode ASE, the second bonding portion BDP2 may have the relatively large width W22 by the first bonding portion BDP1 having the relatively small second width W12.

As described above, in the illustrated embodiment, a bonding width between the second common layer 135 and the auxiliary electrode ASE may be relatively small on some of the side surfaces of the auxiliary electrode ASE, so that a bonding width between the common electrode 136 and the auxiliary electrode ASE may be increased. That is, since a portion in which the common electrode 136 and the auxiliary electrode ASE are bonded to each other with a relatively large width may be provided, reliability of the electrical connection between the common electrode 136 and the auxiliary electrode ASE may be increased.

Figure 23:
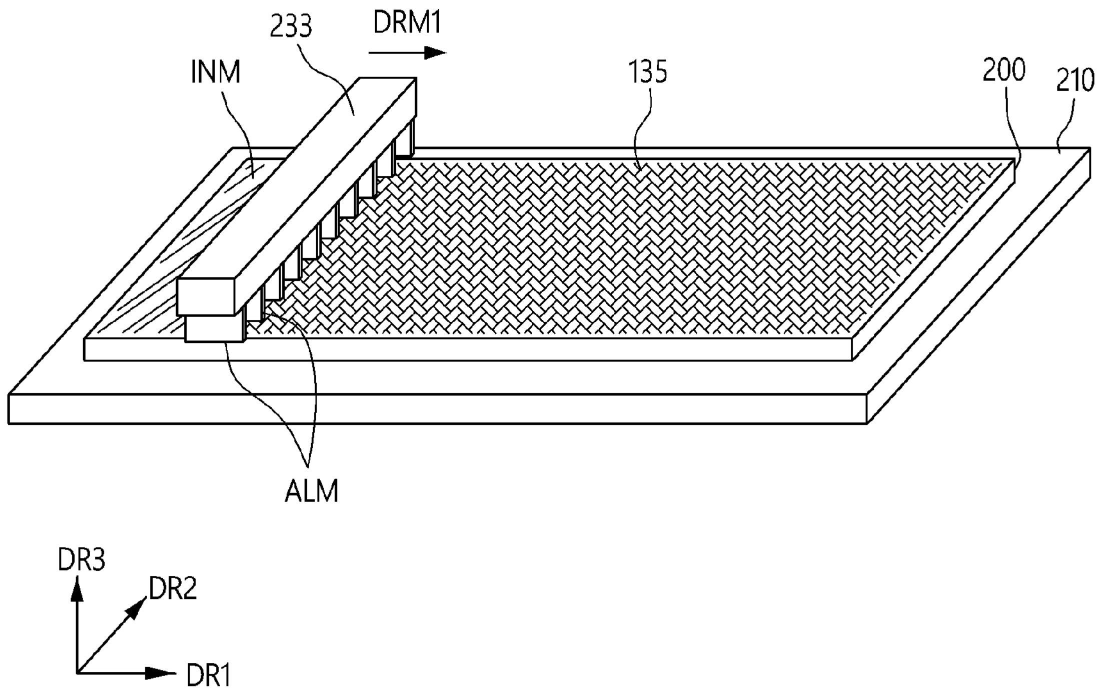
FIG. 23 is a process diagram illustrating an embodiment of a process of disposing a common electrode.
Figure 24:
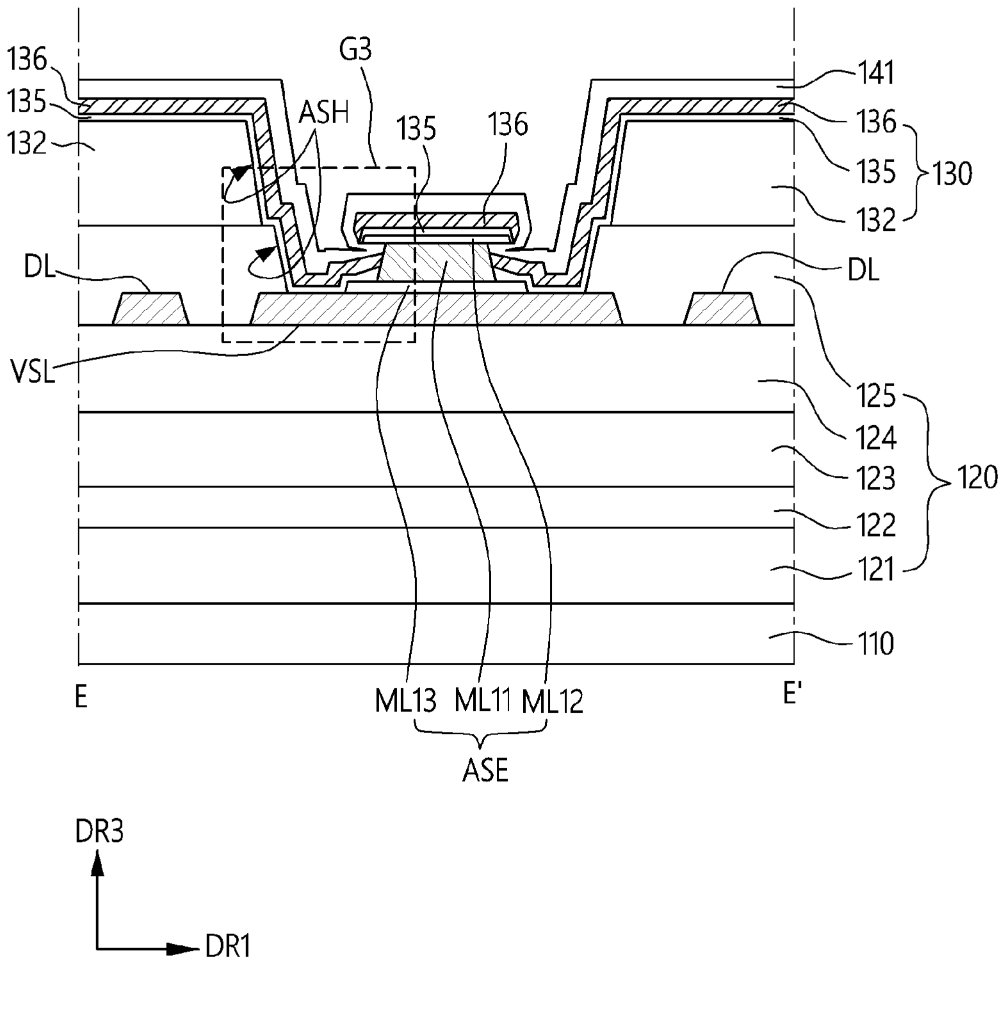
FIG. 24 is a cross-sectional view illustrating a side surface of an auxiliary electrode, a second common layer, and a common electrode in a display device manufactured by a process including the process of FIG. 23, in the moving direction of the deposition apparatus of FIG. 12.
Figure 25:
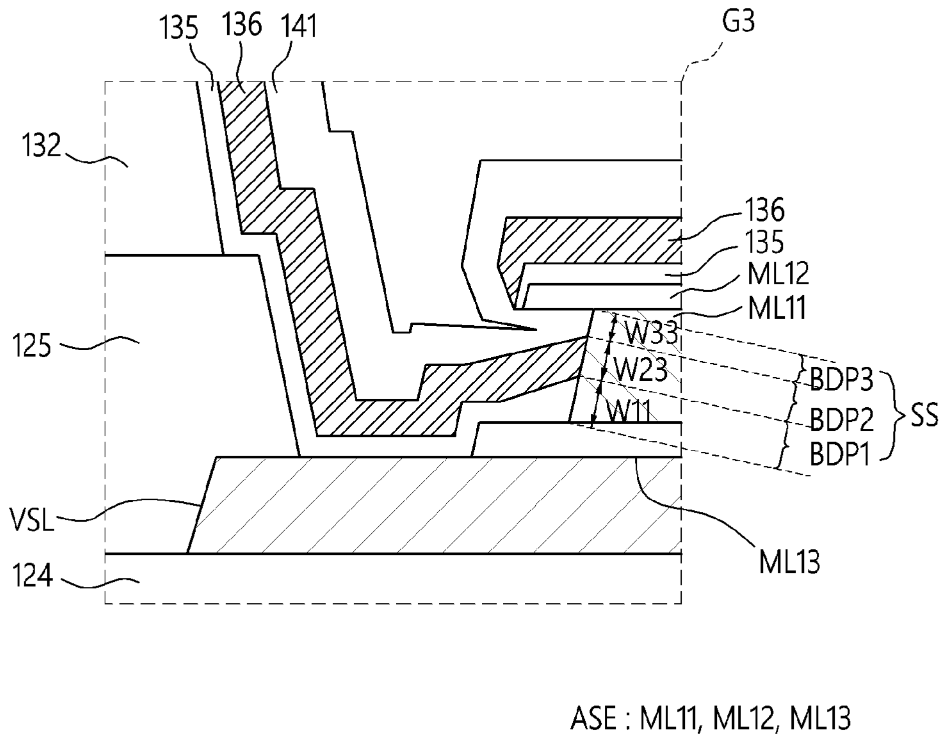
FIG. 25 is an enlarged view illustrating portion G3 of FIG. 24.
Figure 26:
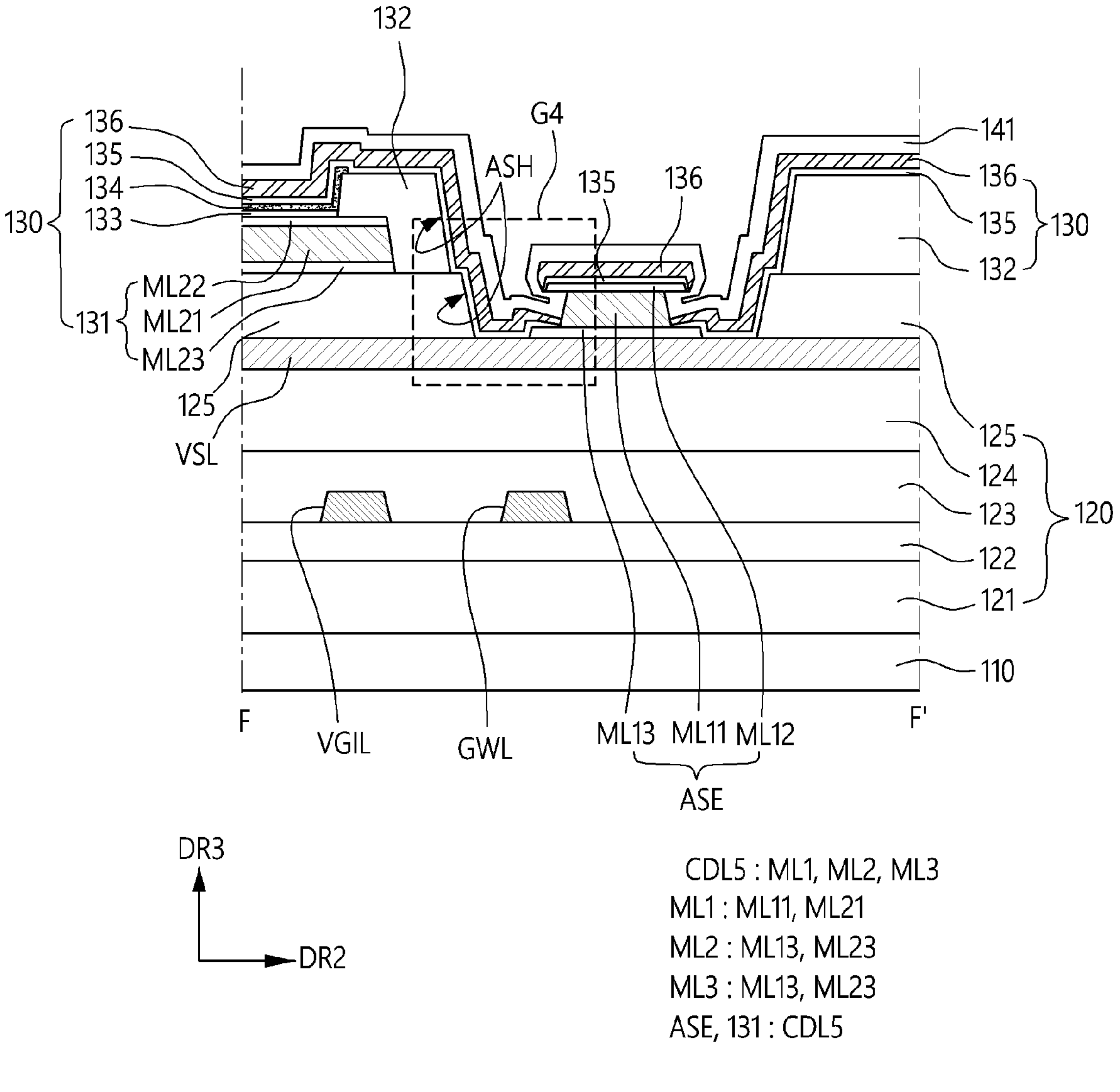
FIG. 26 is a cross-sectional view illustrating a side surface of an auxiliary electrode, a second common layer, and a common electrode in a display device manufactured by a process including the process of FIG. 23, in the arrangement direction of the angle limiting plates of FIG. 12.
Figure 27:
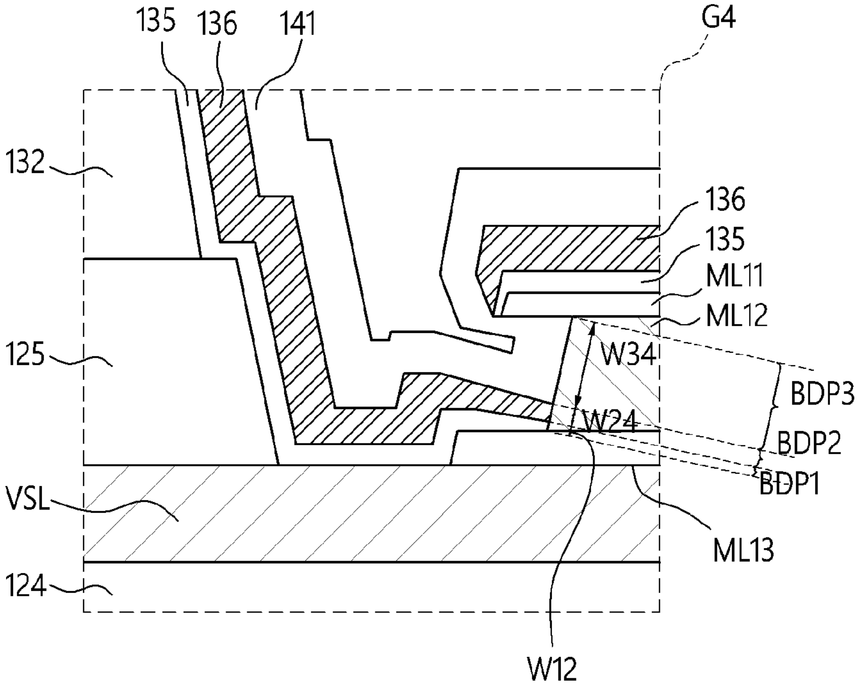
FIG. 27 is an enlarged view illustrating portion G4 of FIG. 26.

FIG. 23 is a process diagram illustrating a process of disposing a common electrode according to embodiment. FIG. 24 is a cross-sectional view illustrating a side surface of an auxiliary electrode, a second common layer, and a common electrode in the moving direction of the deposition apparatus of FIG. 12 after the process of FIG. 22. FIG. 25 is an enlarged view illustrating portion G3 of FIG. 24. FIG. 26 is a cross-sectional view illustrating a side surface of an auxiliary electrode, a second common layer, and a common electrode in the arrangement direction of the angle limiting plates of FIG. 12 after the process of FIG. 22. FIG. 27 is an enlarged view illustrating portion G4 of FIG. 26.

Referring to FIG. 23, the process of disposing the common electrode 136 during the manufacturing process of the display device 100 in the illustrated embodiment may include a process of moving the linear deposition apparatus 233 that ejects the inorganic material INM of the common electrode 136 in the first moving direction DRM1 on the mother substrate 200 after the disposition of the second common layer 135 is completed.

In this case, in the first direction DR1 parallel to the first moving direction DRM1 of the linear deposition apparatus 233, the incident range of the inorganic material INM is not influenced by the angle limiting plate ALM. In the second direction DR2 in which the angle limiting plates ALM of the linear deposition apparatus 233 are arranged, the incident range of the inorganic material INM is reduced due to the influence of the angle limiting plate ALM.

As illustrated in FIGS. 24, 25, 26, and 27, in the illustrated embodiment, the first bonding portion BDP1 in contact with the second common layer 135 in the side surface SS of the first metal layer ML11 of the auxiliary electrode ASE has the relatively large first width W11 at the first point of the first side SI1 and the second side S12 of the auxiliary electrode ASE, and has the second width W12 smaller than the first width W11 in the third side S13 and the fourth side SI4 of the auxiliary electrode ASE corresponding to the second direction DR2.

Further, in the illustrated embodiment, in the first direction DR1 parallel to the first moving direction DRM1 of the linear deposition apparatus 233, the incident range of the inorganic material INM is not influenced by the angle limiting plate ALM.

Accordingly, as illustrated in FIGS. 24 and 25, the second bonding portion BDP2 in contact with the common electrode 136 in the side surface SS of the first metal layer ML11 of the auxiliary electrode ASE may have a relatively large third width W23 at the first point of the first side SD and the second side SI2 of the auxiliary electrode ASE corresponding to the first direction DR1.

At this time, at the first point of the first side SI1 and the second side SI2 of the auxiliary electrode ASE, the width W33 of the third bonding portion BDP3 in contact with the first inorganic layer 141 in the side surface SS of the first metal layer ML11 of the auxiliary electrode ASE may be a value obtained by subtracting the first width W11 of the first bonding portion BDP1 and the third width W23 of the second bonding portion BDP2 from the width of the side surface SS of the first metal layer ML11.

In the second direction DR2 in which the angle limiting plates ALM of the linear deposition apparatus 233 are arranged, the incident range of the inorganic material INM is reduced due to the influence of the angle limiting plates ALM.

Accordingly, as illustrated in FIGS. 26 and 27, the second bonding portion BDP2 may have a fourth width W24 smaller than the third width W23 in the third side SI3 and the fourth side SI4 of the auxiliary electrode ASE corresponding to the second direction DR2.

At this time, at the second point of the third side SI3 and the fourth side SI4 of the auxiliary electrode ASE, a width W34 of the third bonding portion BDP3 in contact with the first inorganic layer 141 in the side surface SS of the first metal layer ML11 of the auxiliary electrode ASE may be a value obtained by subtracting the second width W12 of the first bonding portion BDP1 and the fourth width W24 of the second bonding portion BDP2 from the width of the side surface SS of the first metal layer ML11.

As described above, in the illustrated embodiment, at the first point of the first side SI1 and the second side SI2 of the auxiliary electrode ASE, the second bonding portion BDP2 in which the side surface SS of the auxiliary electrode ASE and the common electrode 136 are in contact, has the third width W23 greater than the fourth width W24 at the second point of the third side SI3 and the fourth side SI4. Accordingly, even at the first point of the first side SI1 and the second side SI2 of the auxiliary electrode ASE at which the first bonding portion BDP1 in which the side surface SS of the auxiliary electrode ASE and the second common layer 135 are in contact, has the relatively large first width W11, reliability of the electrical connection between the common electrode 136 and the auxiliary electrode ASE may be increased.

Figure 28:
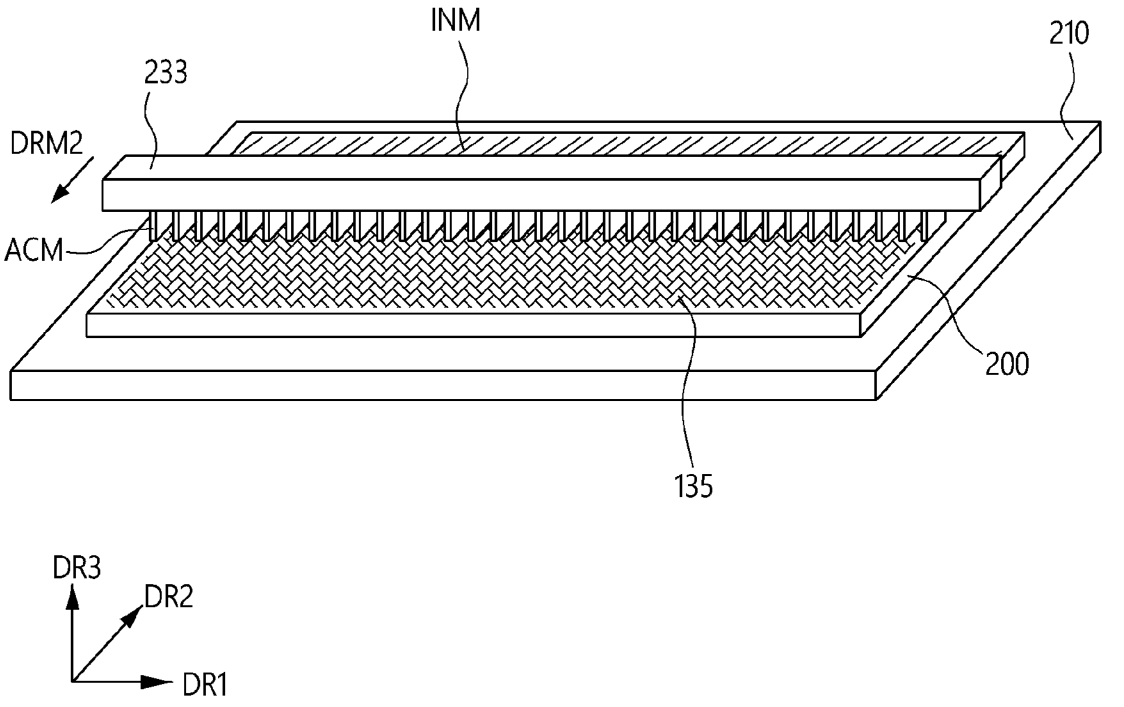
FIG. 28 is a process diagram illustrating an embodiment of a process of disposing a common electrode.
Figure 29:
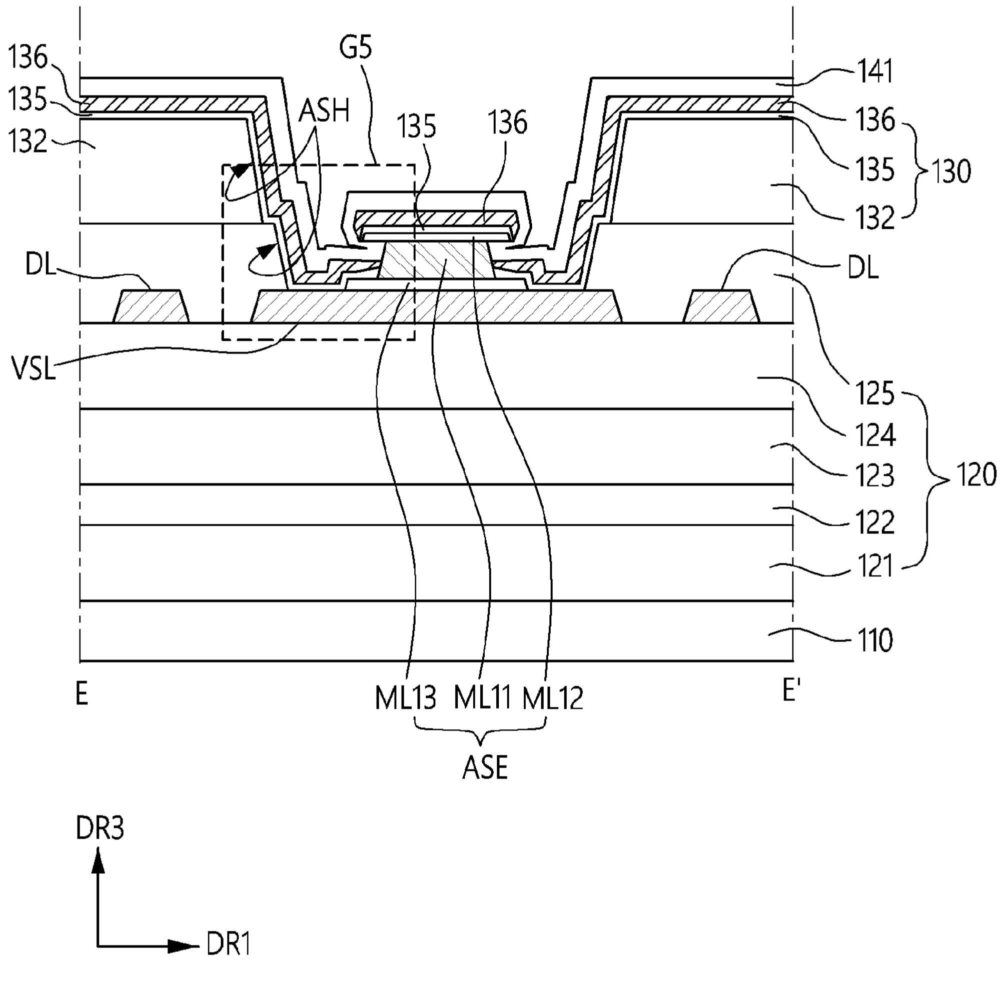
FIG. 29 is a cross-sectional view illustrating a side surface of an auxiliary electrode, a second common layer, and a common electrode in a display device manufactured by a process including the process of FIG. 28, in the moving direction of the deposition apparatus of FIG. 12.
Figure 30:
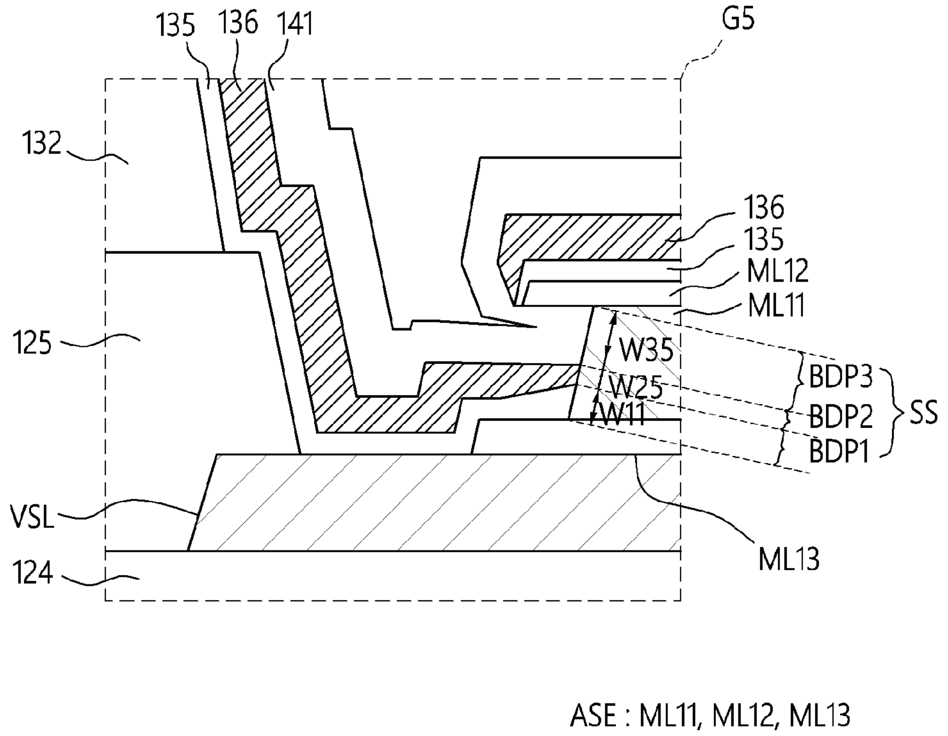
FIG. 30 is an enlarged view illustrating portion G5 of FIG. 29.
Figure 31:
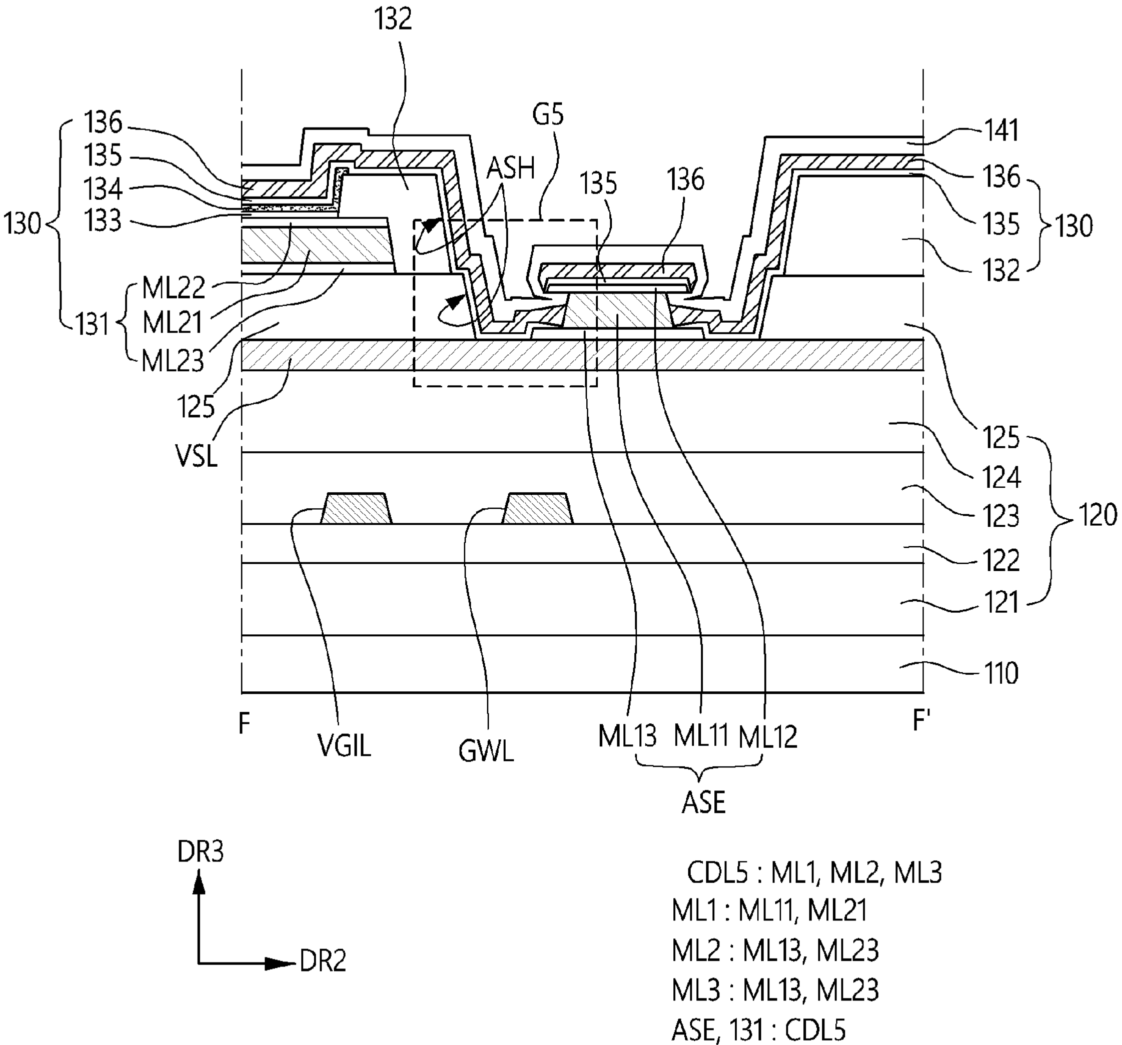
FIG. 31 is a cross-sectional view illustrating a side surface of an auxiliary electrode, a second common layer, and a common electrode in a display device manufactured by a process including the process of FIG. 28, in the arrangement direction of the angle limiting plates of FIG. 12.
Figure 32:
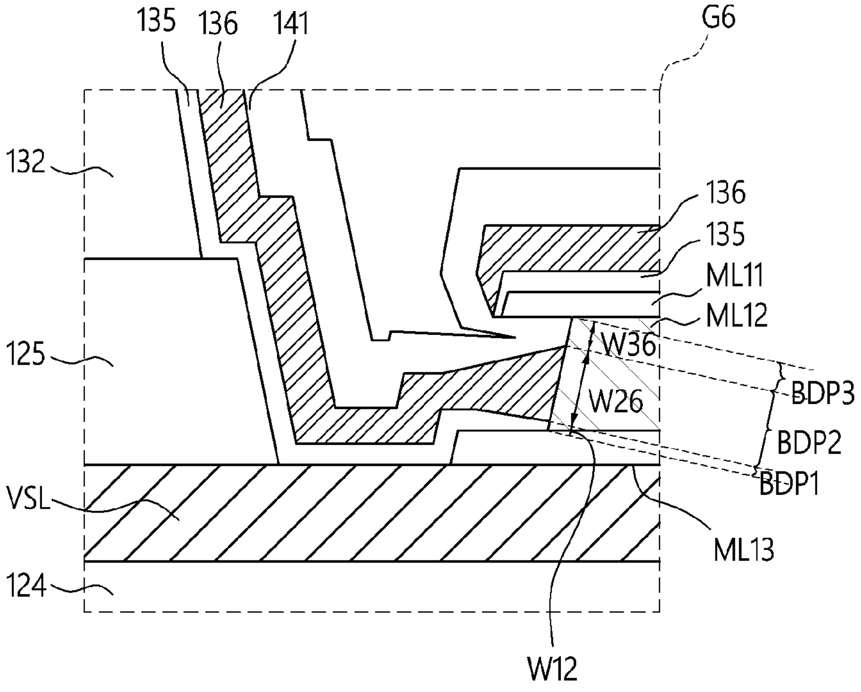
FIG. 32 is an enlarged view illustrating portion G6 of FIG. 31.

FIG. 28 is a process diagram illustrating a process of disposing a common electrode. FIG. 29 is a cross-sectional view illustrating a side surface of an auxiliary electrode, a second common layer, and a common electrode in the moving direction of the deposition apparatus of FIG. 12 after the process of FIG. 28. FIG. 30 is an enlarged view illustrating portion G5 of FIG. 29. FIG. 31 is a cross-sectional view illustrating a side surface of an auxiliary electrode, a second common layer, and a common electrode in the arrangement direction of the angle limiting plates of FIG. 12 after the process of FIG. 28. FIG. 32 is an enlarged view illustrating portion G6 of FIG. 31.

Referring to FIG. 28, the process of disposing the common electrode 136 during the manufacturing process of the display device 100 in the illustrated embodiment may include a process of moving the linear deposition apparatus 233 that ejects the inorganic material INM of the common electrode 136 in a second moving direction DRM2 different from the first moving direction DRM1 on the mother substrate 200 after the disposition of the second common layer 135 is completed.

In this case, in the second direction DR2 parallel to the second moving direction DRM2 of the linear deposition apparatus 233, the incident range of the inorganic material INM is not influenced by the angle limiting plate ALM. In the first direction DR1 in which the angle limiting plates ALM of the linear deposition apparatus 233 are arranged, the incident range of the inorganic material INM is reduced due to the influence of the angle limiting plate ALM.

As illustrated in FIGS. 29, 30, 31, and 32, in the illustrated embodiment, the first bonding portion BDP1 in contact with the second common layer 135 in the side surface SS of the first metal layer ML11 of the auxiliary electrode ASE has the relatively large first width W11 at the first point of the first side SI1 and the second side SI2 of the auxiliary electrode ASE, and has the second width W12 smaller than the first width W11 in the third side S13 and the fourth side SI4 of the auxiliary electrode ASE corresponding to the second direction DR2.

Further, in the illustrated embodiment, in the first direction DR1 in which the angle limiting plates ALM of the linear deposition apparatus 233 are arranged, the incident range of the inorganic material INM is reduced due to the influence of the angle limiting plate ALM.

Accordingly, as illustrated in FIGS. 29 and 30, the second bonding portion BDP2 may have a relatively small fifth width W25 at the first point of the first side SI1 and the second side SI2 of the auxiliary electrode ASE corresponding to the first direction DR1.

At this time, at the first point of the first side SI1 and the second side SI2 of the auxiliary electrode ASE, a width W35 of the third bonding portion BDP3 in contact with the first inorganic layer 141 in the side surface SS of the first metal layer ML11 of the auxiliary electrode ASE may be a value obtained by subtracting the first width W11 of the first bonding portion BDP1 and the fifth width W25 of the second bonding portion BDP2 from the width of the side surface SS of the first metal layer ML11.

In the second direction DR2 parallel to the first moving direction DRM1 of the linear deposition apparatus 233, the incident range of the inorganic material INM is not influenced by the angle limiting plate ALM.

Accordingly, as illustrated in FIGS. 31 and 32, the second bonding portion BDP2 in contact with the common electrode 136 in the side surfaces SS of the first metal layer ML11 of the auxiliary electrode ASE may have a sixth width W26 greater than the fifth width W25 at the second point of the third side SI3 and the fourth side SI4 of the auxiliary electrode ASE corresponding to the second direction DR2.

At this time, at the second point of the third side SI3 and the fourth side SI4 of the auxiliary electrode ASE, a width W36 of the third bonding portion BDP3 in contact with the first inorganic layer 141 in the side surface SS of the first metal layer ML11 of the auxiliary electrode ASE may be a value obtained by subtracting the second width W12 of the first bonding portion BDP1 and the sixth width W26 of the second bonding portion BDP2 from the width of the side surface SS of the first metal layer ML11.

As described above, in the illustrated embodiment, at the second point of the third side SI3 and the fourth side SI4 of the auxiliary electrode ASE, the first bonding portion BDP1 in which the side surface SS of the auxiliary electrode ASE and the second common layer 135 are in contact has the relatively small second width W12, and the second bonding portion BDP2 in which the side surface SS of the auxiliary electrode ASE and the common electrode 136 are in contact has the sixth width W26 greater than the fifth width W25 at the first point of the first side SI1 and the second side SI2. Accordingly, reliability of the electrical connection between the common electrode 136 and the auxiliary electrode ASE may be further increased by the second point of the third side SI3 and the fourth side SI4 of the auxiliary electrode ASE having the sixth width W26 of the second bonding portion BDP2.

The display device 100 in the illustrated embodiment and the illustrated embodiment is the same as the illustrated embodiment illustrated in FIGS. 1 to 22 except that the width of the second bonding portion BDP2 of the auxiliary electrode ASE is different in the first side SI1 and the second side SI2, and the third side SI3 and the fourth side SI4 of the auxiliary electrode ASE according to whether the angle limiting plate ASM of the linear deposition apparatus 233 has an influence, and thus redundant description is omitted.

Figure 33:
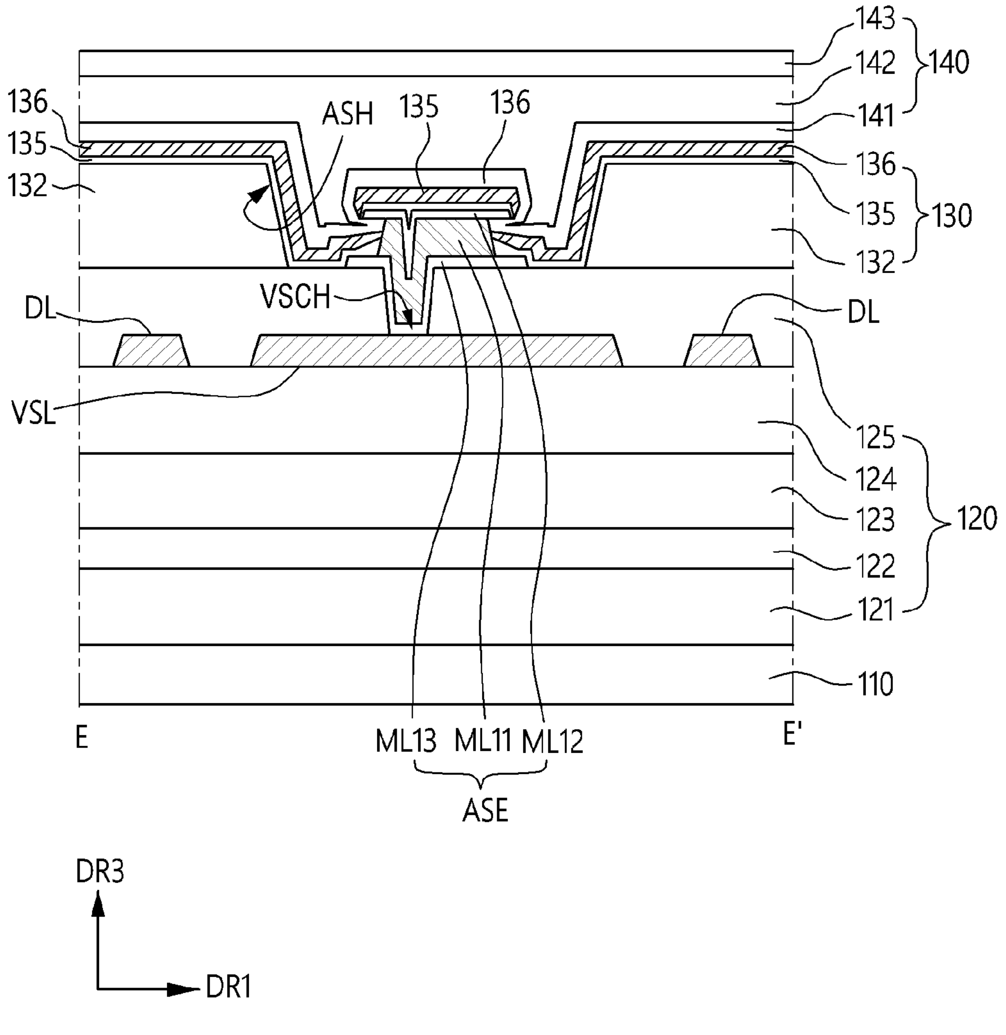
FIG. 33 is a cross-sectional view taken along line E-E' of an embodiment of FIG. 5.
Figure 34:
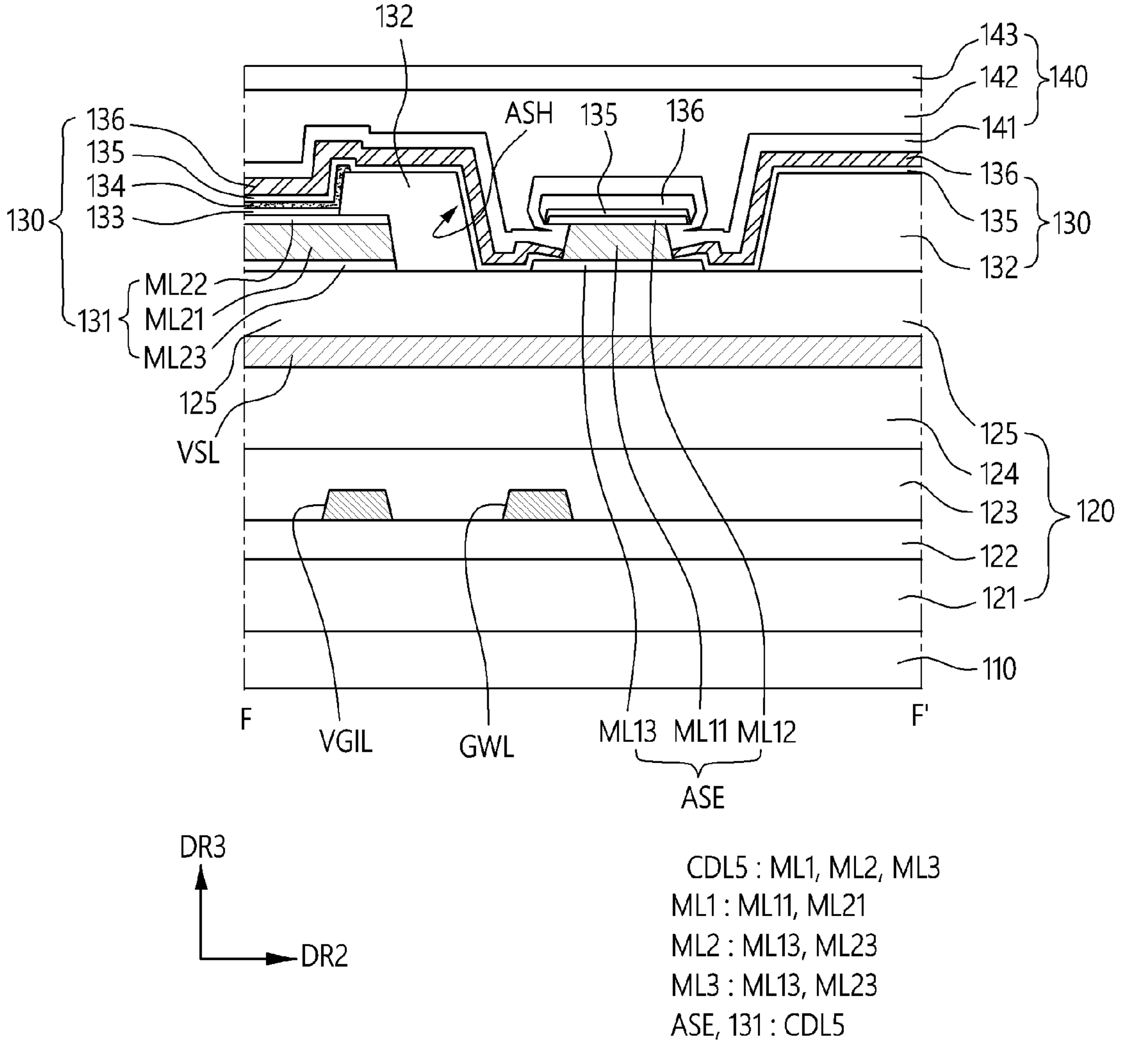
FIG. 34 is a cross-sectional view taken along line F-F' of an embodiment of FIG. 5.

FIG. 33 is a cross-sectional view taken along line E-E' of the embodiment of FIG. 5. FIG. 34 is a cross-sectional view taken along line F-F' of the embodiment of FIG. 5.

Referring to FIGS. 33 and 34, the display device 100 in an embodiment is the same as the embodiments according to FIGS. 1 to 32 except that the auxiliary electrode ASE is not disposed on a part of the second power line VSL exposed through the auxiliary hole ASH penetrating the second planarization layer 125 and is disposed on the second planarization layer 125 similar to the pixel electrode 131, and thus redundant description is omitted hereinafter.

As illustrated in FIG. 33, in the illustrated embodiment, the auxiliary electrode ASE may be disposed on the second planarization layer 125 and may be electrically connected to the second power line VSL through a power connection hole VSCTH penetrating the second planarization layer 125.

Figure 35:
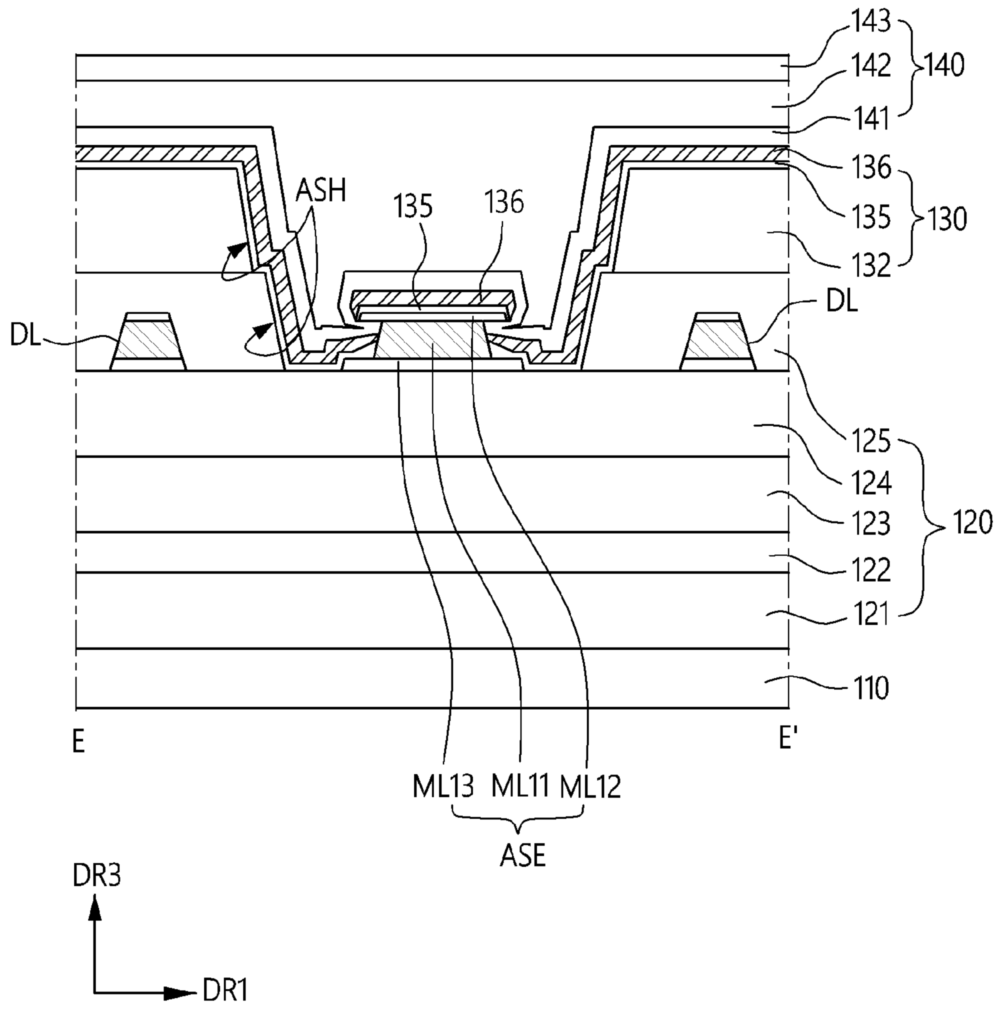
FIG. 35 is a cross-sectional view taken along line E-E' of an embodiment of FIG. 5.
Figure 36:
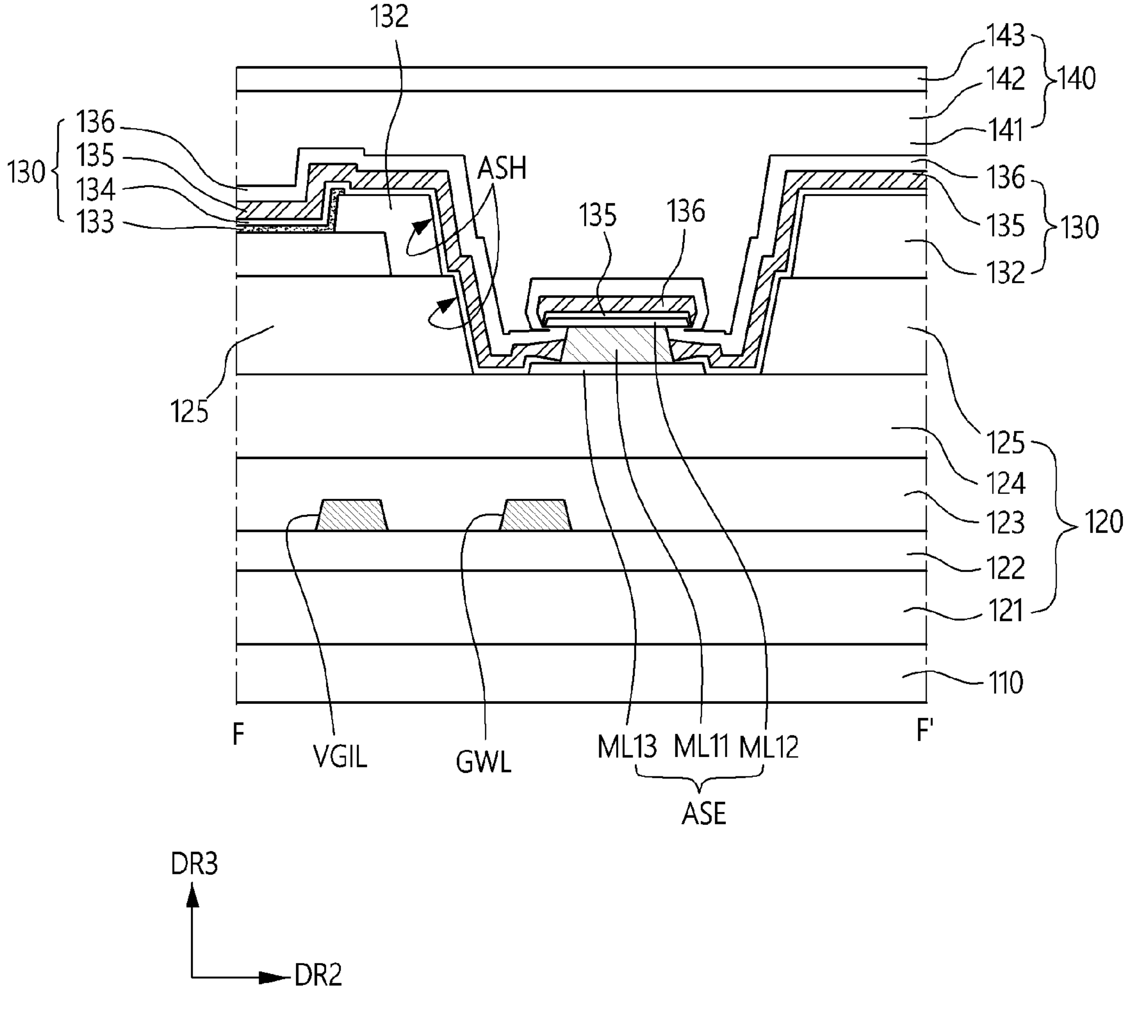
FIG. 36 is a cross-sectional view taken along line F-F' of an embodiment of FIG. 5.

FIG. 35 is a cross-sectional view taken along line E-E' of FIG. 5. FIG. 36 is a cross-sectional view taken along line F-F' of FIG. 5 in the illustrated embodiment.

Referring to FIGS. 35 and 36, the display device 100 in the illustrated embodiment is the same as the illustrated embodiments according to FIGS. 1 to 32 except that the auxiliary electrode ASE is not including or consisting of the same layer as the pixel electrode 131 but includes or consists of the fourth conductive layer CDL4 similar to the data line DL, the first power line VDL, or the like, and thus redundant description is omitted hereinafter.

In the illustrated embodiment, the fourth conductive layer CDL4 includes the data line DL, the first power line VDL, the first to fourth connection electrodes CCE1 to CCE4, and the auxiliary electrode ASE.

In this case, for the undercut structure of the auxiliary electrode ASE, the fourth conductive layer CDL4 may include a structure in which a first metal layer and a second metal layer are stacked.

In an alternative embodiment, the fourth conductive layer CDL4 may include a structure in which a third metal layer, a first metal layer, and a second metal layer are stacked.

In addition, in the illustrated embodiment, the second power line VSL may be disposed in the non-display area NDA and electrically connected to the common electrode 136.

Figure 37:
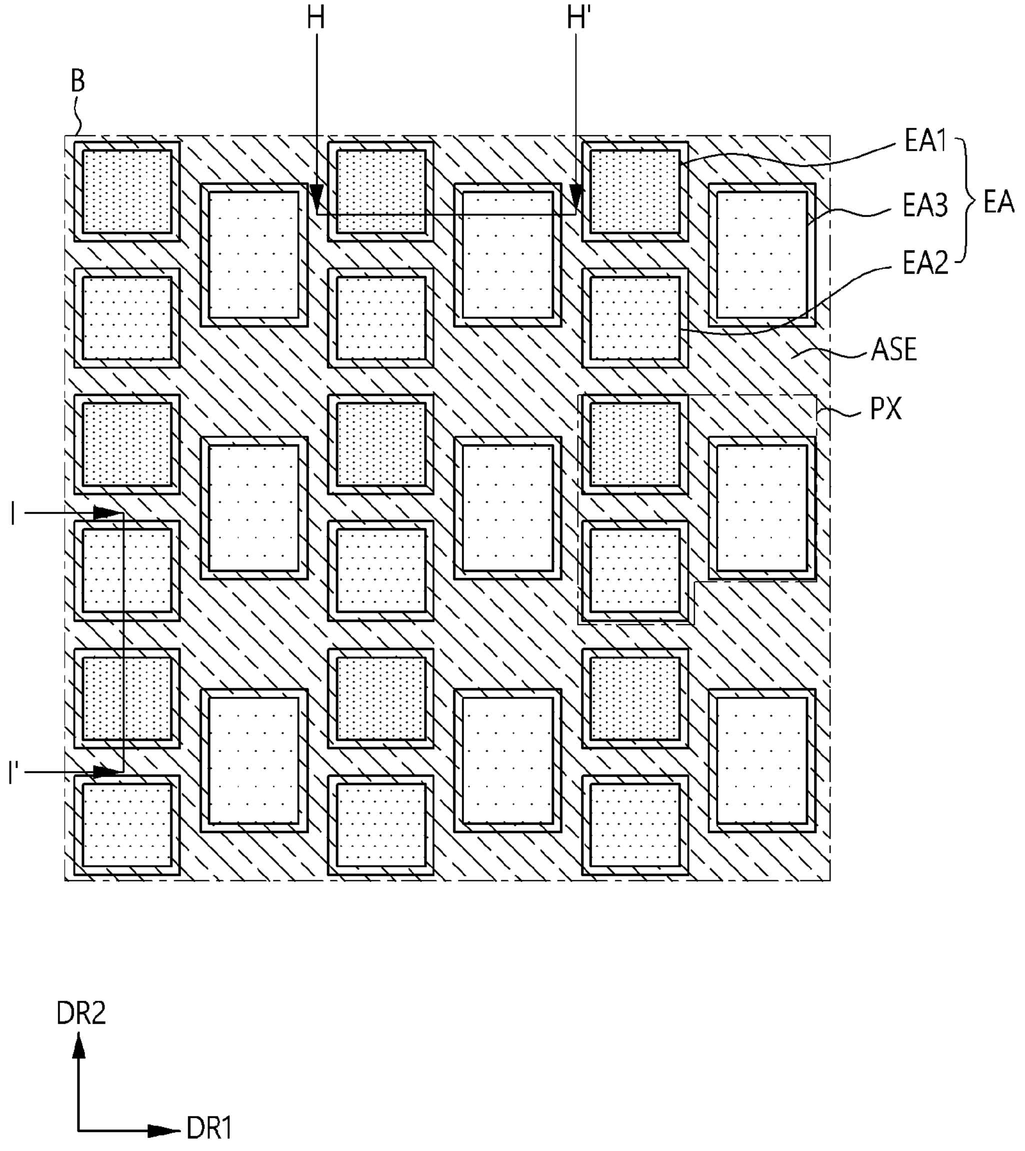
FIG. 37 is a plan view showing part B of the embodiment of FIG. 1.
Figure 38:
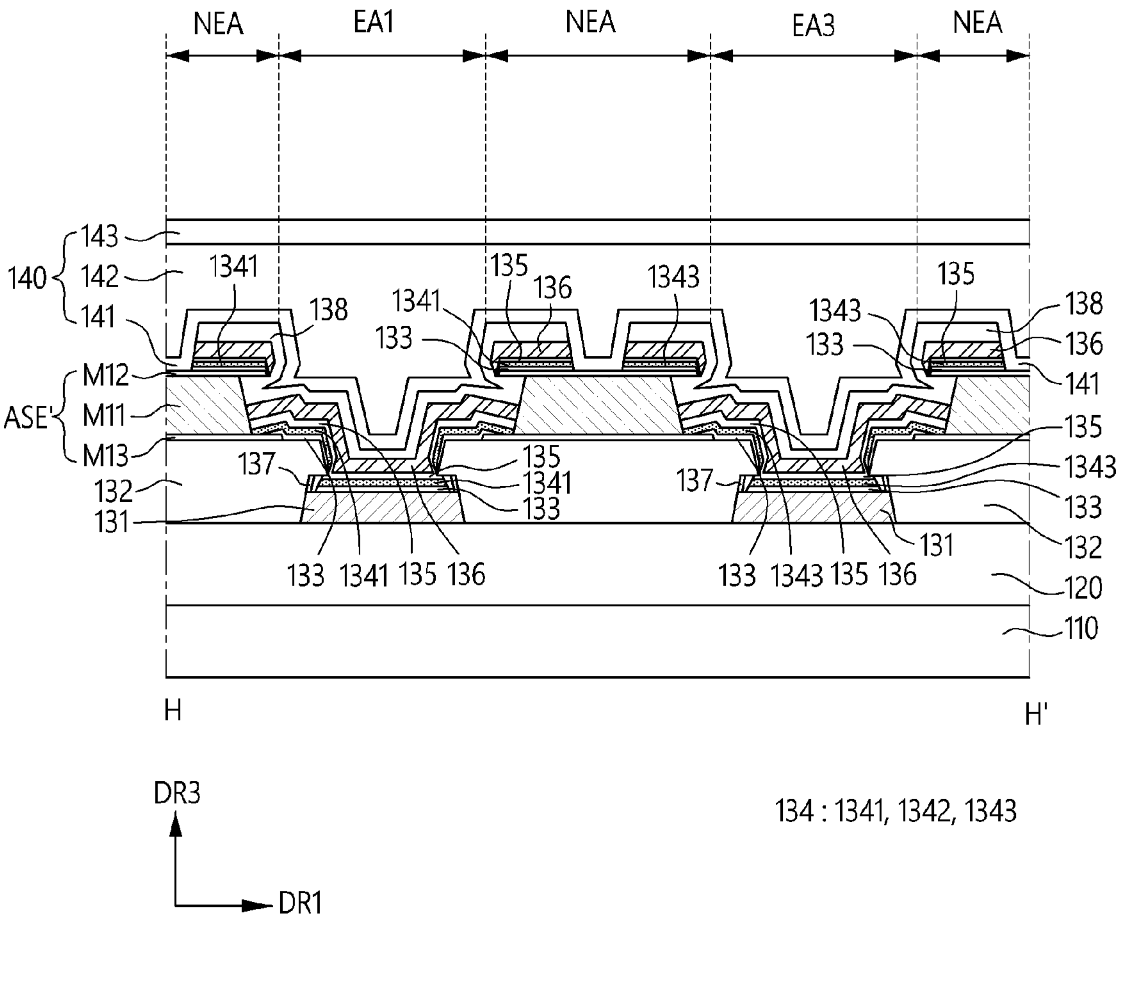
FIG. 38 is a cross-sectional view taken along line H-H' of FIG. 37.
Figure 39:
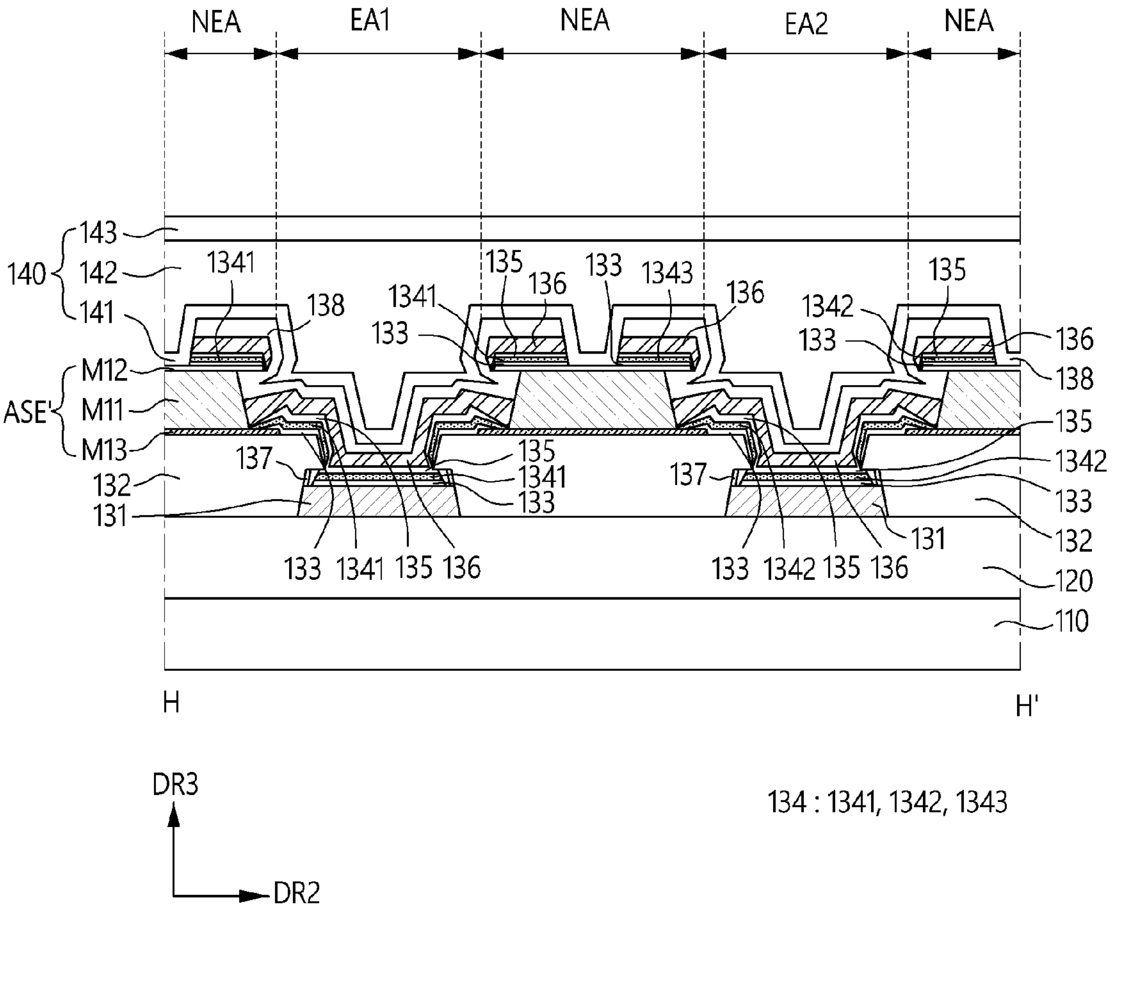
FIG. 39 is a cross-sectional view taken along line I-I' of FIG. 37.

FIG. 37 is a plan view showing part B of the embodiment of FIG. 1. FIG. 38 is a cross-sectional view taken along line H-H' of FIG. 37. FIG. 39 is a cross-sectional view taken along line I-I' of FIG. 37.

Referring to FIG. 37, the display device 100 in the illustrated embodiment is the same as the illustrated embodiment of FIG. 3 except that an auxiliary electrode ASE' corresponds to the entirety of the non-emission area NEA instead of a part of the non-emission area NEA, and thus redundant description is omitted.

Referring to FIGS. 38 and 39, the auxiliary electrode ASE' of the display device 100 in the illustrated embodiment may be disposed on the pixel defining layer 132 and may include the metal layers ML11, ML12, and ML13 stacked in an undercut structure.

That is, in the illustrated embodiment, the auxiliary electrode ASE' includes or consists of a conductive layer separate from the pixel electrode 131.

The pixel defining layer 132 is spaced apart from the pixel electrode 131. That is, a sacrificial layer 137 is disposed between the pixel defining layer 132 and the pixel electrode 131, and an edge of the pixel defining layer 132 may protrude relative to the sacrificial layer 137. That is, the pixel defining layer 132 has an undercut structure on the edge of the pixel electrode 131.

The first common layer 133, the light-emitting layer 134, the second common layer 135, and the common electrode 136 are sequentially disposed on the pixel electrode 131 and correspond to each of the emission areas EA.

Further, the light-emitting layer 134 may include a first light-emitting layer 1341 corresponding to the first emission area EA1, a second light-emitting layer 1342 corresponding to the second emission area EA2, and a third light-emitting layer 1343 corresponding to the third emission area EA3.

Further, the light-emitting element layer 130 of the display device 100 in the illustrated embodiment may further include an individual encapsulation layer 138 corresponding to each of the emission areas EA and covering the common electrode 136.

The first common layer 133, the light-emitting layer 134, the second common layer 135, the common electrode 136, and the individual encapsulation layer 138 corresponding to each of the emission areas EA and sequentially stacked may extend around each of the emission areas EA.

At this time, as the pixel defining layer 132 has an undercut structure, at least the first common layer 133 and the light-emitting layer 134 among the first common layer 133, the light-emitting layer 134, the second common layer 135, the common electrode 136, and the individual encapsulation layer 138 may be separated by the undercut structure of the pixel defining layer 132.

Further, as the auxiliary electrode ASE' has an undercut structure, the others except the individual encapsulation layer 138 among the first common layer 133, the light-emitting layer 134, the second common layer 135, the common electrode 136, and the individual encapsulation layer 138 may be separated by the undercut structure of the auxiliary electrode ASE'.

In other words, the individual encapsulation layer 138 may not be separated by the undercut structure of the auxiliary electrode ASE' and may fill the undercut of the auxiliary electrode ASE'.

That is, in the illustrated embodiment, except the first bonding portion BDP1 in contact with the second common layer 135 and the second bonding portion BDP2 in contact with the common electrode 136 in a side surface of the first metal layer ML11 of the auxiliary electrode ASE', the rest thereof may contact the individual encapsulation layer 138 instead of the first inorganic layer 141.

The auxiliary electrode ASE may be electrically connected to the second power line VSL disposed in the non-display area NDA.

The common electrode 136 of each of the emission areas may contact the side surface of the auxiliary electrode ASE' and be electrically connected to the auxiliary electrode ASE', and may be electrically connected to the second power line VSL through the auxiliary electrode ASE'.

What is claimed is:

1. A display device comprising:
a substrate comprising a display area in which emission areas are arranged;
an auxiliary electrode disposed on the substrate, corresponding to at least a part of a non-emission area around each of the emission areas, the auxiliary electrode comprising:
metal layers stacked in an undercut structure;
a side surface including a first bonding portion and a second bonding portion; and
a first side and a second side facing each other in a first direction, and a third side and a fourth side facing each other in a second direction crossing the first direction;
a light-emitting element layer disposed on the substrate, the light-emitting element layer comprising:
a pixel electrode corresponding to each of the emission areas;
a pixel defining layer corresponding to the non-emission area and covering an edge of the pixel electrode;
a first common layer disposed on the pixel electrode;
a light-emitting layer disposed on the first common layer;
a second common layer disposed on the light-emitting layer and comprising an electron transport layer including an organic material having an electron transport property; and
a common electrode disposed on the second common layer,
wherein the second common layer and the common electrode extend to the non-emission area,
the first bonding portion in contact with the second common layer, and the second bonding portion in contact with the common electrode,
the common electrode is electrically connected to the auxiliary electrode by the second bonding portion,
the first bonding portion has a first width at a first point of the first side and has a second width smaller than the first width at a second point of the third side, and
the second bonding portion has a third width at the first point of the first side, and has a fourth width greater than or smaller than the third width at the second point of the third side.

2. The display device of claim 1, wherein a difference between the first width and the second width is about 0.1 nanometer or more.

3. The display device of claim 1, wherein the light-emitting layer and the common electrode are separated by the undercut structure of the auxiliary electrode.

4. The display device of claim 3, wherein the metal layers of the auxiliary electrode comprise:
a first metal layer; and
a second metal layer disposed on the first metal layer and having an edge protruding beyond the first metal layer,
wherein the first metal layer has a lower resistance than the second metal layer, and
a side surface of the first metal layer comprises the first bonding portion and the second bonding portion.

5. The display device of claim 4, wherein the first metal layer comprises aluminum (Al) or copper (Cu), and
the second metal layer comprises one of titanium (Ti), molybdenum (Mo) and indium tin oxide.

6. The display device of claim 4, wherein the metal layers of the auxiliary electrode further comprise a third metal layer disposed under the first metal layer, and
the third metal layer comprises one of titanium (Ti), molybdenum (Mo) and indium tin oxide.

7. The display device of claim 4, further comprising a sealing layer covering the light-emitting element layer,
wherein the side surface of the first metal layer further comprises a third bonding portion in contact with the sealing layer.

8. The display device of claim 4, wherein a width of a third bonding portion corresponds to the undercut structure of the auxiliary electrode, and
a width of the second bonding portion is a value obtained by subtracting a width of the first bonding portion and the width of the third bonding portion from a width of the side surface of the first metal layer.

9. The display device of claim 4, wherein
a width of a third bonding portion is a value obtained by subtracting a width of the first bonding portion and a width of the second bonding portion from the width of the side surface of the first metal layer.

10. The display device of claim 4, further comprising a circuit layer disposed between the substrate and the light-emitting element layer,
wherein the circuit layer has a structure comprising:
a first conductive layer disposed on the substrate;
a semiconductor layer disposed on a buffer layer covering the first conductive layer;
a second conductive layer disposed on a gate insulating layer covering the semiconductor layer;
a third conductive layer disposed on an inter-insulating layer covering the second conductive layer;
a fourth conductive layer disposed on a first planarization layer covering the third conductive layer; and
a second planarization layer covering the fourth conductive layer,
wherein the circuit layer comprises a pixel driver corresponding to each of the emission areas and electrically connected to the pixel electrode, and a first power line and a second power line respectively transmitting a first power and a second power having different voltage levels.

11. The display device of claim 10, wherein the fourth conductive layer comprises the second power line, and
the auxiliary electrode is disposed on a part of the second power line exposed through an auxiliary hole, contacts a part of the second power line, and includes or consists of the same layer as the pixel electrode.

12. The display device of claim 10, wherein the pixel driver comprises at least one transistor,
one of the at least one transistor comprises a channel portion, a source portion connected to one side of the channel portion, a drain portion connected to the other side of the channel portion, and a first gate electrode and a second gate electrode overlapping the channel portion, the first conductive layer comprises the first gate electrode, the semiconductor layer comprises the channel portion, the source portion and the drain portion, and the second conductive layer comprises the second gate electrode.

13. The display device of claim 10, wherein the fourth conductive layer comprises the second power line, and the auxiliary electrode is disposed on the second planarization layer, includes or consists of the same layer as the pixel electrode, and is electrically connected to the second power line through a power connection hole penetrating the second planarization layer.

14. The display device of claim 10, wherein the substrate further comprises a non-display area around the display area, the second power line is disposed in the non-display area and is electrically connected to the common electrode, and the fourth conductive layer comprises the auxiliary electrode.

15. The display device of claim 4, wherein a portion of the pixel defining layer is spaced apart from the pixel electrode in a thickness direction, an edge of the pixel defining layer protrudes relative to a sacrificial layer between the pixel defining layer and the pixel electrode, the auxiliary electrode is disposed on the pixel defining layer, and the common electrode of each of the emission areas contacts the side surface of the auxiliary electrode.

16. A display device comprising:

a substrate comprising a display area in which emission areas are arranged;

an auxiliary electrode disposed on the substrate, corresponding to at least a part of a non-emission area around each of the emission areas, the auxiliary electrode comprising:

metal layers stacked in an undercut structure;

a side surface including a first bonding portion and a second bonding portion; and a first side and a second side facing each other in a first direction, and a third side and a fourth side facing each other in a second direction crossing the first direction;

a light-emitting element layer disposed on the substrate, the light-emitting element layer comprising:

a pixel electrode corresponding to each of the emission areas;

a pixel defining layer corresponding to the non-emission area and covering an edge of the pixel electrode;

a first common layer disposed on the pixel electrode;

a light-emitting layer disposed on the first common layer;

a second common layer disposed on the light-emitting layer; and a common electrode disposed on the second common layer, wherein the second common layer and the common electrode extend to the non-emission area, the first bonding portion in contact with the second common layer, and the second bonding portion in contact with the common electrode, the common electrode is electrically connected to the auxiliary electrode by the second bonding portion, and the first bonding portion has a first width at a first point of the first side and has a second width smaller than the first width at a second point of the third side, wherein the first bonding portion has the first width at a third point of the second side and has the second width at a fourth point of the fourth side.

17. A display device comprising:

a substrate comprising a display area in which emission areas are arranged;

a circuit layer disposed on the substrate;

a light-emitting element layer disposed on the circuit layer, the light-emitting element layer comprising:

a pixel electrode of each of the emission areas;

a pixel defining layer corresponding to a non-emission area and covering an edge of the pixel electrode;

a first common layer disposed on the pixel electrode;

a light-emitting layer disposed on the first common layer;

a second common layer disposed on the light-emitting layer and extending to the non-emission area; and a common electrode disposed on the second common layer and extending to the non-emission area; and a sealing layer disposed on the light-emitting element layer, wherein one of the circuit layer and the light-emitting element layer comprises an auxiliary electrode corresponding to at least a part of the non-emission area around each of the emission areas, the auxiliary electrode comprising:

a first side and a second side facing each other in a first direction, and a third side and a fourth side facing each other in a second direction crossing the first direction;

a first metal layer and a second metal layer disposed on the first metal layer and including an edge protruding beyond the first metal layer;

a side surface including:

a first bonding portion in contact with the second common layer;

a second bonding portion in contact with the common electrode; and a third bonding portion in contact with the sealing layer, and the first bonding portion has a first width at a first point that is part of the first side and the second side and has a second width smaller than the first width at a second point that is part of the third side and the fourth side.

18. The display device of claim 17, wherein a width of the third bonding portion corresponds to an undercut structure of the auxiliary electrode, and a width of the second bonding portion is a value obtained by subtracting a width of the first bonding portion and the width of the third bonding portion from a width of the side surface of the first metal layer.

19. The display device of claim 17, wherein the second bonding portion has a third width at the first point of the first side, and has a fourth width smaller than the third width at the second point of the third side, and a width of the third bonding portion is a value obtained by subtracting a width of the first bonding portion and a width of the second bonding portion from the width of the side surface of the first metal layer.

20. The display device of claim 17, wherein the second bonding portion has a fifth width at the first point of the first side, and has a sixth width greater than the fifth width at the second point of the third side, and a width of the third bonding portion is a value obtained by subtracting a width of the first bonding portion and a width of the second bonding portion from the width of the side surface of the first metal layer.

* * * * *